US012635128B2

(12) United States Patent (10) Patent No.: US 12,635,128 B2

Liaw (45) Date of Patent: May 19, 2026

(54) SEMICONDUCTOR STRUCTURE AND MANUFACTURING METHOD THEREOF

(71) Applicant: TAIWAN SEMICONDUCTOR MANUFACTURING COMPANY, LTD., Hsinchu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 857 days.

(21) Appl. No.: 17/858,400

(22) Filed: Jul. 6, 2022

(65) Prior Publication Data

US 2024/0015952 A1 Jan. 11, 2024

(51) Int. Cl.
| | |
|---|---|
| *H01L 27/108* | (2006.01) |
| *H10B 12/00* | (2023.01) |
| *H10D 30/01* | (2025.01) |
| *H10D 30/43* | (2025.01) |
| *H10D 30/67* | (2025.01) |
| *H10D 62/10* | (2025.01) |
| *H10D 62/13* | (2025.01) |

(52) U.S. Cl.
CPC ............ *H10B 12/36* (2023.02); *H10B 12/03* (2023.02); *H10B 12/056* (2023.02); *H10B 12/482* (2023.02); *H10B 12/488* (2023.02); *H10D 30/014* (2025.01); *H10D 30/43* (2025.01); *H10D 30/6735* (2025.01); *H10D 30/6757* (2025.01); *H10D 62/121* (2025.01); *H10D 62/151* (2025.01)

(58) Field of Classification Search
CPC .... H10B 12/03; H10B 12/482; H10B 12/488; H10D 62/121; H10D 64/254
See application file for complete search history.

(56) References Cited

U.S. PATENT DOCUMENTS

| | | | |
|---|---|---|---|
| 7,514,757 | B2 | 4/2009 | Liaw |
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2022/0208766 | A1* | 6/2022 | Kim ........................ H10B 12/05 |

* cited by examiner

*Primary Examiner* — Mohammed R Alam

(74) *Attorney, Agent, or Firm* — Cooper Legal Group, LLC

(57) ABSTRACT

A method includes forming a transistor on a front-side of a substrate, the transistor comprising a channel region, a gate structure surrounding the channel region, and source/drain regions on opposite sides of the gate structure; forming a front-side contact on a first one of the source/drain regions of the transistor; forming a back-side contact on a second one of the source/drain regions of the transistor; forming a back-side capacitor on the back-side contact.

20 Claims, 71 Drawing Sheets

<u>W</u>

4C-4C'

C2-C2'

C3-C3'

C4-C4'

C1-C1'

C1-C1'

C3-C3'

C1-C1'

210
310
210
310
210
310

50

C1-C1'

210
310
210
310
210
310

50

C5-C5'

C1-C1'

C3-C3'

76
74
72
210
310
210
310
210
310
62
251
50

C5-C5'

C1-C1'

96

94

94

94

76
233
74
72
210
310
210
310
210
310

50

C3-C3'

C1-C1'

C3-C3'

C5-C5'

C1-C1'

C3-C3'

C5-C5'

C1-C1'

C3-C3'

C5-C5'

C1-C1'

C3-C3'

106

220
231
210
108
210
210
231
62
251
50

C5-C5'

260

62
251
50

218

C1-C1'

C3-C3'

C5-C5'

C1-C1'

C3-C3'

C5-C5'

C1-C1'

C3-C3'

C5-C5'

264
202
262
260
62
251
50
218

C1-C1'

C3-C3'

C5-C5'

218

251
260
262
202
264

C1-C1'

C3-C3'

C1-C1'

C3-C3'

C5-C5'

C1-C1'

C3-C3'

C1-C1'

C3-C3'

C5-C5'

C1-C1'

C3-C3'

C1-C1'

C3-C3'

C5-C5'

1

SEMICONDUCTOR STRUCTURE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
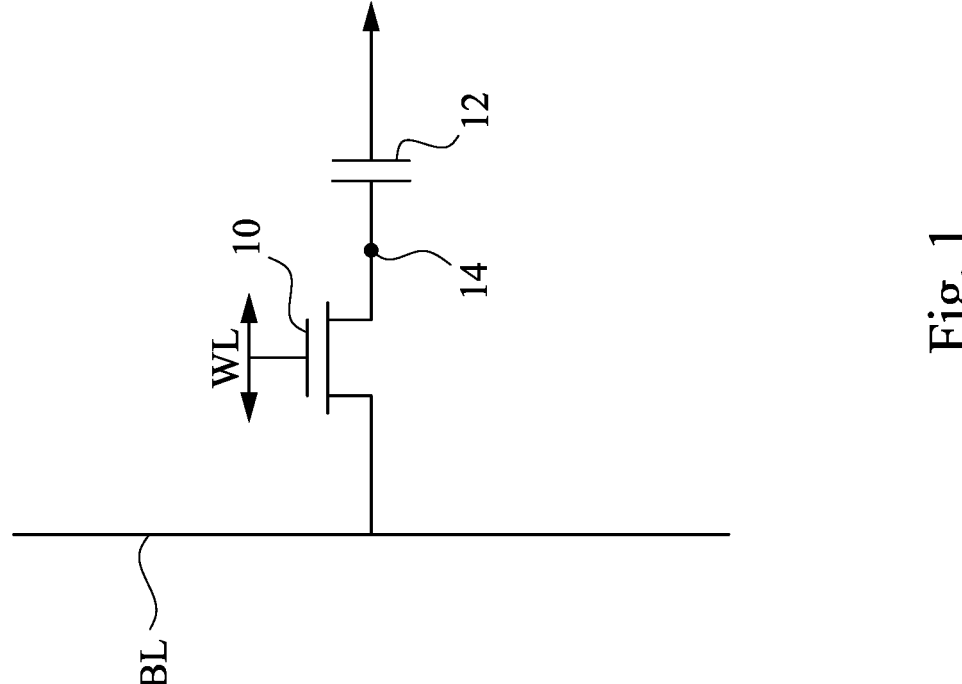
FIG. 1 illustrates a circuit diagram of a one-transistor DRAM cell in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

In the course of IC evolution, functional density (i.e., the number of interconnected devices per chip area) has generally increased while geometry size (i.e., the smallest component (or line) that can be created using a fabrication process) has decreased, and the semiconductor substrate has both the logic region and the DRAM region formed thereon. However, a capacitor in the DRAM region may requires additional step height (e.g. about 500 nm~5000 nm) than the logic region, which may result in an additional interconnect structure formed over the logic region to compensate a height difference between the DRAM region and the logic region, which in turn creates a high resistance on the logic region and impacts the logic circuit performance.

Therefore, the present disclosure in various embodiments a metal line routing method to improve the functional density and operation performance on the IC structure. Specifically, a stacked DRAM capacitor on the memory region is transferred to the wafer back-side, and thus there is no need to have an additional interconnect structure formed over the logic region on the front-side of the substrate to compensate a height difference between the memory region and the logic region, which in turn improves the logic circuit performance. In addition, due to the transferring, the back-side stacked DRAM capacitor can allow a higher capacitance application, such as a deeper capacitor structure or a larger size with multiple MIMIM structure. In addition, due to the transferring of the stacked DRAM capacitor, the DRAM cell region can have bit-lines setting in a first level (M1) and word-lines setting in a second level (M2) on the front-side of the substrate, which in turns allows for a wider bit-line/word-line metal width for reducing the resistance thereof or a lager metal space for reducing the RC delay reduction.

Reference is made to FIG. 1. FIG. 1 illustrates a circuit diagram of a 1T DRAM cell, which includes a semiconductor device 10 and a metal-insulator-metal (MIM) capacitor 12. Charges are stored on node 14. By applying a high voltage on a wordline WL, MOS device 10 may be turned on. Depending on the voltage change on bitline BL after MOS device 10 is turned on, the state of the 1T DRAM cell may be determined.

Figure 2:
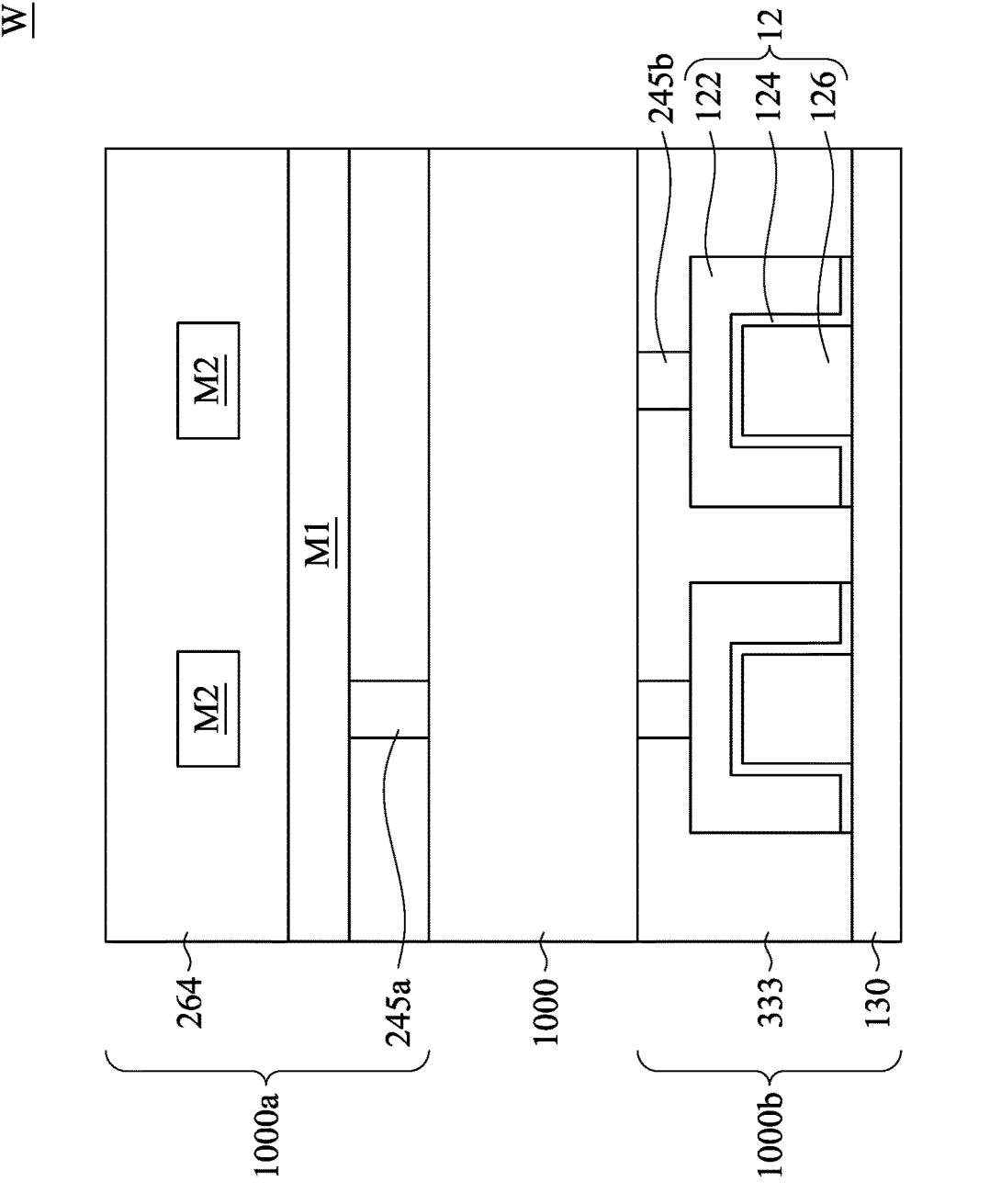
FIG. 2 illustrates a schematic view of a wafer having a front-side interconnect structure and a back-side interconnect structure on a device region thereof in accordance with some embodiments of the present disclosure.

Reference is made to FIG. 2. FIG. 2 illustrates a schematic view of a wafer W having a front-side interconnect structure and a back-side interconnect structure including the MIM capacitor 12 on a device region including the semiconductor device 10 thereof in accordance with some embodiments of the present disclosure. As shown in FIG. 2, a device region 1000 is provide in the wafer W and includes, such as gate, channel, and source/drain regions. A front-side interconnect structure 1000a is formed after the device region formation. Specifically, the front-side interconnect structure 1000a is formed over a front-side source/drain via 245a. The front-side interconnect structure 1000a may include, for example, two metallization layers, labeled as M1 and M2, with one layer of metallization via (not shown) or interconnect (not shown). In some embodiments, the metallization layer M1 can be interchangeably referred to a bitline, and the metallization layer M2 can be interchangeably referred to a wordline. Other embodiments may contain more or fewer metallization layers and corresponding more or fewer number of vias. The metal line illustrated here just for an example, and the metal line may be otherwise oriented (rotated 90 degrees or at other orientations). The front-side interconnect structure 1000a includes a full metallization stack, including a portion of each of metallization layers M1 and M2 connected by the interconnect V1, the front-side source/drain via 245a connecting the full metallization stack to the source/drain region in the device region. Also included in the front-side interconnect structure 1000a is a front-side inter-metal dielectric (IMD) layer 264. The front-side IMD layer 264 may provide electrical insulation as well as structural support for the various features of the front-side interconnect structure 1000a.

A back-side interconnect structure 1000b is formed after device region formation. The back-side interconnect structure 1000b may include, for example, capacitors 12, with one layer of metallization via or interconnect, labeled as B_V0, and a conductive layer 130. Other embodiments may contain more or fewer capacitors and corresponding more or fewer number of vias. The back-side interconnect structure 1000b includes a full metallization stack, including the conductive layer 130 and the capacitors 12, with the back-side metallization via 145b connecting the full metallization stack to the corresponding source/drain regions of the transistors in the device region 1000. In some embodiments, the conductive layer 130 can be interchangeably referred to a source conductor. Also included in the back-side interconnect structure 1000b is a back-side IMD layer 333. The back-side IMD layer 1008b may provide electrical insulation as well as structural support for the various features of the back-side interconnect structure 1000b.

The capacitor 12 can include a top electrode layer 126, a bottom electrode layer 122, and an insulator layer 124 sandwiched between the top and bottom electrode layers 126 and 122. In other words, the top electrode layer 126 and the bottom electrode layer 122 are separated by the insulator layer 124. The top electrode layer 126 is connected to the conductive layer 130, and the bottom electrode layer 122 is connected to back-side metallization via 145b. In some embodiments, the top electrode layer 126 can be interchangeably referred to a top plate, the bottom electrode layer 122 can be interchangeably referred to a bottom plate, and the insulator layer 124 can be interchangeably referred to an insulator plate. A more detailed description will be described later.

Figure 3A:
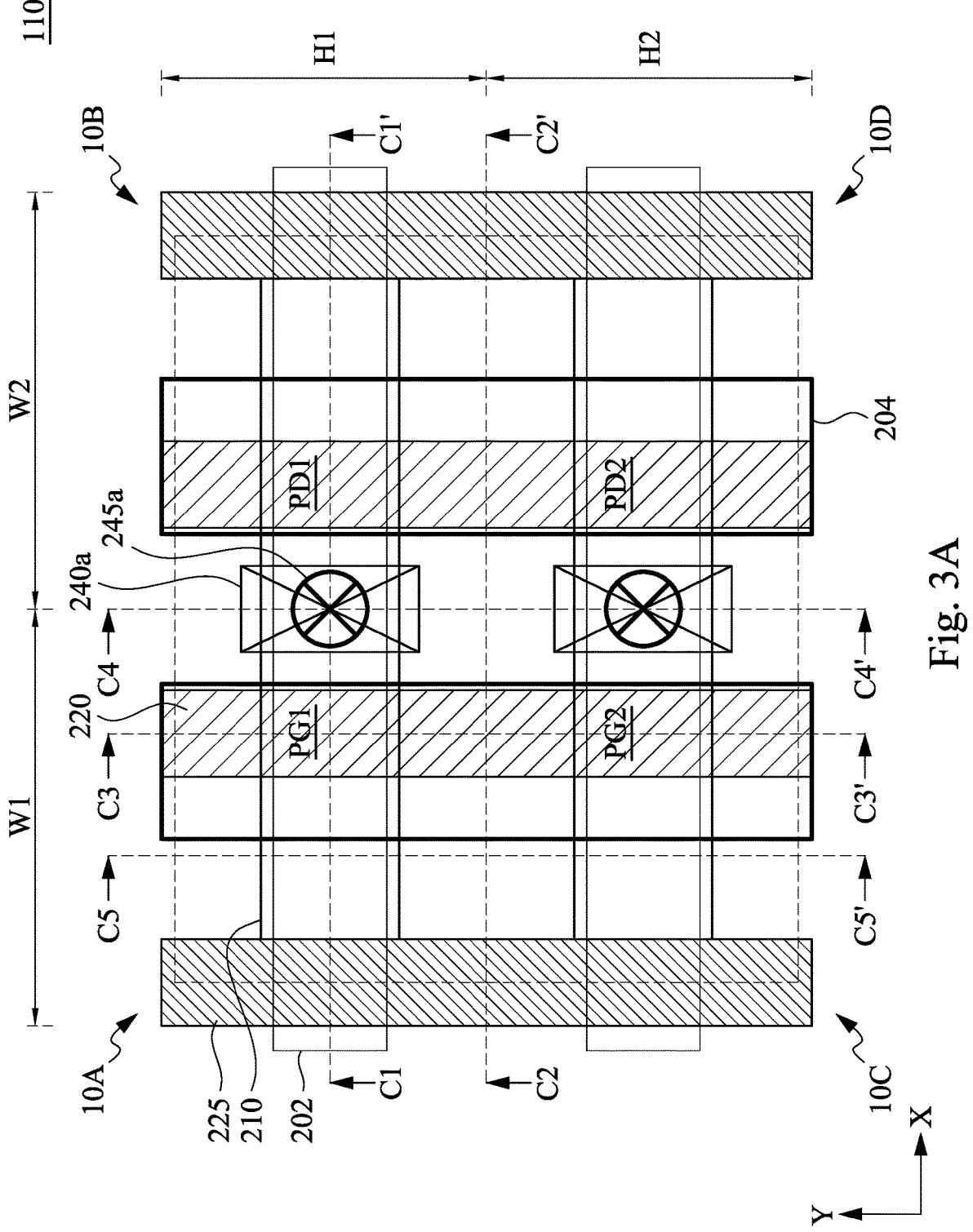
FIGS. 3A and 3B illustrate a cell array layout diagram of a circuit on a front-side and a back-side of a semiconductor structure, respectively, according to some embodiments of the present disclosure.
Figure 3B:
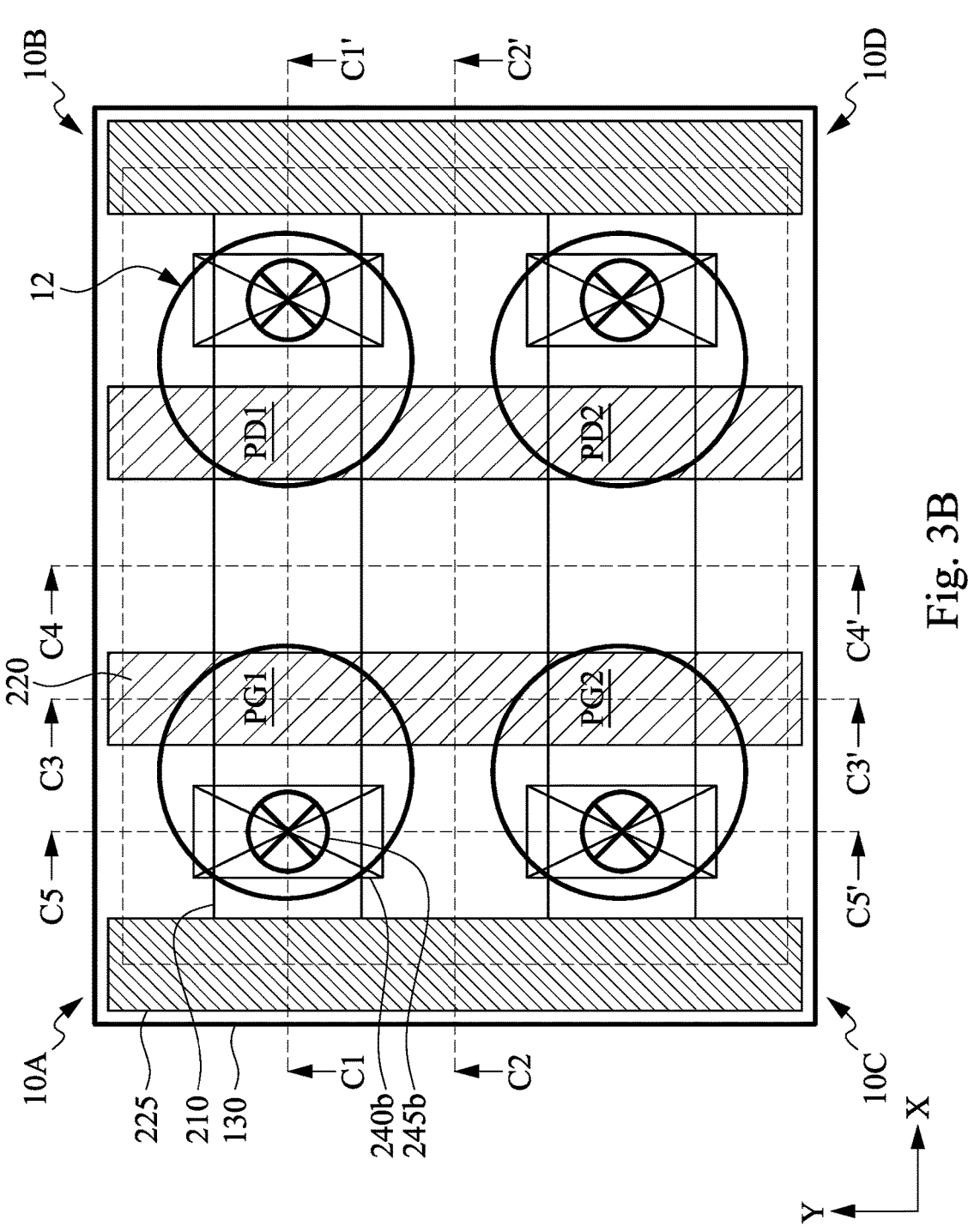

Reference is made to FIGS. 3A and 3B. FIGS. 3A and 3B illustrate a cell array layout diagram of a circuit 110 on a front-side and a back-side of a semiconductor structure, respectively, according to some embodiments of the present disclosure. As shown in FIGS. 3A and 3B, a first cell 10A and a second cell 10B in the circuit 110 are arranged in the same row. A third cell 10C and a fourth cell 10D in the circuit 110 are arranged in the same row. The outer boundary of each of the first cell 10A, the second cell 10B, the third cell 10C, and the fourth cell 10D is illustrated using dashed lines. In some embodiments, the first cell 10A and the second cell 10B may have the same cell height H1. The third cell 10C and the fourth cell 10D may have the same cell height H2. In some embodiments, the cell height H1 is the same as the cell height H2. In some embodiments, the cell height H1 is different than the cell height H2. In some embodiments, the first cell 10A and the third cell 10C may have the same cell width W1. The second cell 10B and the fourth cell 10D may have the same cell width W2. In some embodiments, the cell width H1 is the same as the cell width H2. In some embodiments, the cell width H1 is different than the cell width H2.

In FIGS. 3A and 3B, it should be noted that the configuration of the first cell 10A, the second cell 10B, the third cell 10C, and the fourth cell 10D in the circuit 110 is used as an illustration, and not to limit the disclosure. In some embodiments, the row and the column in the cell array of the circuit 110 may include more cells or fewer cells than the layout shown in FIGS. 3A and 3B. In some embodiments, the cell array of the circuit 110 may include more rows or fewer rows and more columns or fewer columns than the layout shown in FIGS. 3A and 3B. Each cell provides a circuit or portion thereof, exemplary functionality provided by the cells includes, but are not limited to NAND, NOR, AND, XOR, XNOR, SACN, inverter, Flip-Flop, latch, and/or other suitable or storage functions.

In some embodiments, the circuit 110 may include a transistor PG1 in the first cell 10A, a transistor PD1 in the second cell 10B, a transistor PG2 in the third cell 10C, and a transistor PD2 in the fourth cell 10D. In some embodiments, the transistors PG1 and PG2 are pass-gate transistor, and the transistors PD1 and PD2 are pull-down transistor. In some embodiments, the transistors PG1, PD1, PG2, and PD2 may be MOS transistors with silicon channel regions. In some embodiments, the transistors PG1, PD1, PG2, and PD2 may be GAA FETs. The silicon channel regions of the transistors PG1, PD1, PG2, and PD2 may be formed by semiconductor sheets 210. The semiconductor sheets 210 are stacked along the Z-direction (not shown) and are wrapped by the gate electrode, and the Z-direction is perpendicular to the plane formed by the X-direction and Y-direction.

As shown in FIGS. 3A and 3B, the circuit 110 includes dielectric-base gates 225 extending in the Y-direction and being dummy gates. The circuit 110 further includes gate electrode layers 220 extending in the Y-direction and being arranged between the dielectric-base dummy gates 225. The transistors PG1, PD1, PG2, and PD2 are surrounded by the dielectric-base dummy gates 225. In other words, the dielectric-base dummy gates 225 are formed in the boundary of the circuit 110. The material of the dielectric-base dummy gates 225 is different from that of the gate electrode layers 220. In some embodiments, the dielectric-base dummy gates 225 can be interchangeably referred to isolation structures/dielectric gates serving as circuit boundaries. The gate spacers 233 are formed on sidewalls of the dielectric-base gates 225 and the gate electrode layers 220.

As shown in FIG. 3A illustrating the circuit 110 on the front side of the semiconductor structure, the circuit 110 further includes source/drain regions 218 (see FIG. 4A) between the gate electrode layers 220 coupled to an overlying level (e.g., conductive line 202) through a source/drain contact 240a and a source/drain via 245a. In some embodiments, the source/drain contact 240a can be interchangeably referred to a bitline contact. The circuit 110 further includes conductive lines 202 extending in the X direction. In some embodiments, the conductive lines 202 are in a first interconnection layer of the circuit 110, such as a first metal layer on the front side of the semiconductor structure. In some embodiments, the conductive line 202 can be interchangeably referred to a bitline. The circuit 110 further includes conductive lines 204 extending in the Y direction. In some embodiments, the conductive lines 204 are in a second interconnection layer of the circuit 110, such as a second metal layer over the first metal layer on the front side of the semiconductor structure. In some embodiments, the conductive line 204 can be interchangeably referred to a wordline. The conductive lines 204 overlap and are electrically connected to the underlying conductive lines 202 through the conductive vias (not shown).

As shown in FIG. 3B illustrating the circuit 110 on the back side of the semiconductor structure, the circuit 110 further includes source/drain regions 218 (see FIG. 4A) between the gate electrode layer 220 and the dielectric-base dummy gates coupled to an underlying level (e.g., capacitor 12, conductive layer 130) through the back-side contact 240b and a back-side via 245b. In some embodiments, the back-side contact 240b can be interchangeably referred to a data node. The circuit 110 further includes the capacitor 12. In some embodiments, the capacitor 12 is electrically connected to the drain nodes of transistors PG1 and PG2. In some embodiments, the capacitor 12 has a circular profile from the top view. The capacitor 12 overlaps the corresponding transistor PG1, PD1, PG2, or PD2. In some embodiments, the capacitor 12 may has a portion between the gate electrode layers 220 from the top view. The circuit 110 further includes a conductive layer 130. The capacitors 12 are between the back-side via 245b and the conductive layer 130. The conductive layer 130 may overlap the gate electrode layers 220, the dielectric-base gates 225, and the capacitors 12. In some embodiments, the conductive layer 130 can be interchangeably referred to a source conductor or a common CVss. In some embodiments, materials of the conductive layer 130 on the back side of the semiconductor structure may include Cu, Co, Ru, Pt, Al, W, Ti, TaN, TiN, or any combinations thereof.

In some embodiments, the layouts as shown in FIGS. 3A and 3B are represented by a plurality of masks generated by one or more processors and/or stored in one or more non-transitory computer-readable media. Other formats for representing the layout are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 4A:
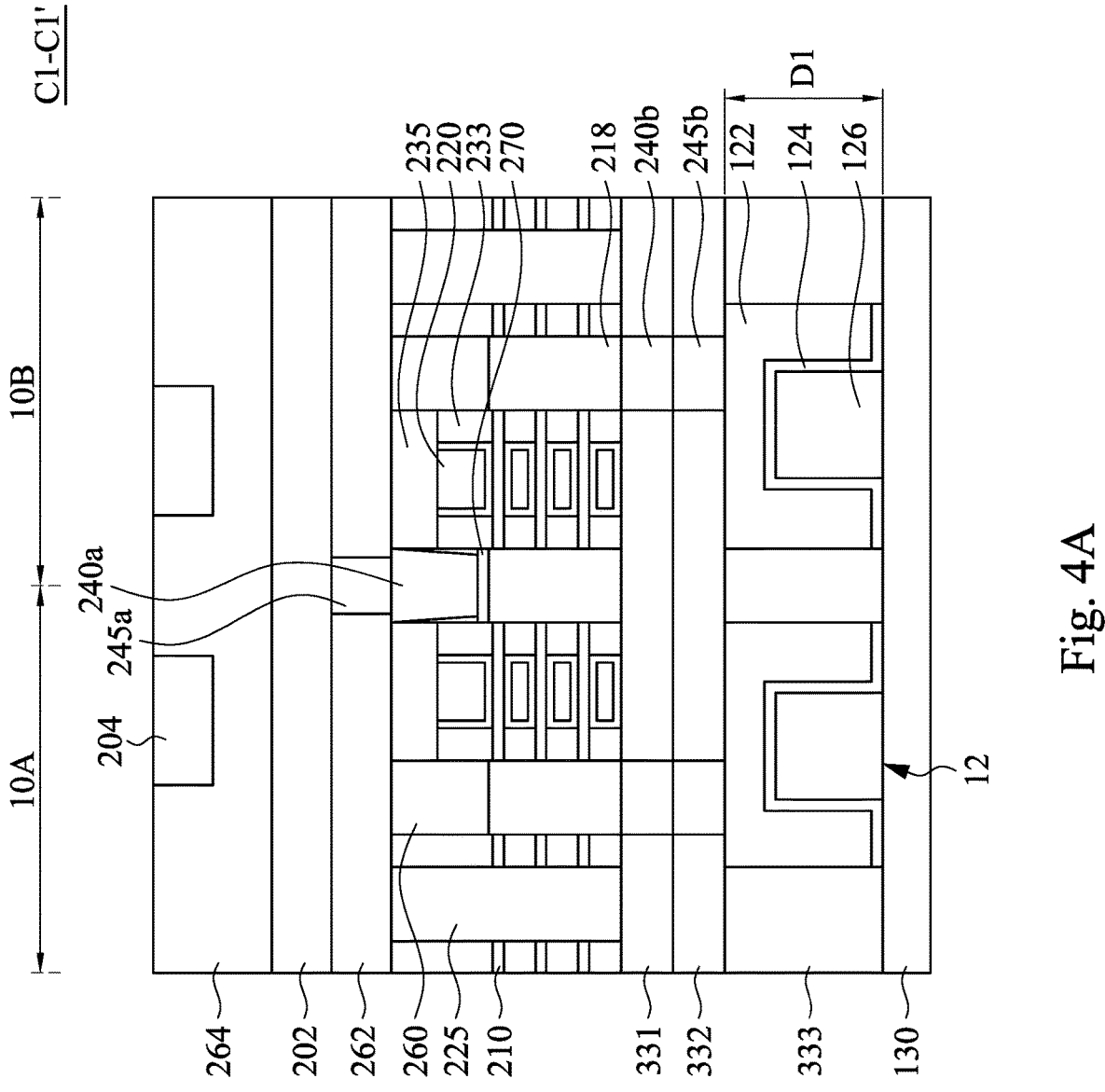
FIGS. 4A, 4D, 4E, 4F, and 4G illustrate cross-sectional views obtained from reference cross-section C1-C1', C2-C2', C3-C3', C4-C4', and C5-C5' in FIGS. 3A and 3B, respectively.
Figure 4C:
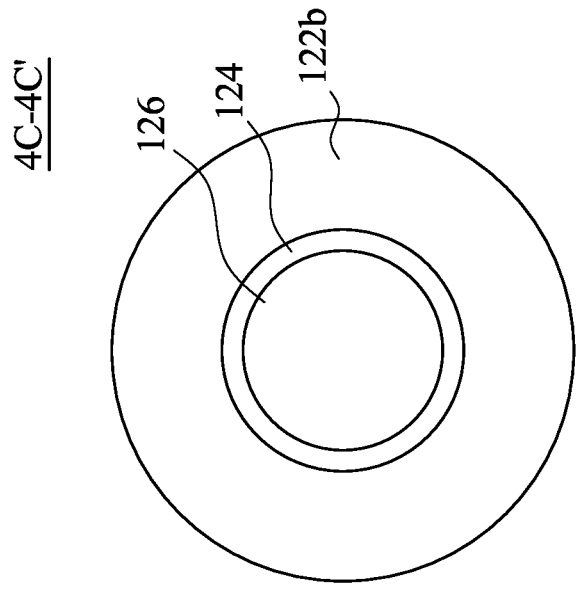
FIG. 4C illustrates a cross-sectional view obtained from reference cross-section 4C-4C' in FIG. 4B.
Figure 4B:
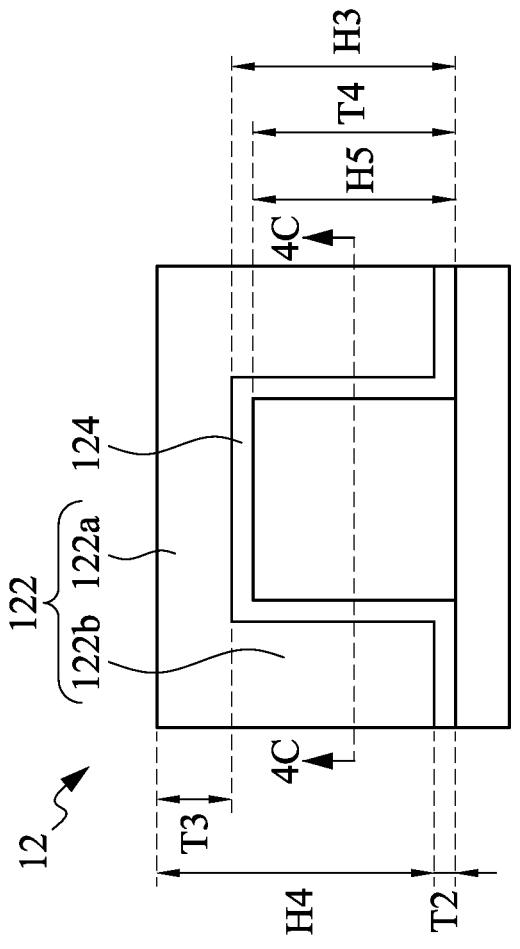
FIG. 4B illustrates a local enlarged view of a capacitor according to FIG. 4A.

Reference is made to FIGS. 4A to 4G. FIGS. 4A, 4D, 4E, 4F, and 4G illustrate cross-sectional views obtained from reference cross-section C1-C1', C2-C2', C3-C3', C4-C4', and C5-C5' in FIGS. 3A and 3B, respectively. FIG. 4B illustrates a local enlarged view of a capacitor according to FIG. 4A. FIG. 4C illustrates a cross-sectional view obtained from reference cross-section 4C-4C' in FIG. 4B.

As shown in FIG. 4A, the semiconductor sheets 210 are stacked along the Z-direction over the back-side dielectric 331, and each semiconductor sheet 210 is a Si sheet that forms a Si channel region for the corresponding transistor. Each semiconductor sheet 210 between the source/drain regions 218 forms a Si channel region of the transistor PG1 or PD1 (see FIGS. 3A and 3B), and the Si channel regions of the transistors PG1 and PD1 are surrounded by the gate dielectric layer 231 and the gate electrode layer 220. A gate dielectric layer 231 is formed between the semiconductor sheets 210 and the gate electrode layer 220. In some embodiments, the semiconductor sheet 210 can be interchangeably referred to as a nanostructure or a semiconductor sheet. In some embodiments, semiconductor sheet 210 may have a width in a range from about 4 nm to about 7 nm when viewed in X-direction. In some embodiments, the number of stacked semiconductor sheets 210 may be between about 2 to about 10. In some embodiments, the thickness of the semiconductor sheets 210 may be within a range about 3 nm to about 10 nm. In some embodiments, the semiconductor sheets 210 may be Si-base nanowire.

In some embodiments, the gate electrode layer 220 may be made of conductive material, such as aluminum (Al), copper (Cu), tungsten (W), titanium (Ti), tantalum (Ta), or other applicable materials. In some embodiments, the gate structure of the gate electrode layer 220 may include multiple material structure selected from a group consisting of poly gate/SiON structure, metals/high-K dielectric structure, Al/refractory metals/high-K dielectric structure, silicide/high-K dielectric structure, or combination. In some embodiments, the gate electrode layer 220 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). In some embodiments, the gate dielectric layer 231 is made of silicon oxide (SiO), silicon nitride ($Si_xN_y$), silicon oxynitride (SiON), dielectric material(s) with high dielectric constant (high-k), or a combination thereof. In some embodiments, the gate dielectric layer 231 is deposited by a plasma enhanced chemical vapor deposition (PECVD) process or by a spin coating process. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. In some embodiments, the gate dielectric layer 231 includes Lanthanum (La) dopant.

One or more work-function layers (not shown) are formed between the gate dielectric layer 231 and the gate electrode layer 220. In some embodiments, the work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

As shown in FIG. 4A, on the front side of the semiconductor structure, the source/drain regions 218 may include Si with Boron (e.g., $B_{11}$) content. In some embodiments, the source/drain regions 218 are formed by epitaxially growing Boron in Si material. In some embodiments, the source/drain regions 218 may include materials and/or dopants that achieve desired tensile stress and/or compressive stress in the channel region. In some embodiments, the source/drain regions 218 can be interchangeably referred to epitaxial structures or source/drain patterns. Source/drain silicide regions 270 are formed on the source/drain regions 218. The source/drain contacts 240a are formed on the source/drain silicide regions 270. The dielectric-base gates 225 are located on the edge of the semiconductor sheets 210. For example, one of the dielectric-base gates 225 is arranged on the left edge of the semiconductor sheets 210 in the first cell 10A, and another one of the dielectric-base gate 225 is arranged on the right edge of the semiconductor sheets 210 in the second cell 10B. In some embodiments, bottoms of the dielectric-base gates 225 may be level with bottoms of the source/drain regions 218. In some embodiments, bottoms of the dielectric-base gates 225 may be higher than bottoms of the source/drain regions 218. In some embodiments, the dielectric-base gates 225 may be deeper than the source/drain regions 218.

As shown in FIG. 4A, on the front side of the semiconductor structure, the gate spacers 233 are formed on the sidewalls of the dielectric-base gates 225 and the gate electrode layers 220. The hard mask layer 235 is formed over the gate electrode layers 220 and the gate spacers 233. In some embodiments, the hard mask layer 235 can be interchangeably referred to a gate top dielectric. In some embodiments, the hard mask layer 235 may be made of dielectric material. In some embodiments, the top surface of the hard mask layer 235 may be aligned with the top surfaces of the source/drain contacts 240a. In some embodiments, the top surface of the hard mask layer 235 may be lower than the top surfaces of the source/drain contacts 240a.

As shown in FIG. 4A, on the front side of the semiconductor structure, the ILD layers 260 are formed between the gate electrode layers 220 and over the source/drain regions 218. The ILD 262 and the IMD layer 264 are formed over the hard mask layer 235 and the ILD layers 260 in sequence. The conductive lines 202 and 204 are formed in the IMD layer 264 and over the gate electrode layers 220 and the source/drain regions 218. The source/drain region 218 is electrically connected to an overlying level (e.g., conductive line 202) through the source/drain contact 240a and the source/drain via 245a. The conductive line 202 is electrically connected to an overlying level (e.g., conductive line 204) through a conductive via (not shown). In some embodiments, the ILD layers 260, 262, and/or the IMD layer 264 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. In some embodiments, materials of the source/drain contact 240a, the source/drain via 245a, and/or conductive lines 202 and 204 may be made of a conductive material, such as Cu, Co, Ru, Pt, Al, W, Ti, TaN, TiN, or any combinations thereof.

As shown in FIG. 4A, on the back side of the semiconductor structure, the back-side dielectric 331, a dielectric layer 332, and an IMD layer 333 are deposited over the gate electrode layers 220 and the dielectric-base gates 225 in sequence. The back-side contacts 240*b* are formed in the back-side dielectric 331, back-side vias 245*b* are formed in the back-side dielectric layer 332, and the capacitors 12 are formed in the back-side IMD layer 333. The source/drain regions 218 are electrically connected to an underlying level (e.g., the capacitors 12) through the back-side contacts 240*b* and the back-side vias 245*b*. The capacitors 12 are connected to the underlying conductive layer 130.

As shown in FIGS. 4A and 4B, the capacitor 12 can include a top electrode layer 126, a bottom electrode layer 122, and an insulator layer 124 sandwiched between the top and bottom electrode layers 126 and 122. In other words, the top electrode layer 126 and the bottom electrode layer 122 are separated by the insulator layer 124. The top electrode layer 126 is connected to the conductive layer 130, and the bottom electrode layer 122 is connected to back-side metallization via 145*b*. In some embodiments, the capacitor 12 may have a capacitance greater than about 3 fF, such as about 3, 10, 15, 20, 25, or 30 fF. In some embodiments, the capacitor 12 may gave a vertical dimension D1 (see FIG. 4A) greater than about 500 nm, such as about 500, 750, 1000, 1500, 2000, 2500, 3000, 3500, 4000, 4500, or 5000 nm.

In some embodiments, the insulator layer 124 may have a thickness T2 (see FIG. 4B) less than about 6 nm, such as 1, 2, 3, 4, 5, or 6 nm. In some embodiments, a distance H3 from a bottommost position of the insulator layer 124 to a topmost position of the insulator layer 124 may be in a range from about 0.5 μm to about 10 μm, such as about 0.5, 1, 5, or 10 μm. In some embodiments, the distance H3 may be greater than about 500 nm, such as 500, 750, 1000, 1500, 2000, 2500, 3000, 3500, 4000, 4500, or 5000 nm. In some embodiments, the bottom electrode layer 122 may have a thickness T3 less than about 30 nm. In some embodiments, a distance H4 from a bottommost position of the bottom electrode layer 122 to a topmost position of the insulator layer 124 may be in a range from about 0.5 μm to about 10 μm, such as about 0.5, 1, 5, or 10 μm. In some embodiments, the distance H4 may be greater than about 500 nm, such as 500, 750, 1000, 1500, 2000, 2500, 3000, 3500, 4000, 4500, or 5000 nm. In some embodiments, the top electrode layer 126 may have a thickness T4 less than about 30 nm. In some embodiments, a distance H5 from a bottommost position of the top electrode layer 126 to a topmost position of the top electrode layer 126 may be in a range from about 0.5 μm to about 10 μm, such as about 0.5, 1, 5, or 10 μm. In some embodiments, the distance H5 may be greater than about 500 nm, such as 500, 750, 1000, 1500, 2000, 2500, 3000, 3500, 4000, 4500, or 5000 nm. In some embodiments, the top electrode layer 126 may be made of a same material as the conductive layer 130. In some embodiments, the top electrode layer 126 may be made of a different material than the conductive layer 130. In FIG. 4B, the bottom electrode layer 122 may have a lateral portion 122*a* and vertical portions 122*b* protruding from opposite ends of the lateral portion 122*a* toward the conductive layer 130.

Figure 4D:
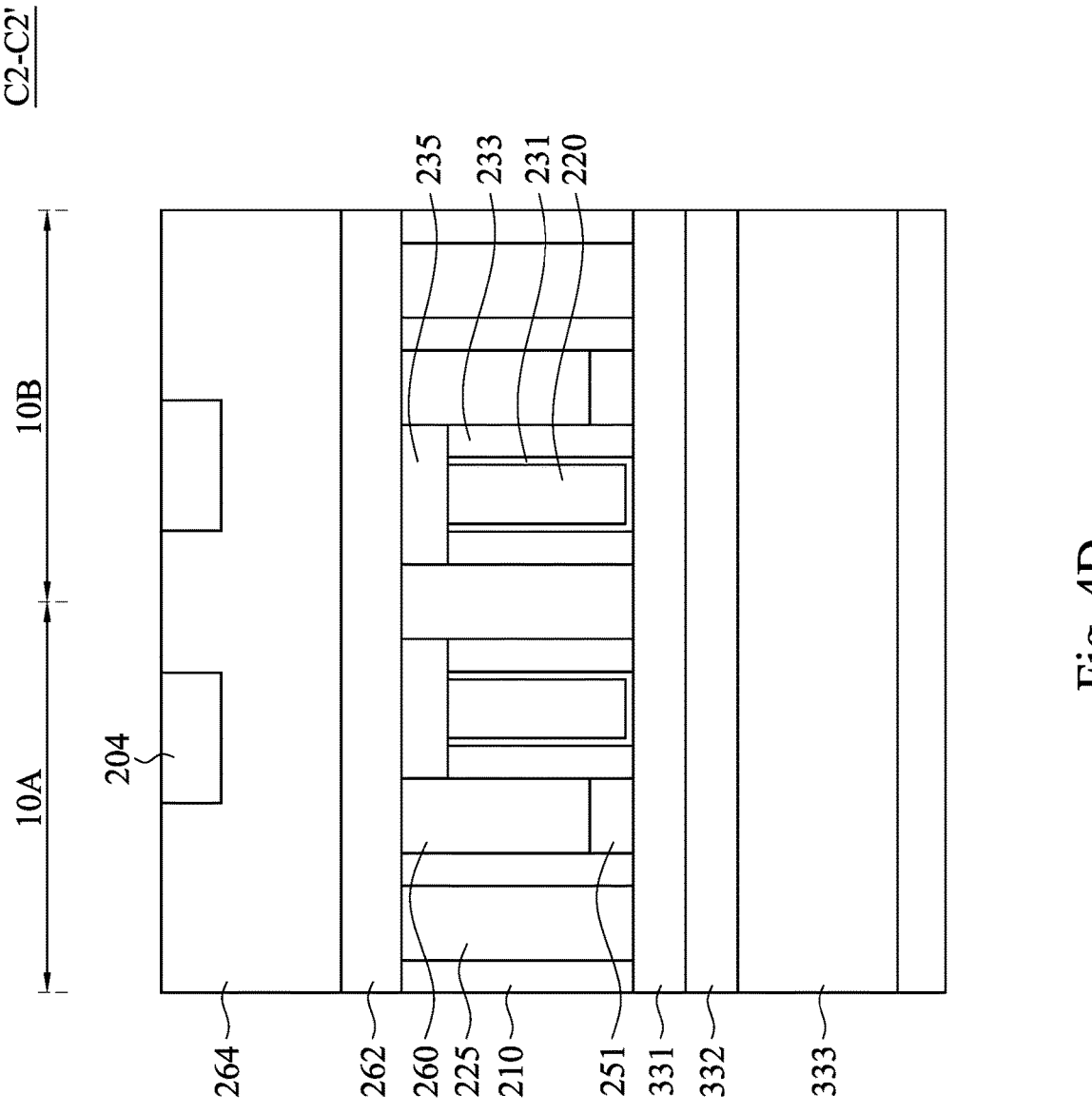
Figure 4E:
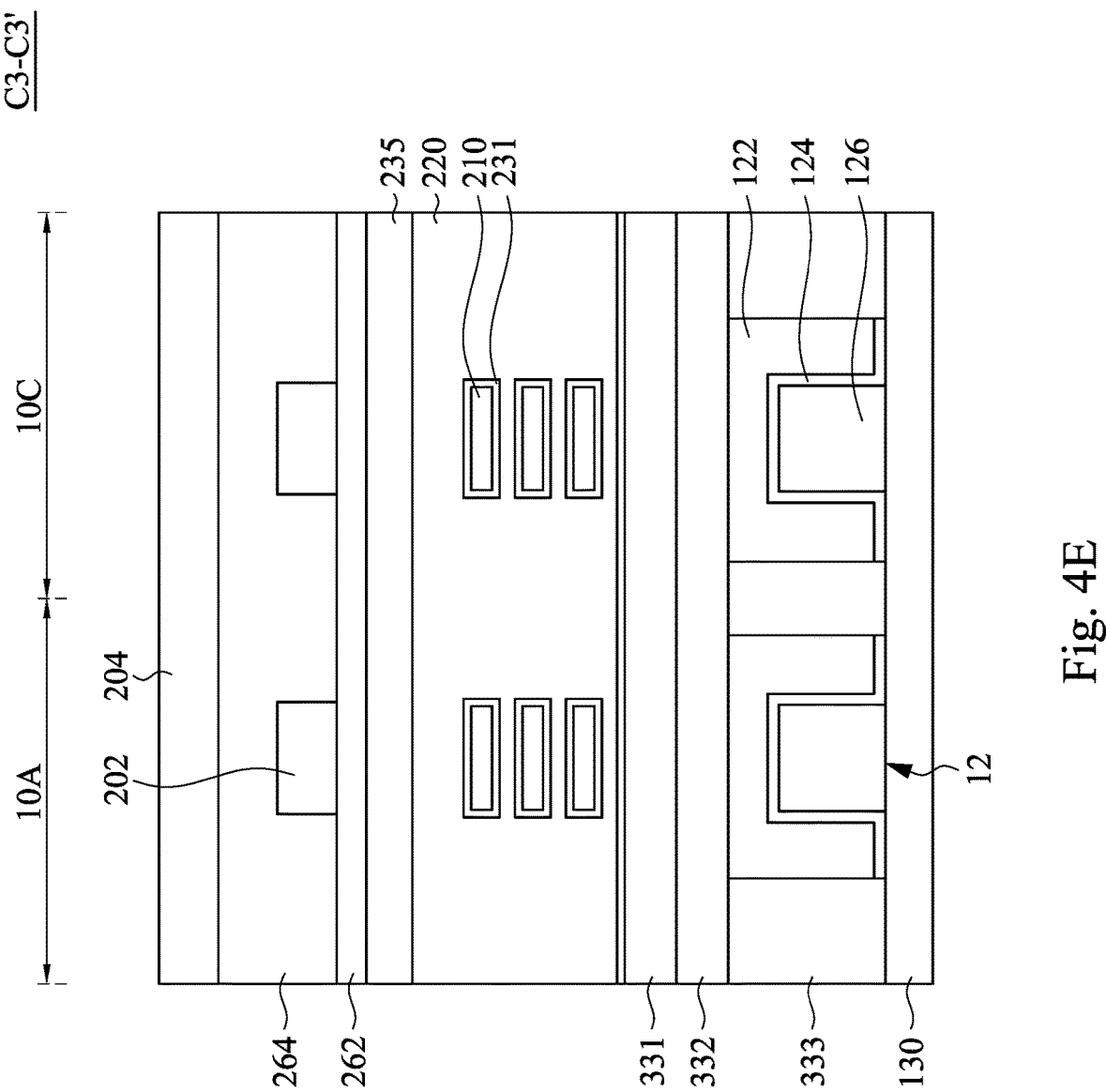
Figure 4F:
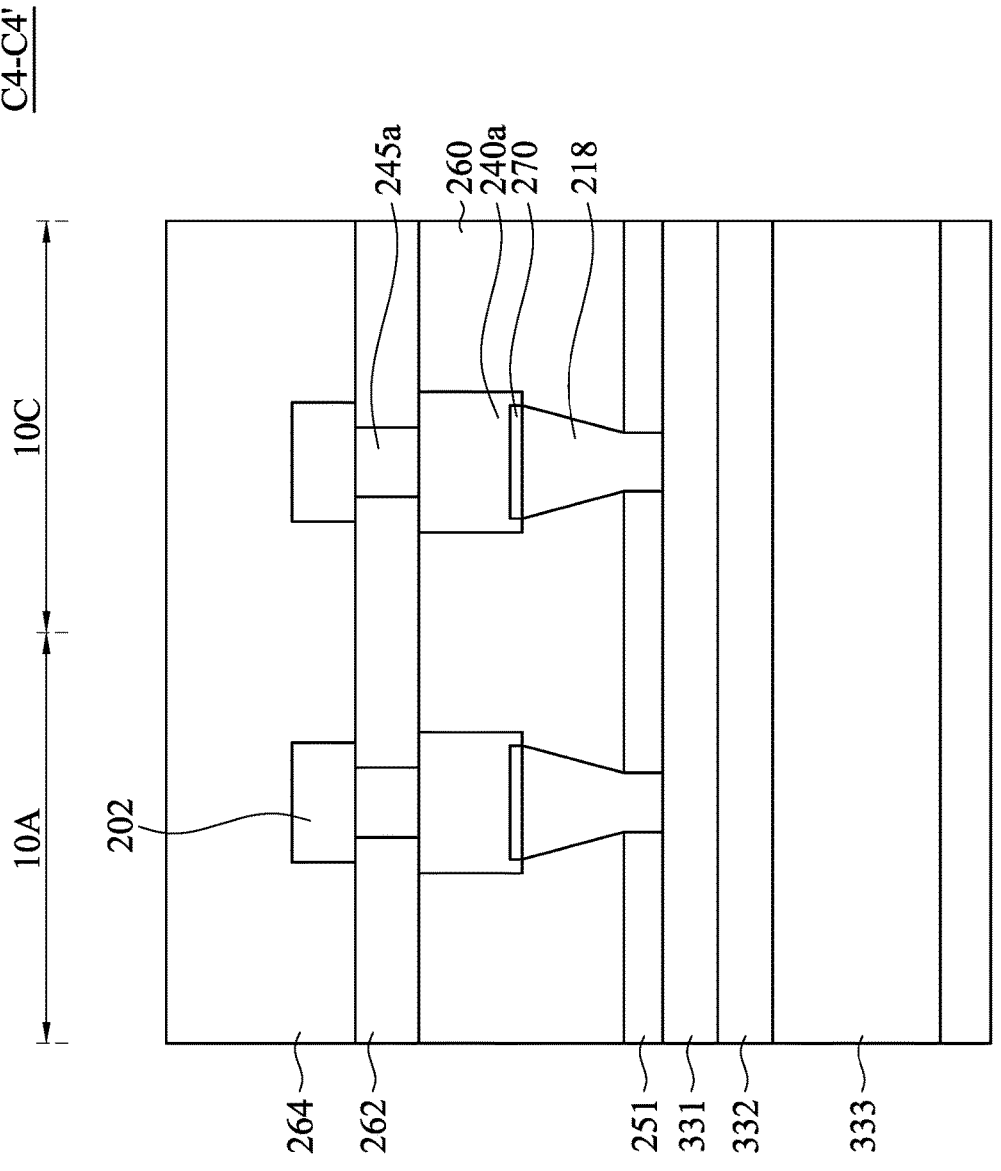
Figure 4G:
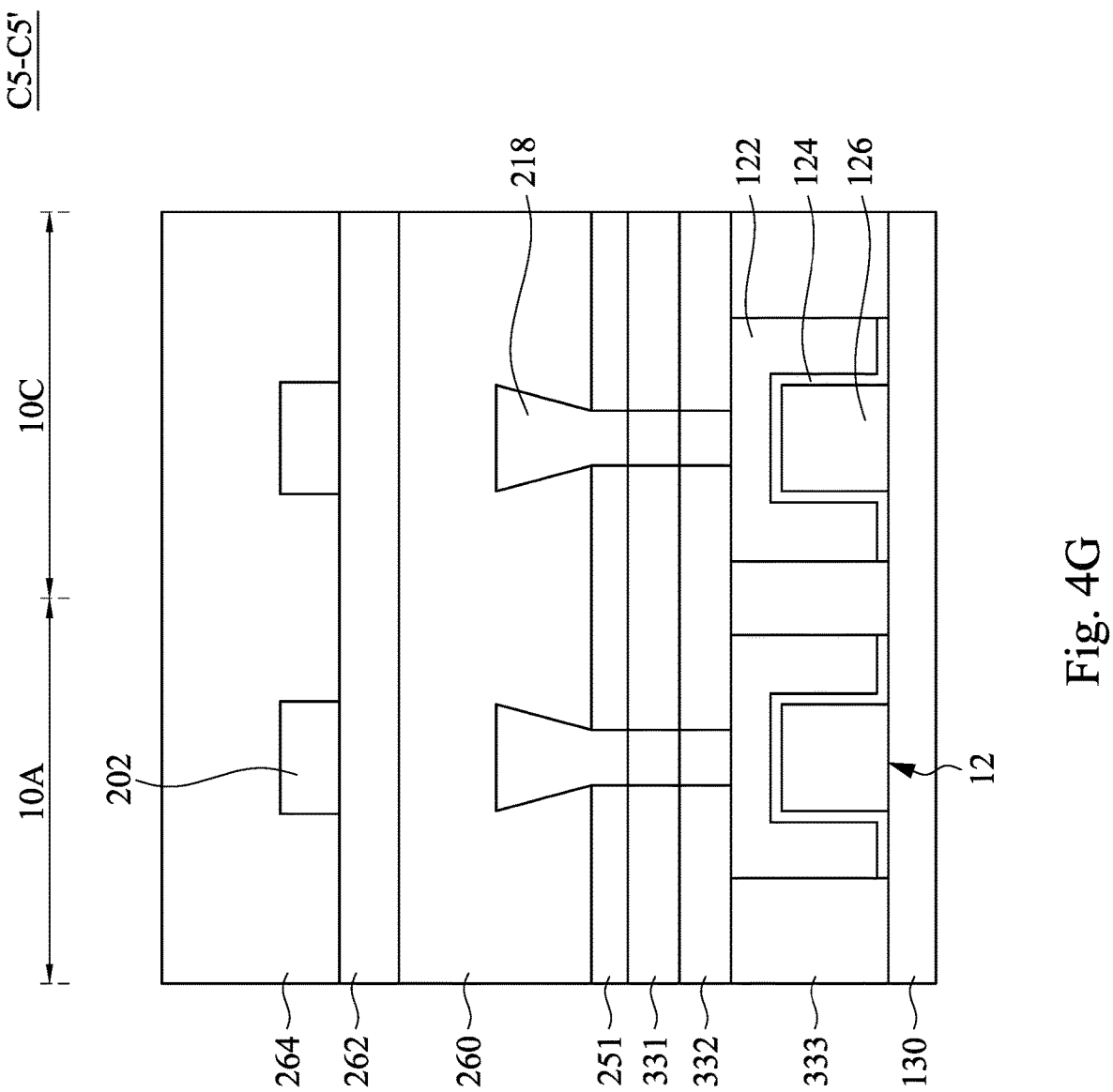

As shown in FIG. 4C, the top electrode layer 126 may have a circular pattern from the top view, the bottom electrode layer 122 may have a ring-shaped profile surrounding the top electrode layer 126 from the top view, and the insulator layer 124 may have a ring-shaped profile interposing the top electrode layer 126 and the bottom electrode layer 122 from the top view. As shown in FIG. 4D, the shallow trench isolation (STI) structure 251 interposes between the back-side dielectric 331 and the gate electrode layer 220 and/or interposes between the adjacent two gate electrode layers 220. In some embodiments, the STI structure 251 may have a bottom surface level with a bottom surface of the gate spacer 233. In some embodiments, the STI structure 251 may have a bottom surface higher than a bottom surface of the gate spacer 233. As shown in FIG. 4E, the gate dielectric layer 231 may be also formed over the back-side dielectric 331. As shown in FIGS. 4F and 4G, the source/drain regions 218 may pass through the STI structure 251 and have bottom surfaces level with a bottom surface of the STI structure 251. In other words, lower portions of the source/drain regions 218 are laterally surrounded by the STI structure 251.

In some embodiments, the top electrode layer 126 and/or the bottom electrode layer 122 may be made of a conductive material. By way of example but not limiting the present disclosure, the top electrode layer 126 and/or the bottom electrode layer 122 may include, but are not limited to, titanium tungsten (TiW), titanium aluminide (TiAl), aluminium copper (AlCu), titanium aluminium nitride (TiAlN), carbo-nitride tantalum (TaCN), hafnium (Hf), zirconium (Zr), titanium (Ti), tantalum (Ta), copper (Cu), aluminum (Al), metal carbides (e.g., hafnium carbide (HfC), zirconium carbide (ZrC), titanium carbide (TiC), aluminum carbide (AlC), aluminides, and/or other suitable materials. In alternative embodiments, the top electrode layer 126 and/or the bottom electrode layer 122 may include, but are not limited to, titanium nitride (TiN), tantalum nitride (TaN), tungsten nitride (WN), tungsten (W), ruthenium (Ru), palladium (Pd), platinum (Pt), cobalt (Co), nickel (Ni), argentum (Ag), Aurum (Au), conductive metal oxides, and/or other suitable materials. In some embodiments, the top electrode layer 126 and/or the bottom electrode layer 122 may be deposited using any suitable method, such as CVD, physical vapor deposition (PVD), ALD, PEALD, PECVD, SACVD, FCVD, spin-on, and/or the like, or a combination thereof. In some embodiments, the top electrode layer 126 may be made of a same material as the bottom electrode layer 122. In some embodiments, the top electrode layer 126 may be made of a different material than the bottom electrode layer 122.

In some embodiments, the insulator layer 124 may be made of an oxide base dielectric material, a carbon base dielectric material, a nitride base dielectric material, combinations thereof, or other suitable materials. In some embodiments, the insulator layer 124 may include SiOC, SiON, SiOCN, or combinations thereof. In some embodiments, the insulator layer 124 may be made of a metal oxide. In some embodiments, the insulator layer 124 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the insulator layer 124 may be made of a material having a dielectric constant greater than about 10. In some embodiments, the insulator layer 124 may include hafnium oxide (HfO$_2$), hafnium silicon oxide (HfSiO), hafnium silicon oxynitride (HfSiON), hafnium tantalum oxide (HfTaO), hafnium titanium oxide (HfMiO), hafnium zirconium oxide (HfZrO), lanthanum oxide (LaO), zirconium oxide (ZrO$_2$), titanium oxide (TiO$_2$), tantalum oxide (Ta$_2$O$_5$), yttrium oxide (Y$_2$O$_3$), strontium titanium oxide (SrTiO$_3$, STO), barium titanium oxide (BaTiO$_3$, BTO), barium zirconium oxide (BaZrO), hafnium lanthanum oxide (HfLaO), lanthanum silicon oxide (LaSiO), aluminum silicon oxide (AlSiO), aluminum oxide (Al$_2$O$_3$), silicon nitride (Si$_3$N$_4$), oxynitrides (SiON), any suitable materials, or combinations thereof. In some embodiments, the insulator layer 124 may include SiCN, $SiO_2$, HZO (a mixture of $HfO_2$ and $ZrO_2$), PZT ($PbZr_{0.52}Ti_{0.48}O_3$), VDF-TrFE (ferroelectric polymer), any suitable materials, or combinations thereof. In alternative embodiments, the insulator layer 124 may have a multilayer structure including, such as a silicon oxide layer (e.g., $SiO_2$ layer), a first high-k material layer (e.g., $HfO_2$ layer), and a second high-k material layer (e.g., $ZrO_2$ layer). In some embodiments, the insulator layer 124 may be deposited using any suitable method, such as CVD, physical vapor deposition (PVD), ALD, PEALD, PECVD, SACVD, FCVD, spin-on, and/or the like, or a combination thereof.

Figure 5A:
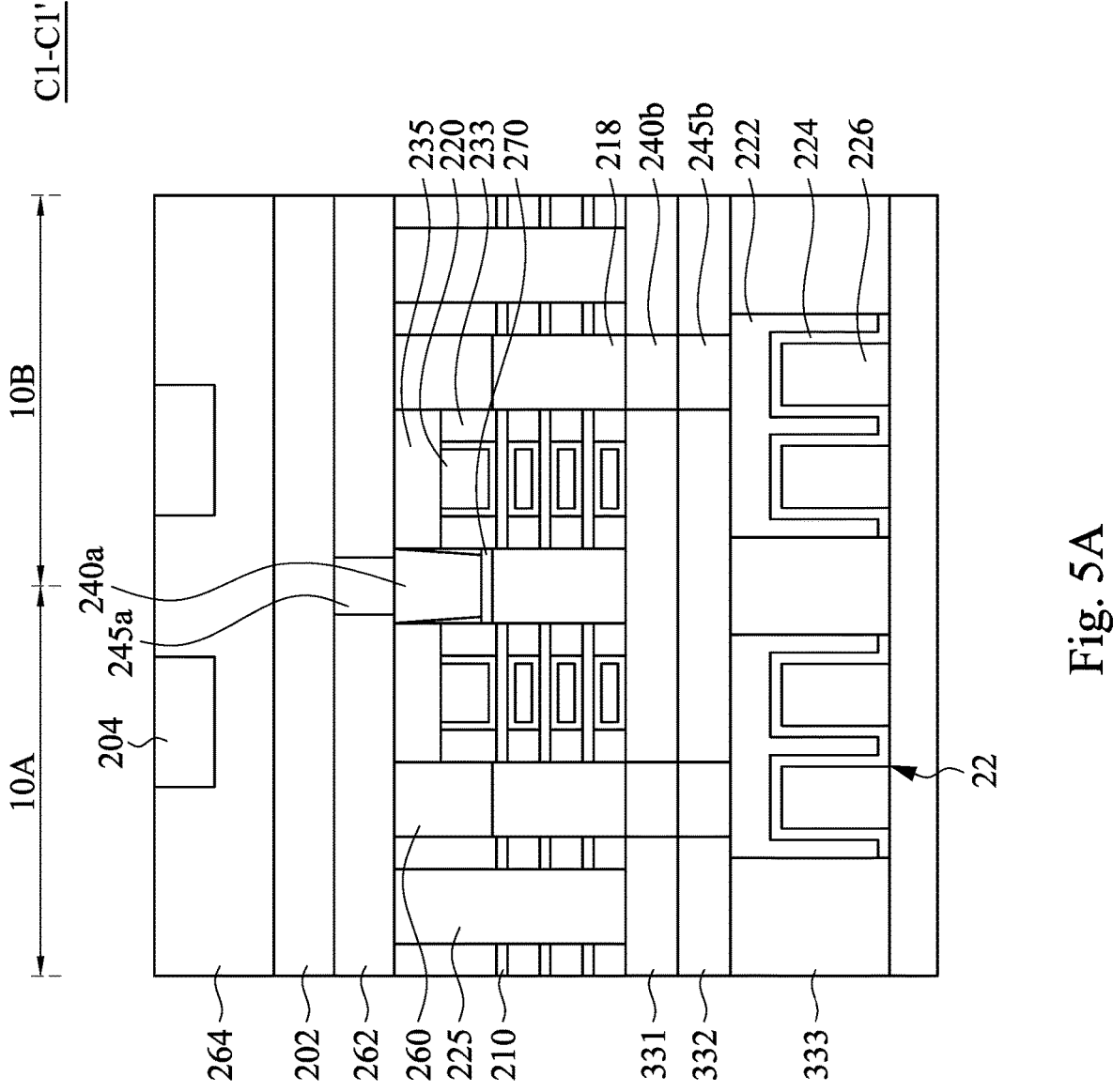
FIGS. 5A and 6A illustrate cross-sectional views of semiconductor structures corresponding to FIG. 4A in accordance with some embodiments of the present disclosure.
Figure 5C:
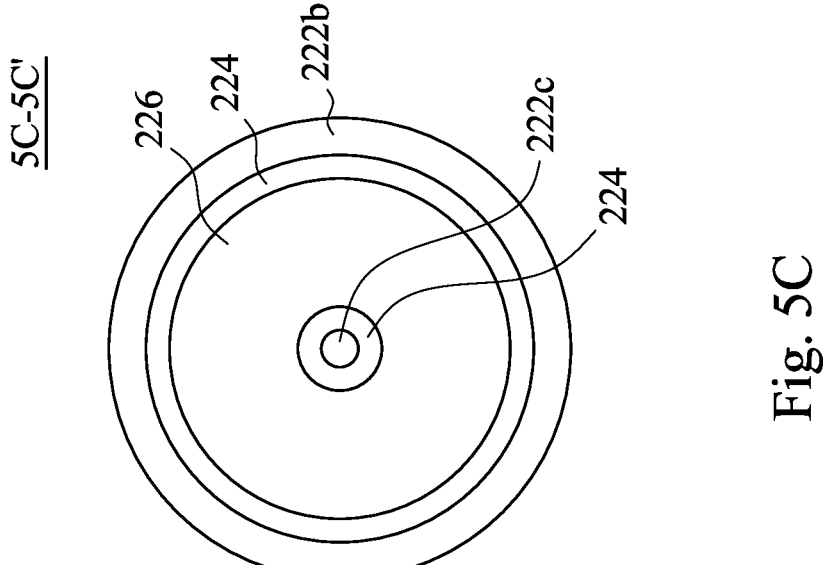
FIGS. 5C and 6C illustrate cross-sectional views obtained from a reference cross-section 5C-5C' in FIG. 5B and a reference cross-section 6C-6C' in FIG. 6B, respectively.
Figure 5B:
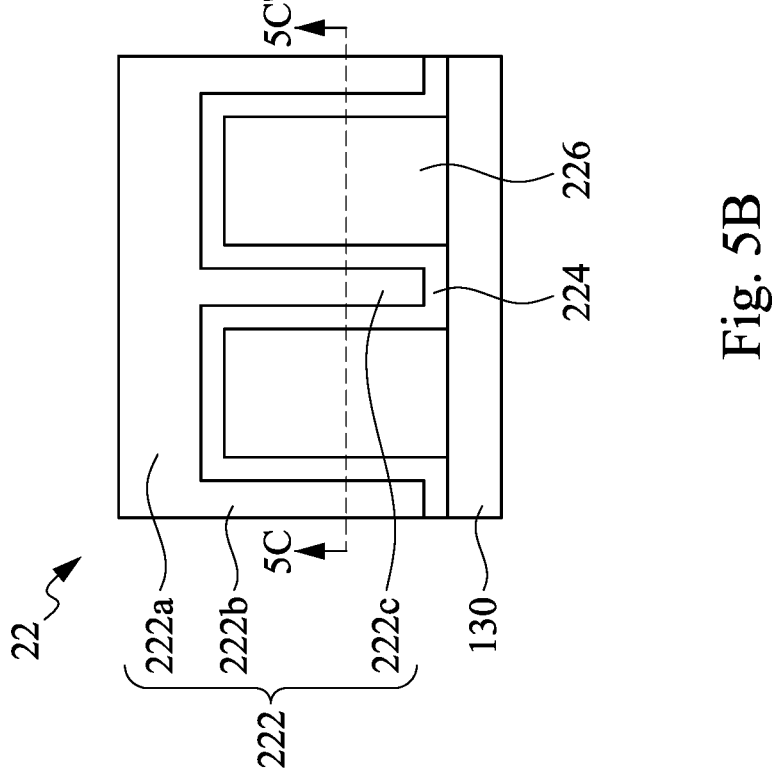
FIGS. 5B and 6B illustrate local enlarged views of capacitors according to FIGS. 5A and 6A, respectively.

Reference is made to FIGS. 5A, 5B, and 5C. FIG. 5A illustrates a cross-sectional view of a semiconductor structure corresponding to FIG. 4A in accordance with some embodiments of the present disclosure. FIG. 5B illustrates a local enlarged view of a capacitor according to FIG. 5A. FIG. 5C illustrates a cross-sectional view obtained from a reference cross-section 5C-5C' in FIG. 5B. While FIG. 5A-5C show an embodiment of the logic circuit with a capacitor 22 having different cross-sectional profiles than the capacitor 12 in FIGS. 4A-4G. In addition, the present disclosure may repeat reference numerals and/or letters in the various examples. This repetition is for the purpose of simplicity and clarity and does not in itself dictate a relationship between the various embodiments and/or configurations discussed.

As shown in FIGS. 5A and SB, the capacitor 22 can include a top electrode layer 226, a bottom electrode layer 222, and an insulator layer 224 sandwiched between the top and bottom electrode layers 226 and 222. In other words, the top electrode layer 226 and the bottom electrode layer 222 are separated by the insulator layer 224. The bottom electrode layer 222 may have a lateral portion 222a and vertical portions 222b protruding from opposite ends of the lateral portion 222a toward the conductive layer 130 and a vertical portion 222c protruding from a center of the lateral portion 222a toward the conductive layer 130. As shown in FIG. 5C, the vertical portion 222c of the bottom electrode layer 222 may have a circular pattern from the top view from the top view, and the vertical portion 222b of the bottom electrode layer 222 may have a ring-shaped profile from the top view surrounding the vertical portion 222c. The insulator layer 224 and top electrode layer 226 are interposed between the vertical portions 222b and 222c. The insulator layer 224 may have vertical portions 224a and 224b having ring-shaped profiles from the top view. The top electrode layer 126 may have a ring-shaped profile interposed between the vertical portions 224b and 224c of the insulator layer 224. In some embodiments, material and manufacturing method of the capacitor 22 including the bottom electrode layer 222, the insulator layer 224, and the top electrode layer 226 are substantially the same as those of the bottom electrode layer 122, the insulator layer 124, and the top electrode layer 126 as shown in FIGS. 4A-4G, and the related detailed descriptions may refer to the foregoing paragraphs, and are not described again herein.

Figure 6A:
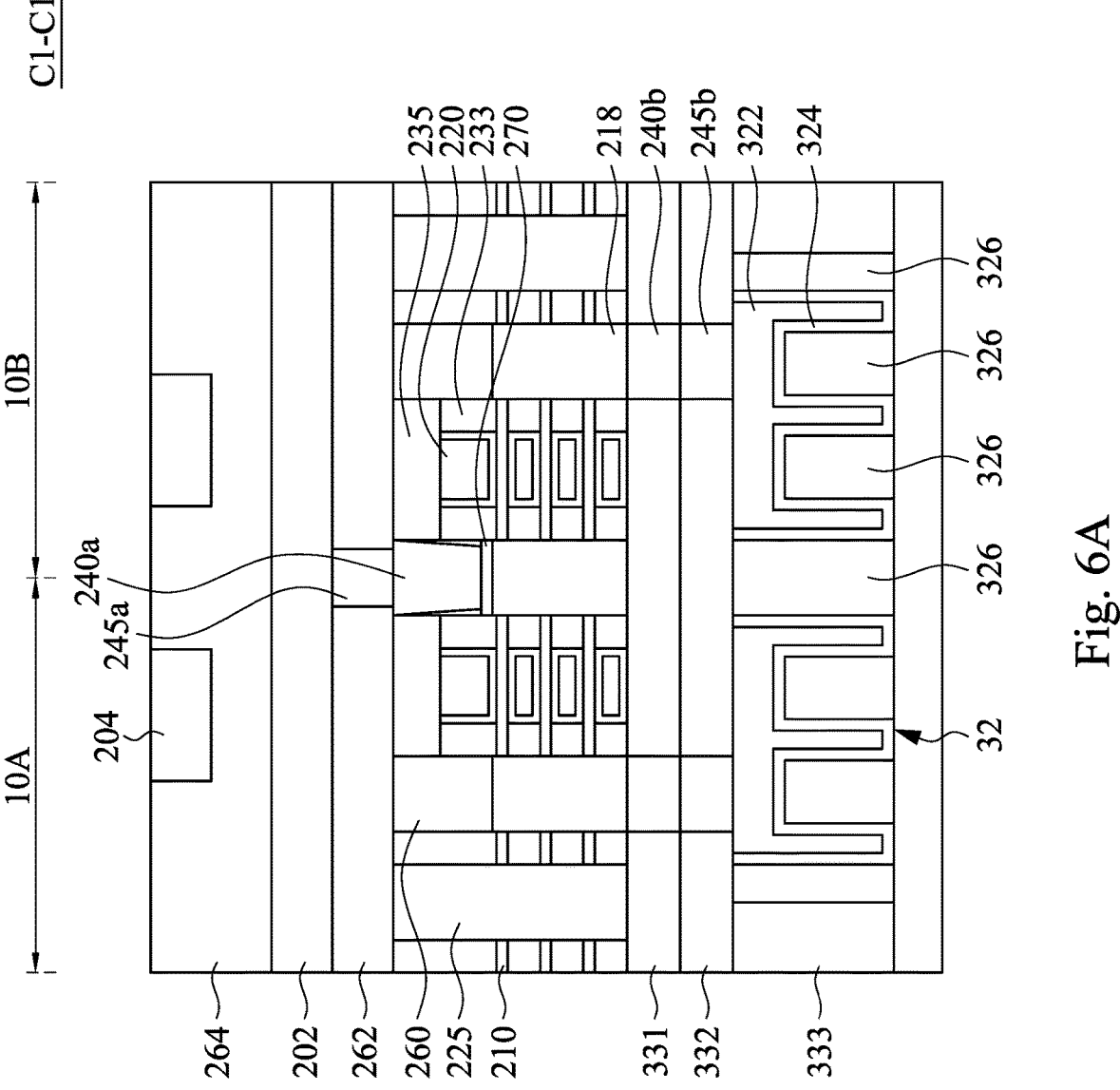
Figure 6C:
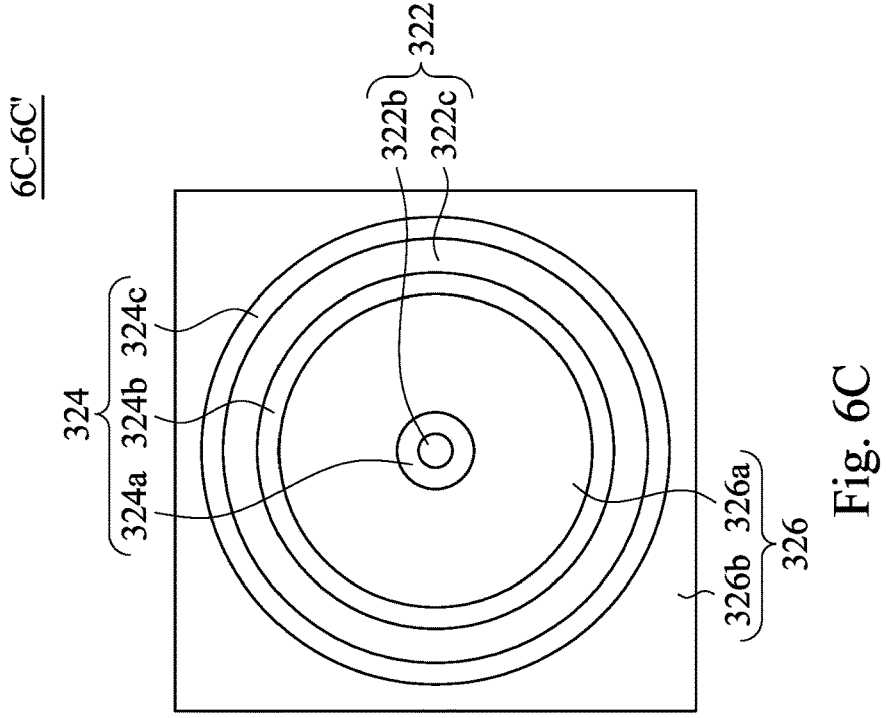
Figure 6B:
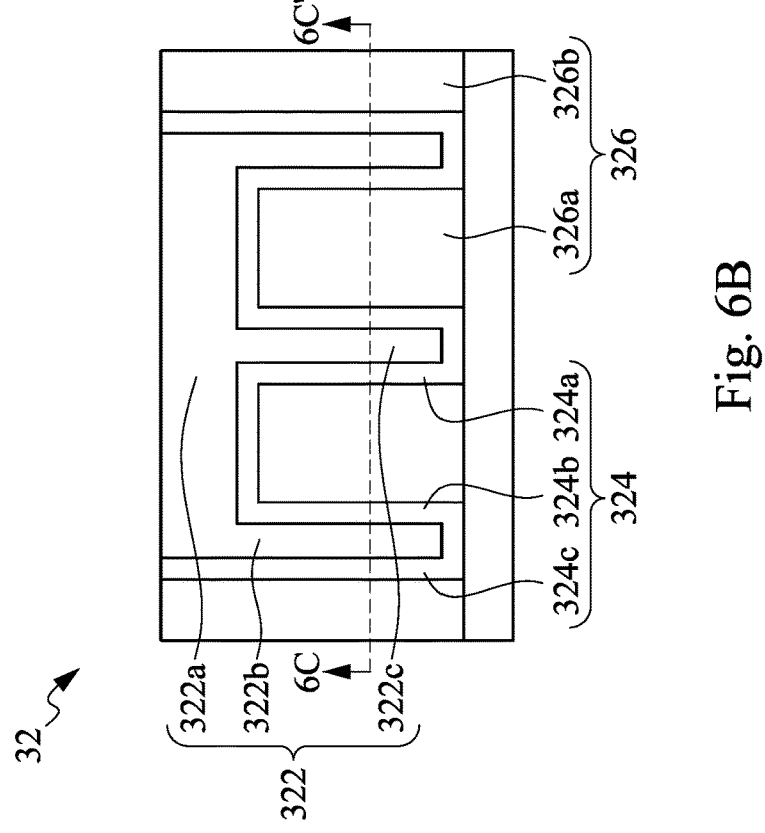

Reference is made to FIGS. 6A, 6B, and 6C. FIG. 6A illustrates a cross-sectional view of a semiconductor structure corresponding to FIG. 5A in accordance with some embodiments of the present disclosure. FIG. 6B illustrates a local enlarged view of a capacitor according to FIG. 5A. FIG. 6C illustrates a cross-sectional view obtained from a reference cross-section 6C-6C' in FIG. 6B. While FIGS. 6A-6C show an embodiment of the logic circuit with a capacitor 32 having different cross-sectional profiles than the capacitor 22 in FIGS. 5A-5C. In addition, the present disclosure may repeat reference numerals and/or letters in the various examples. This repetition is for the purpose of simplicity and clarity and does not in itself dictate a relationship between the various embodiments and/or configurations discussed.

As shown in FIGS. 6A and 6B, the capacitor 32 can include a top electrode layer 326, a bottom electrode layer 322, and an insulator layer 324 sandwiched between the top and bottom electrode layers 326 and 322. In other words, the top electrode layer 326 and the bottom electrode layer 322 are separated by the insulator layer 324. The top electrode layers 326 in the different capacitors 32 are merged together and surround the capacitors 32. The bottom electrode layer 322 may have a lateral portion 322a and vertical portions 322b protruding from opposite ends of the lateral portion 322a toward the conductive layer 130 and a vertical portion 322c protruding from a center of the lateral portion 322a toward the conductive layer 130.

As shown in FIG. 6C, the vertical portion 322c of the bottom electrode layer 322 may have a circular pattern from the top view from the top view, and the vertical portion 322b of the bottom electrode layer 322 may have a ring-shaped profile from the top view surrounding the vertical portion 322c. The insulator layer 324 may have vertical portions 324a, 324b, and 324c having ring-shaped profiles from the top view. The top electrode layer 326 may have vertical portions 326a and 326b, and the vertical portion 326a may has a ring-shaped profile and the vertical portion 326b may have a rectangular profile from the top view surrounding the vertical portion 326a. The vertical portions 324a and 324b of the insulator layer 324 and the vertical portion 326a of the top electrode layer 226 are interposed between the vertical portions 222b and 222c. In FIG. 6C, the vertical portion 324a of the insulator layer 324, the vertical portion 326a of the top electrode layer 326, the vertical portion 324b, the vertical portion 322b of the bottom electrode layer 322, the vertical portion 324c of the insulator layer 324, the vertical portion 326b of the top electrode layer 326 surround the vertical portion 322c of the bottom electrode layer 322 in sequence. In some embodiments, material and manufacturing method of the capacitor 32 including the bottom electrode layer 322, the insulator layer 324, and the top electrode layer 326 are substantially the same as those of the bottom electrode layer 322, the insulator layer 224, and the top electrode layer 226 as shown in FIGS. SA-5C, and the related detailed descriptions may refer to the foregoing paragraphs, and are not described again herein.

Reference is made to FIGS. 7A to 25C. FIGS. 7A to 25C illustrate the cross-sectional views of intermediate stages in the formation of a semiconductor structure in accordance with some embodiments. FIGS. 7A, 8A, 9A, 10A, 11A, 12A, 13A, 14A, 15A, 16A, 17A, 18A, 19A, 20A, 21A, 22A, 23A, 24A, and 25A illustrate cross-sectional views obtained from the reference cross-section C1-C1' in FIGS. 3A and 3B of intermediate stages in the formation of a semiconductor structure in accordance with some embodiments. FIGS. 7B, 8B, 9B, 10B, 11B, 12B, 13B, 14B, 15B, 16B, 17B, 18B, 19B, 20B, 21B, 22B, 23B, 248, and 25B illustrate cross-sectional views obtained from the reference cross-section C3-C3' in FIGS. 3A and 3B of intermediate stages in the formation of a semiconductor structure in accordance with some embodiments. FIGS. 7C, 8C, 9C, 1C, 11C, 12C, 13C, 14C, 15C, 16C, 17C, 18C, 19C, 20C, 21C, 22C, 23C, 24C, and 25C illustrate cross-sectional views obtained from the reference cross-section C5-C5' in FIGS. 3A and 3B of intermediate stages in the formation of a semiconductor structure in accordance with some embodiments.

Figure 7A:
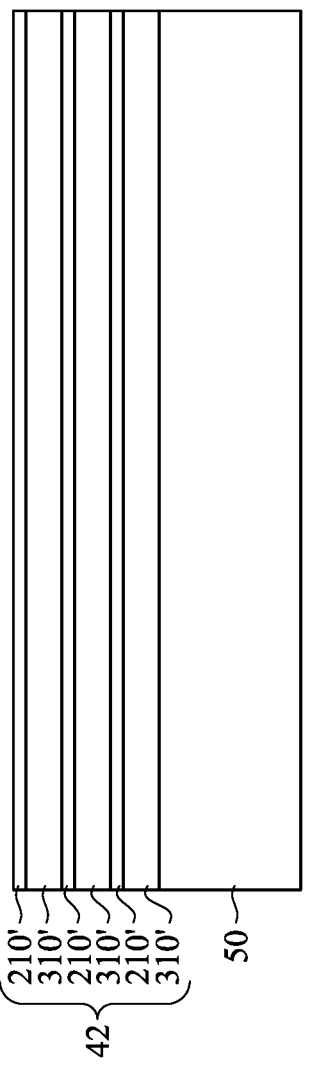
FIGS. 7A to 25C illustrate cross-sectional views of intermediate stages in the formation of a semiconductor structure in accordance with some embodiments.
Figure 7B:
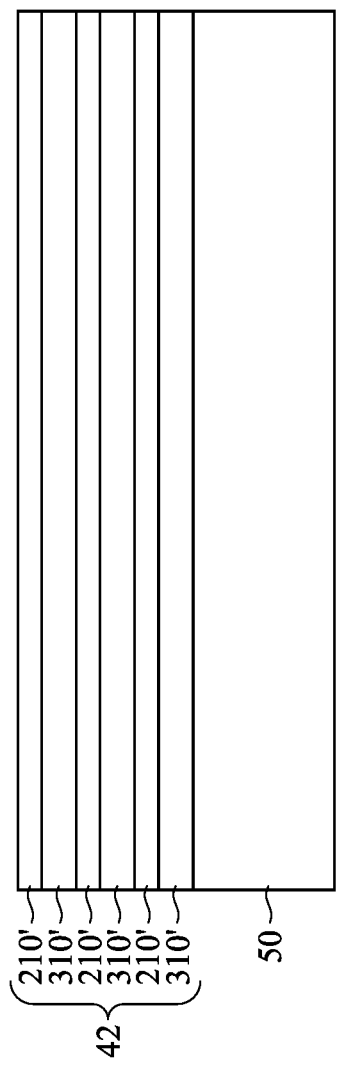
Figure 7C:
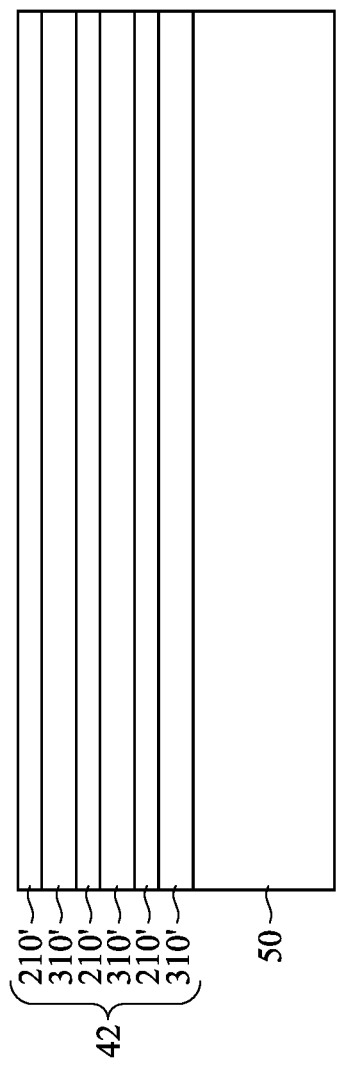

Reference is made to FIGS. 7A, 7B, and 7C. A substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

Subsequently, a multi-layer stack 42 is formed over the substrate 50. The multi-layer stack 42 includes alternating first semiconductor layers 310' and second semiconductor layers 210'. The first semiconductor layers 310' formed of a first semiconductor material, and the second semiconductor layers 210' are formed of a second semiconductor material. The semiconductor materials may each be selected from the candidate semiconductor materials of the substrate 50. In some embodiments, the multi-layer stack 42 includes two layers of each of the first semiconductor layers 310 and the second semiconductor layers 210'. It should be appreciated that the multi-layer stack 42 may include any number of the first semiconductor layers 310' and the second semiconductor layers 210'.

In some embodiments, and as will be subsequently described in greater detail, the first semiconductor layers 310' will be removed and the second semiconductor layers 210' will patterned to form channel regions for the nano-FETs in both the first type and second conductivity type device regions 10C and 10D as shown in FIGS. 3A and 3B. The first semiconductor layers 310' are sacrificial layers (or dummy layers), which will be removed in subsequent processing to expose the top surfaces and the bottom surfaces of the second semiconductor layers 210'. The first semiconductor material of the first semiconductor layers 310' is a material that has a high etching selectivity from the etching of the second semiconductor layers 210', such as silicon germanium. The second semiconductor material of the second semiconductor layers 210' is a material suitable for both n-type and p-type devices, such as silicon.

In some embodiments, the first semiconductor material of the first semiconductor layers 310' may be made of a material, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 210' may be made of a material, such as silicon, silicon carbide, a III-V compound semiconductor, a II-VI compound semiconductor, or the like. The first semiconductor material and the second semiconductor material may have a high etching selectivity from the etching of one another. Each of the layers of the multi-layer stack 42 may be grown by a process such as vapor phase epitaxy (VPE) or molecular beam epitaxy (MBE), deposited by a process such as chemical vapor deposition (CVD) or atomic layer deposition (ALD), or the like. In some embodiments, the multi-layer stack 42 may have a thickness in a range from about 70 to 120 nm, such as about 70, 80, 90, 100, 110, or 120 nm. In some embodiments, each of the layers may have a small thickness, such as a thickness in a range of about 5 nm to about 40 nm. In some embodiments, some layers (e.g., the second semiconductor layers 210') are formed to be thinner than other layers (e.g., the first semiconductor layers 310'). For example, in embodiments in which the first semiconductor layers 310' are sacrificial layers (or dummy layers) and the second semiconductor layers 210' are patterned to form channel regions for the nano-FETs as shown in FIGS. 3A and 3B.

Figure 8A:
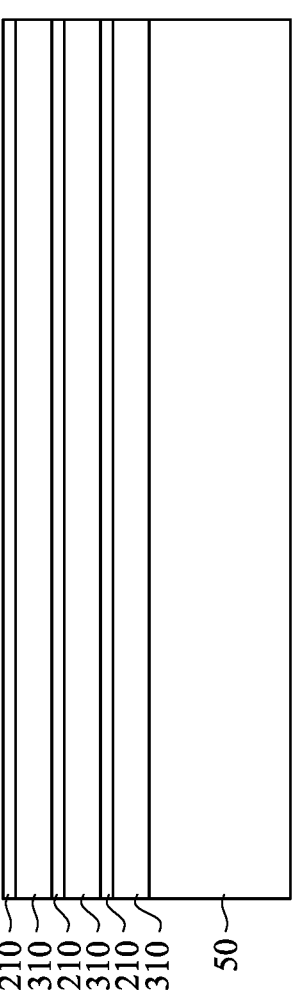
Figure 8B:
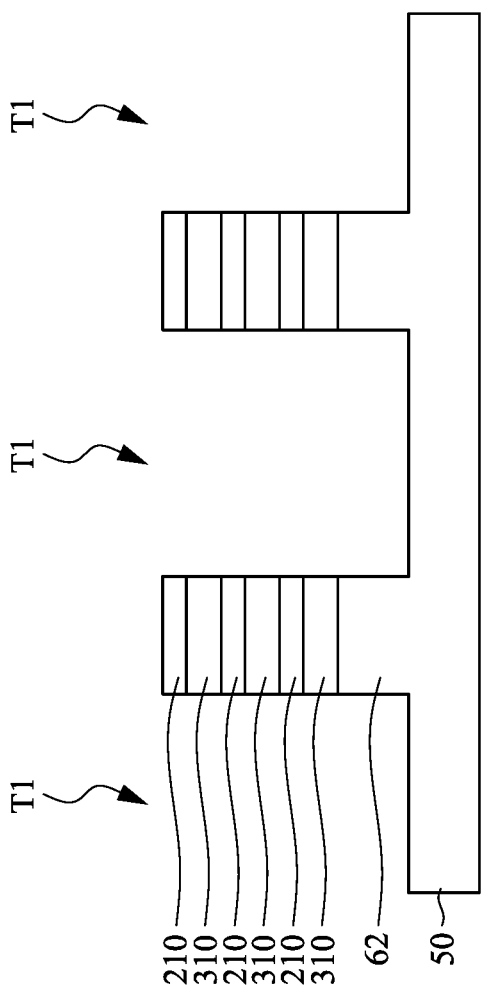
Figure 8C:
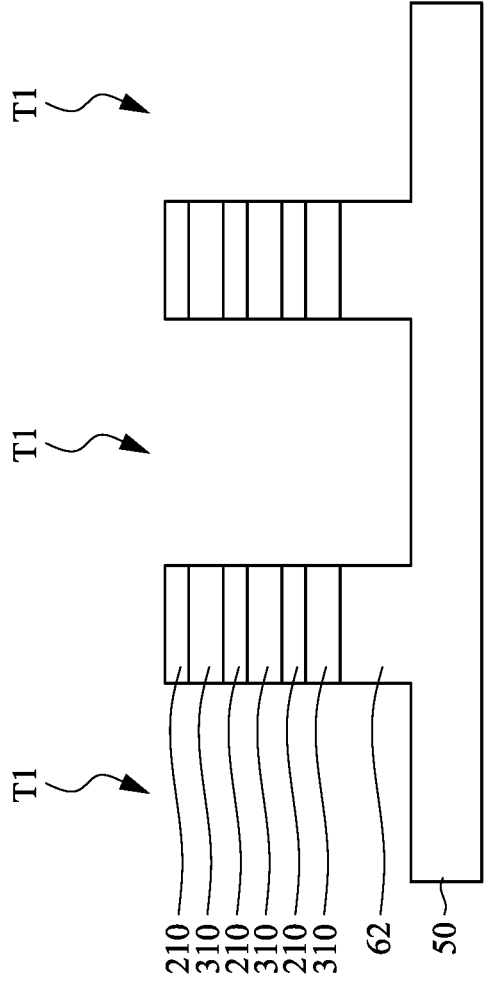

Reference is made to FIGS. 8A, 8B, and 8C. Trenches T1 are patterned in the substrate 50 and the multi-layer stack 42 to form fins 62, first semiconductor sheets 310, and second semiconductor sheets 210. The fins 62 are semiconductor strips patterned in the substrate 50. The first semiconductor sheets 310 and the second semiconductor sheets 210 include the remaining portions of the first semiconductor layers 310' and the second semiconductor layers 210', respectively. The trenches T1 may be patterned by any acceptable etch process, such as a reactive ion etch (RIE), neutral beam etch (NBE), the like, or a combination thereof. The etching may be anisotropic.

The fins 62 and the first and second semiconductor sheets 310, 210 may be patterned by any suitable method. For example, the fins 62 and the first and second semiconductor sheets 310, 210 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the first and second semiconductor sheets 310, 210. In some embodiments, the mask (or other layer) may remain on the first and second semiconductor sheets 310, 210. The fins 62 and the first and second semiconductor sheets 310, 210 may each have widths in a range of about 8 nm to about 40 nm. In some embodiments, the fins 62 and the first and second semiconductor sheets 310, 210 have substantially equal widths in the first type and second conductivity type device regions 10C and 10D as shown in FIGS. 3A and 3B.

Figure 9A:
Figure 9A:
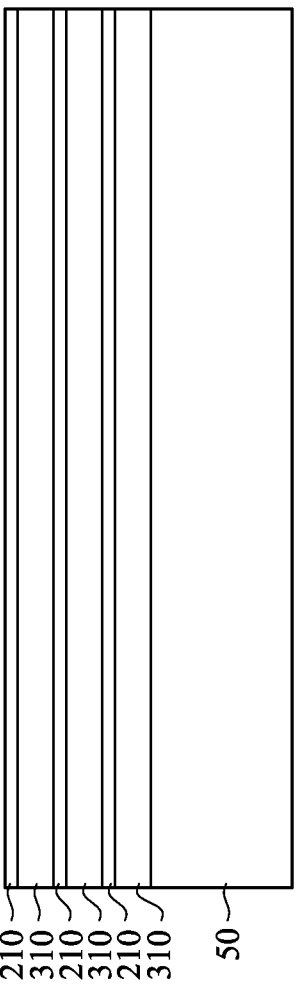
Figure 9B:
Figure 9B:
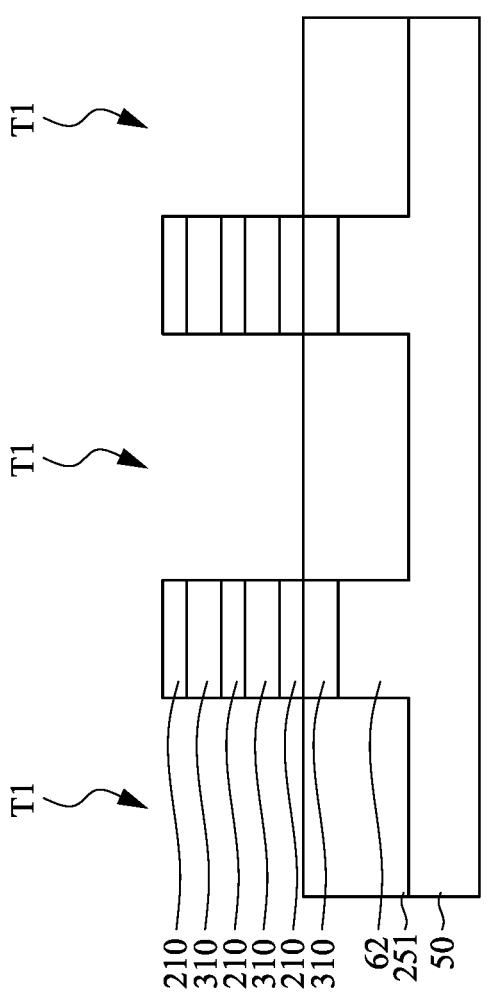
Figure 9C:
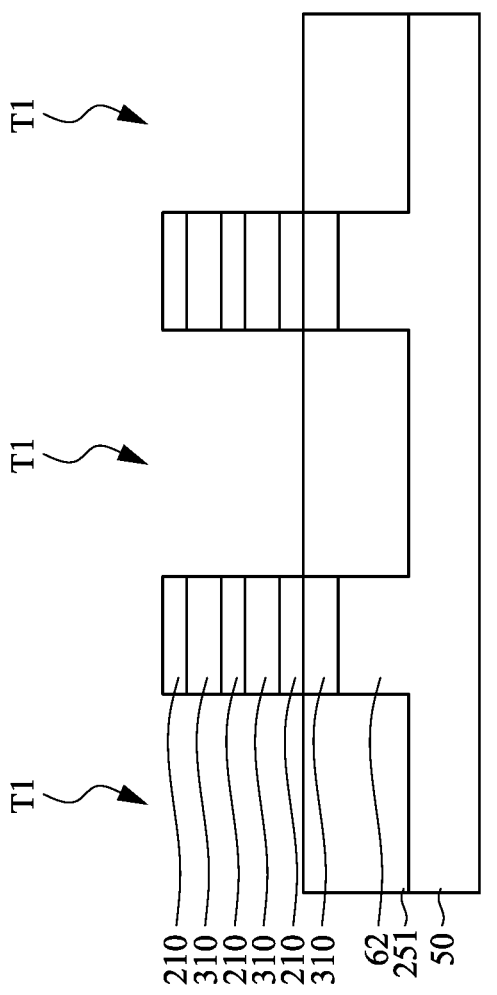

Reference is made to FIGS. 9A, 9B, and 9C. The STI structures 251 are formed over the substrate 50 and between adjacent fins 62. The STI structures 251 are disposed around at least a portion of the fins 62 such that at least a portion of the first and second semiconductor sheets 310, 210 protrude from between adjacent STI structures 251. In some embodiments, the top surfaces of the STI structures 70 are coplanar (within process variations) with the top surfaces of the fins 62. In some embodiments, the top surfaces of the STI structures 251 are above or below the top surfaces of the fins 62. The STI structures 251 separate the features of adjacent devices.

The STI structures 251 may be formed by any suitable method. For example, an insulation material can be formed over the substrate 50 and the first and second semiconductor sheets 310, 210, and between adjacent fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the first and second semiconductor sheets 310, 210. Although the STI structures 251 are each illustrated as a single layer, some embodiments may utilize multiple layers. For example, in some embodiments a liner (not separately illustrated) may first be formed along surfaces of the substrate 50, the fins 62, and the first and second semiconductor sheets 310, 210. Thereafter, a fill material, such as those previously described may be formed over the liner.

A removal process is then applied to the insulation material to remove excess insulation material over the first and second semiconductor sheets 310, 210. In some embodiments, a planarization process such as a chemical mechanical polish (CMP), an etch-back process, combinations thereof, or the like may be utilized. In embodiments in which a mask remains on the first and second semiconductor sheets 310, 210, the planarization process may expose the mask or remove the mask. After the planarization process, the top surfaces of the insulation material and the mask (if present) or the first and second semiconductor sheets 310, 210 are coplanar (within process variations). Accordingly, the top surfaces of the mask (if present) or the first and second semiconductor sheets 310, 210 are exposed through the insulation material. In some embodiments, no mask remains on the first and second semiconductor sheets 310, 210. The insulation material is then recessed to form the STI structures 251. The insulation material is recessed, such as in a range from about 30 nm to about 80 nm, such that at least a portion of the first and second semiconductor sheets 310, 210 protrude from between adjacent portions of the insulation material. Further, the top surfaces of the STI structures 251 may have a flat surface as illustrated, a convex surface, a concave surface (such as dishing), or a combination thereof. The top surfaces of the STI structures 251 may be formed flat, convex, and/or concave by an appropriate etch. The insulation material may be recessed using any acceptable etching process, such as one that is selective to the material of the insulation material (e.g., selectively etches the insulation material of the STI structures 251 at a faster rate than the materials of the fins 62 and the first and second semiconductor sheets 310, 210). For example, an oxide removal may be performed using dilute hydrofluoric (dHF) acid.

The process previously described is just one example of how the fins 62 and the first and second semiconductor sheets 310, 210 may be formed. In some embodiments, the fins 62 and/or the first and second semiconductor sheets 310, 210 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the first and second semiconductor sheets 310, 210. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Figure 10A:
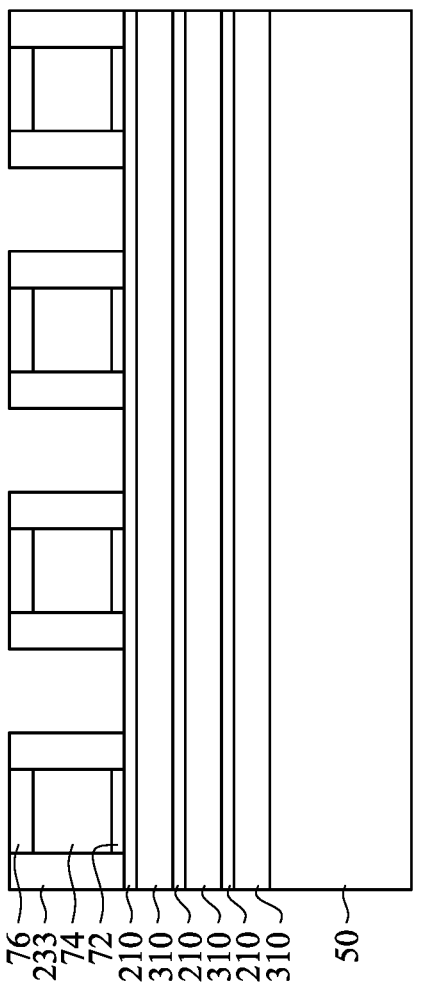
Figure 10B:
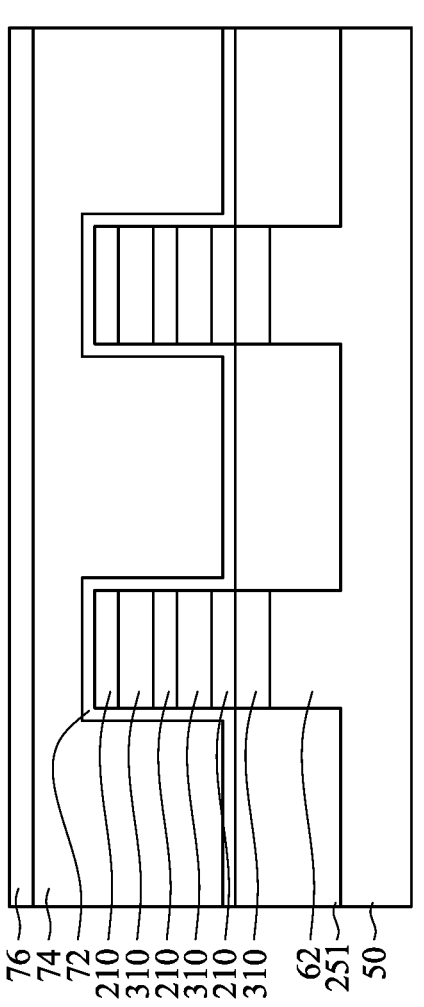
Figure 10C:
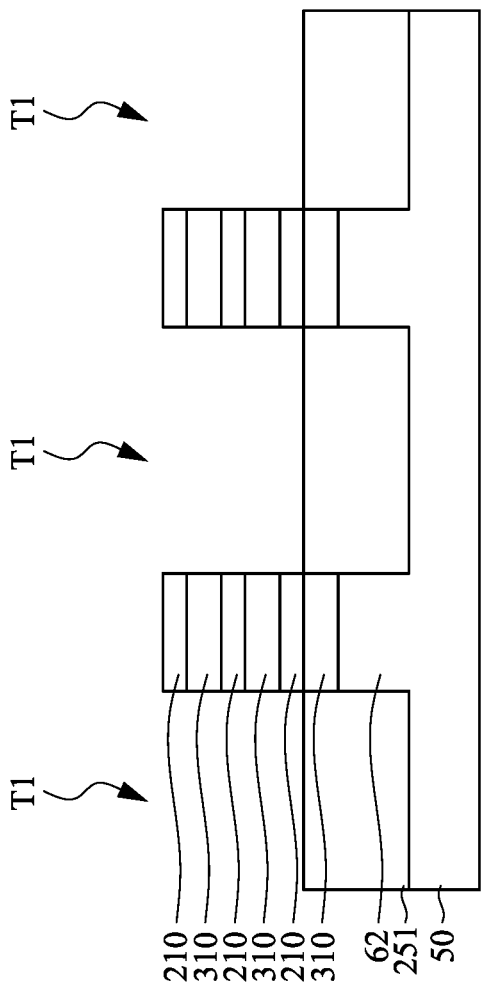

Reference is made to FIGS. 10A, 10B, and 10C. A dummy dielectric layer, a dummy gate layer, and a mask layer are sequentially formed on the fins 62 and the first and second semiconductor sheets 310, 210. The dummy dielectric layer is formed on the fins 62 and the first and second semiconductor sheets 310, 210. The dummy dielectric layer may be formed of a dielectric material such as silicon oxide, silicon nitride, a combination thereof, or the like, which may be deposited or thermally grown according to acceptable techniques. Subsequently, a dummy gate layer is formed over the dummy dielectric layer. Subsequently, a mask layer is formed over the dummy gate layer. The dummy gate layer may be deposited over the dummy dielectric layer and then planarized, such as by a CMP. The mask layer may be deposited over the dummy gate layer. The dummy gate layer may be formed of a conductive or non-conductive material, such as amorphous silicon, polycrystalline-silicon (polysilicon), polycrystalline silicon-germanium (poly-SiGe), a metal, a metallic nitride, a metallic silicide, a metallic oxide, or the like, which may be deposited by physical vapor deposition (PVD), CVD, or the like. The dummy gate layer may be formed of material(s) that have a high etching selectivity from the etching of insulation materials, e.g., the STI structures 251 and/or the dummy dielectric layer. The mask layer may be formed of a dielectric material such as silicon nitride, silicon oxynitride, or the like. In this example, the dummy gate layer and mask layer are formed across the first type and second conductivity type device regions 10C and 10D as shown in FIGS. 3A and 3B. In some embodiments, the dummy dielectric layer covers the fins 62, the first and second semiconductor sheets 310, 210, and the STI structures 251, such that the dummy dielectric layer extends over the STI structures 251 and between the dummy gate layer and the STI structures 251. In another embodiment, the dummy dielectric layer covers only the fins 62 and the first and second semiconductor sheets 310, 210.

The mask layer is patterned using acceptable photolithography and etching techniques to form masks 76. The pattern of the masks 76 is then transferred to the dummy gate layer by any acceptable etching technique to form dummy gates 74. The pattern of the masks 76 may optionally be further transferred to the dummy dielectric layer by any acceptable etching technique to form dummy dielectrics 72. The dummy gates 84 cover portions of the first and second semiconductor sheets 310, 210 that will be exposed in subsequent processing to form channel regions. Specifically, the dummy gates 84 extend along the portions of the second semiconductor sheets 210 that will be patterned to form channel regions. The pattern of the masks 76 may be used to physically separate adjacent dummy gates 74. The dummy gates 74 may also have lengthwise directions substantially perpendicular (within process variations) to the lengthwise directions of the fins 62. The masks 76 can optionally be removed after patterning, such as by any acceptable etching technique.

Gate spacers 233 are formed over the first and second semiconductor sheets 310, 210, on exposed sidewalls of the masks 76 (if present), the dummy gates 74, and the dummy dielectrics 72. In some embodiments, the gate spacers 233 can be interchangeably referred to top spacers or upper gate spacers. In some embodiments, the gate spacers 233 may have a lateral dimension in a range from about 4 nm to about 12 nm. In some embodiments, the gate spacer 233 may include multiple dielectric material and selected from a group consist of $SiO_2$, $Si_3N_4$, carbon doped oxide, nitrogen doped oxide, porous oxide, air gap, or combinations thereof. The gate spacers 233 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 74 (thus forming the gate spacers 233).

Figure 11A:
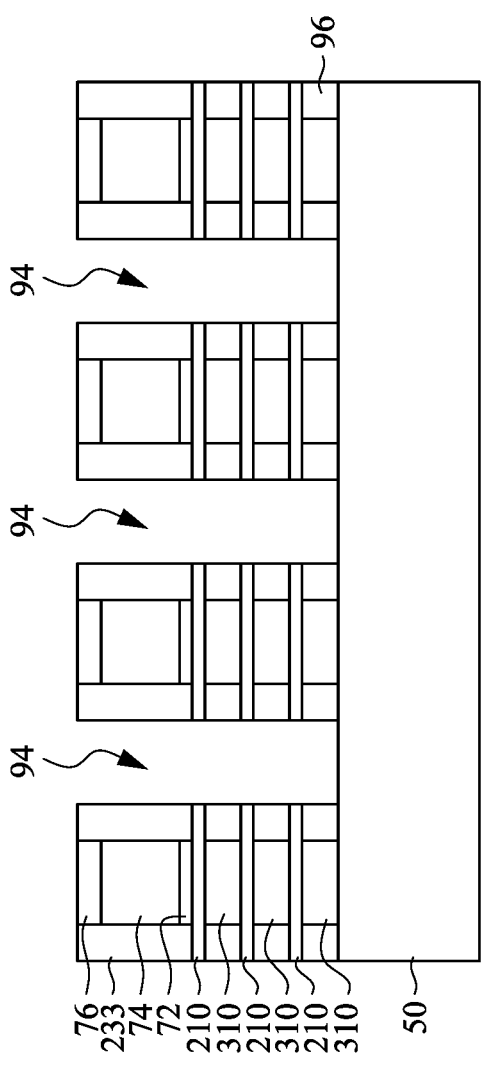
Figure 11B:
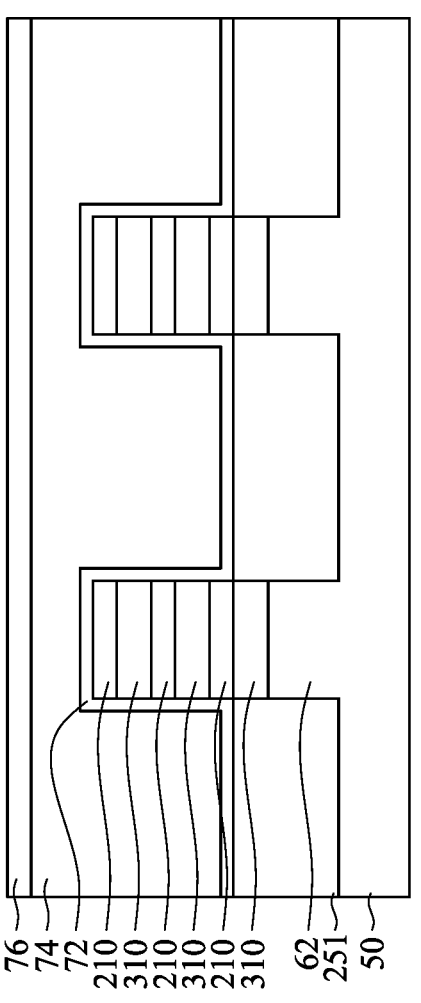
Figure 11C:
Figure 11C:
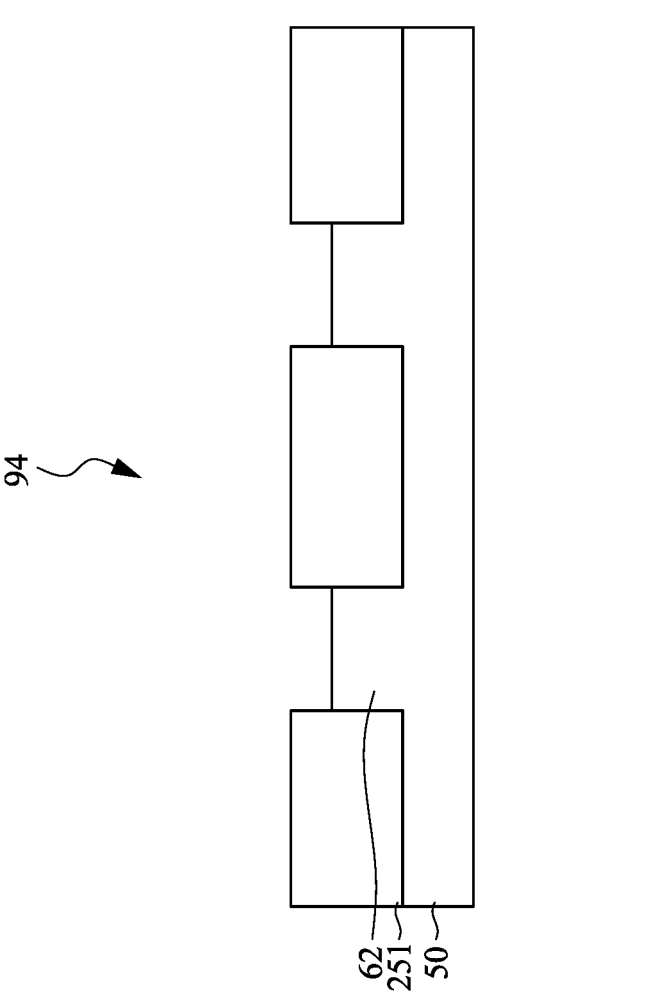

Reference is made to FIGS. 11A, 11B, and 11C. Source/drain recesses 94 are formed in the first and second semiconductor sheets 310, 210. In some embodiments, the source/drain recesses 94 extend through the first and second semiconductor sheets 310, 210 and into the fins 62. In some embodiments, the fins 62 may be etched such that bottom surfaces of the source/drain recesses 94 are disposed below the top surfaces of the STI structures 251. The source/drain recesses 94 may be formed by etching the first and second semiconductor sheets 310, 210 using an anisotropic etching processes, such as a RIE, a NBE, or the like. The gate spacers 233 and the dummy gates 74 collectively mask portions of the fins 62 and/or the first and second semiconductor sheets 310, 210 during the etching processes used to form the source/drain recesses 94. A single etch process may be used to etch each of the first and second semiconductor sheets 310, 210, or multiple etch processes may be used to etch the first and second semiconductor sheets 310, 210. Timed etch processes may be used to stop the etching of the source/drain recesses 94 after the source/drain recesses 94 reach a desired depth.

Inner spacers 96 are formed on sidewalls of the remaining portions of the first semiconductor sheets 310, e.g., those sidewalls exposed by the source/drain recesses 94. As will be subsequently described in greater detail, source/drain regions will be subsequently formed in the source/drain recesses 94, and the first semiconductor sheets 310 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etching processes, such as etching processes used to subsequently remove the first semiconductor sheets 310. In some embodiments, the inner spacers 96 can be interchangeably referred to lower gate spacers. In some embodiments, the inner spacers 96 may have a lateral dimension in a range from about 4 nm to about 12 nm.

As an example to form the inner spacers 96, the source/drain recesses 94 can be laterally expanded. Specifically, portions of the sidewalls of the first semiconductor sheets 310 exposed by the source/drain recesses 94 may be recessed. Although sidewalls of the first semiconductor sheets 310 are illustrated as being straight, the sidewalls may be concave or convex. The sidewalls may be recessed by any acceptable etching process, such as one that is selective to the material of the first semiconductor sheets 310 (e.g., selectively etches the material of the first semiconductor sheets 310 at a faster rate than the material of the second semiconductor sheets 210). The etching may be isotropic. For example, when the second semiconductor sheets 210 are formed of silicon and the first semiconductor sheets 310 are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas. In some embodiments, the same etching process may be continually performed to both form the source/drain recesses 94 and recess the sidewalls of the first semiconductor sheets 310. The inner spacers 96 can then be formed by conformally forming an insulating material and subsequently etching the insulating material. The insulating material may be silicon nitride or silicon oxynitride, although any suitable material, such as low-dielectric constant (low-k) materials having a k-value less than about 3.5, may be utilized. In some embodiments, the inner spacer 96 may have a higher K (dielectric constant) value than the gate spacer 233. In some embodiments, the material of inner spacer is selected from a group including $SiO_2$, $Si_3N_4$, SiON, SiOC, SiOCN base dielectric material, air gap, or combinations thereof. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 96 are illustrated as being flush with respect to the sidewalls of the gate spacers 233, the outer sidewalls of the inner spacers 96 may extend beyond or be recessed from the sidewalls of the gate spacers 233. In other words, the inner spacers 96 may partially fill, completely fill, or overfill the sidewall recesses. Moreover, although the sidewalls of the inner spacers 96 are illustrated as being straight, the sidewalls of the inner spacers 96 may be concave or convex.

Figure 12A:
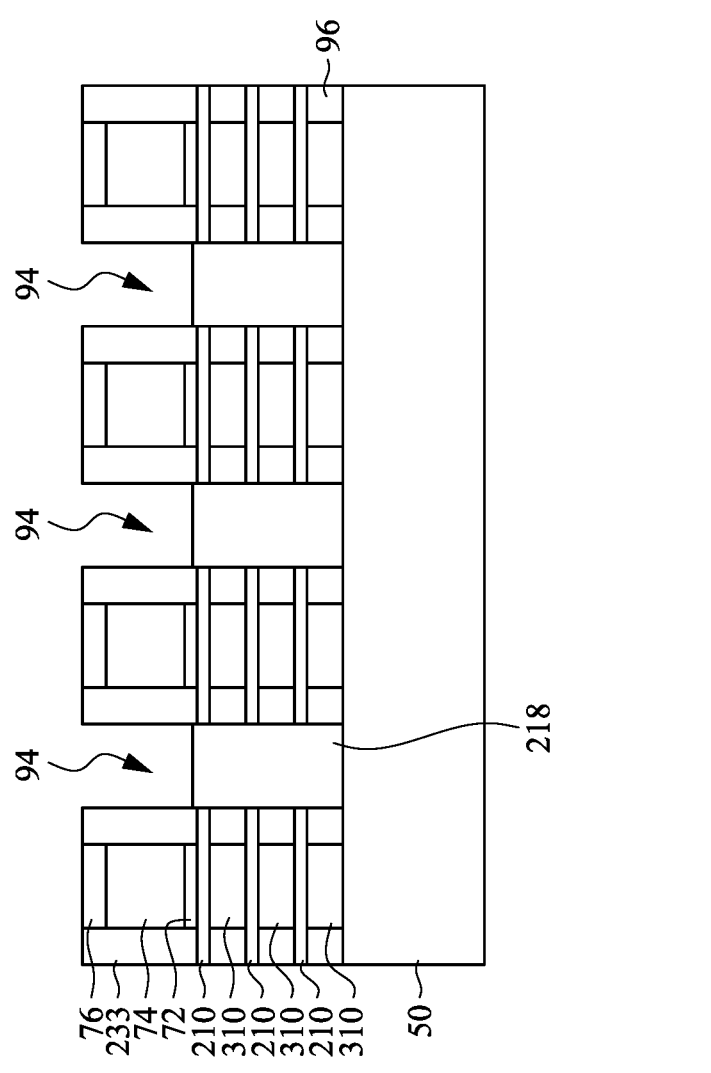
Figure 12B:
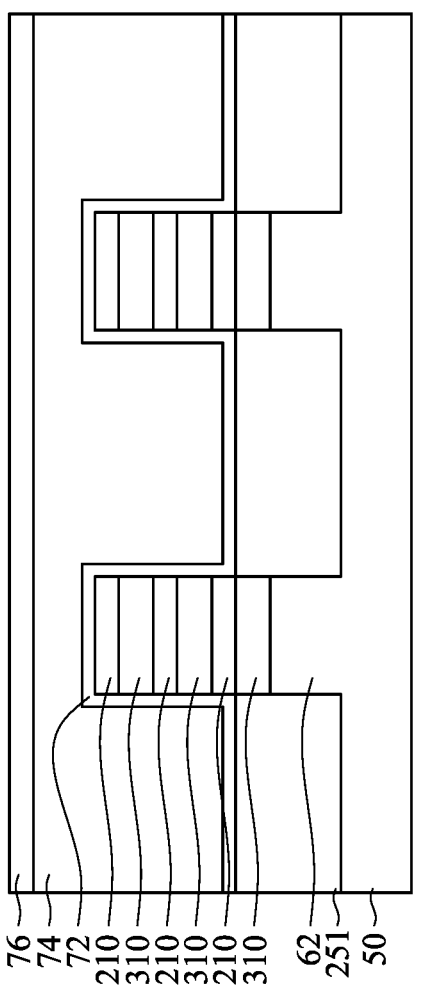
Figure 12C:
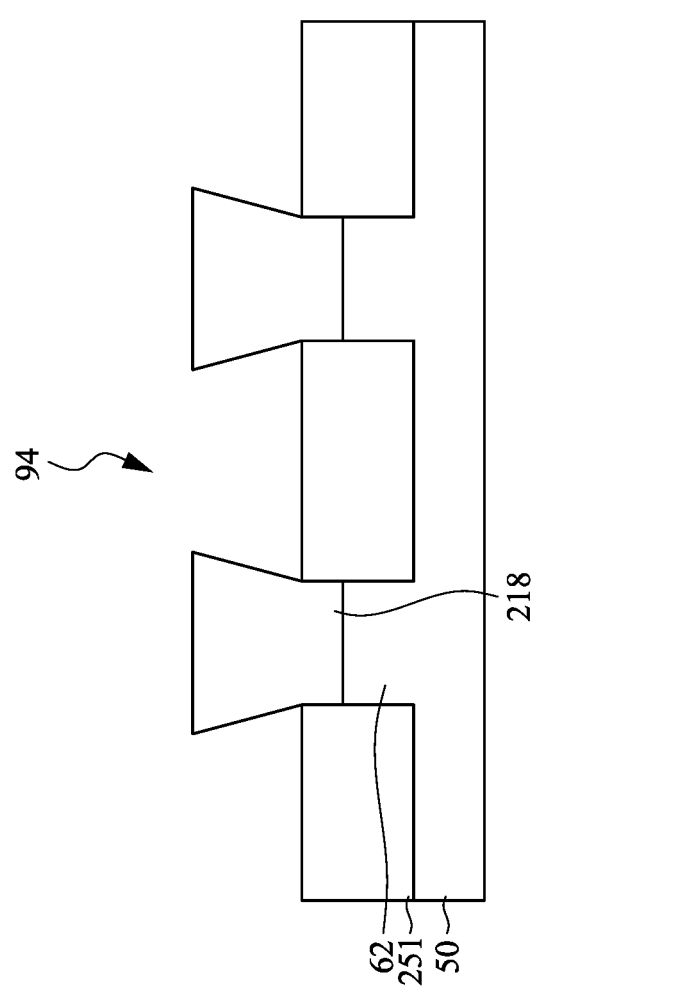

Reference is made to FIGS. 12A, 12B, and 12C. Epitaxial source/drain regions 218 are formed in the source/drain recesses 94, such that each dummy gate 74 (and corresponding channel regions) is disposed between respective adjacent pairs of the epitaxial source/drain regions 218. In some embodiments, the gate spacers 233 and the inner spacers 96 are used to separate the epitaxial source/drain regions 218 from, respectively, the dummy gates 74 and the first semiconductor sheets 310 by an appropriate lateral distance so that the epitaxial source/drain regions 218 do not short out with subsequently formed gates of the resulting nano-FETs. A material of the epitaxial source/drain regions 218 may be selected to exert stress in the respective channel regions, thereby improving performance.

Figure 13A:
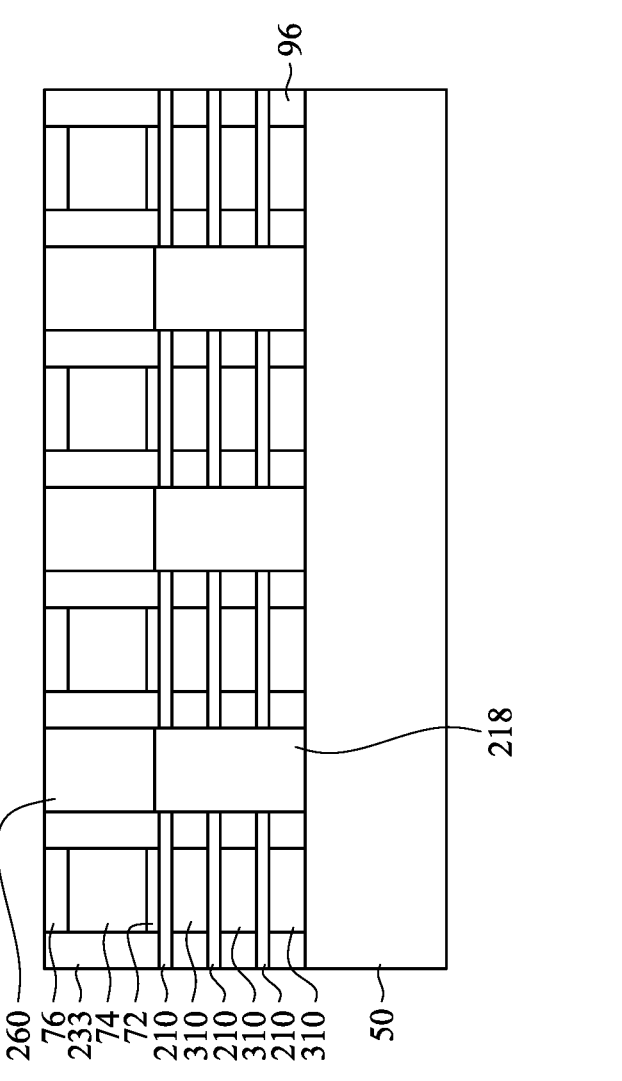
Figure 13B:
Figure 13B:
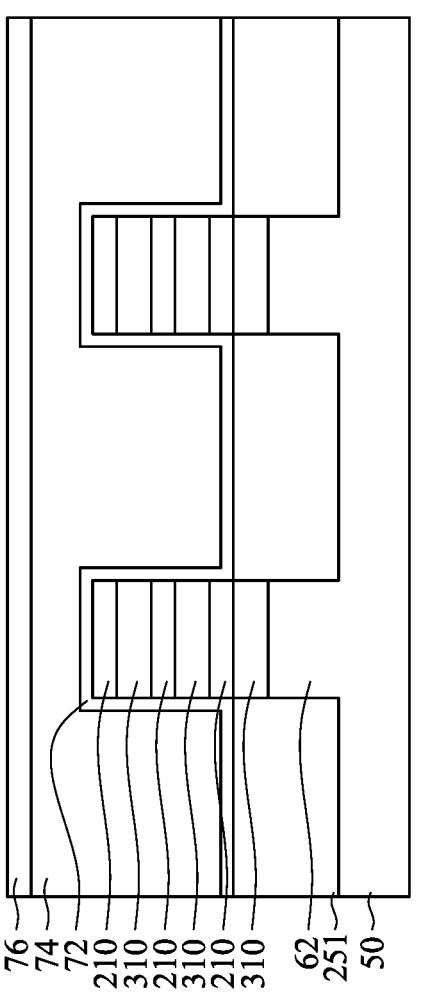
Figure 13C:
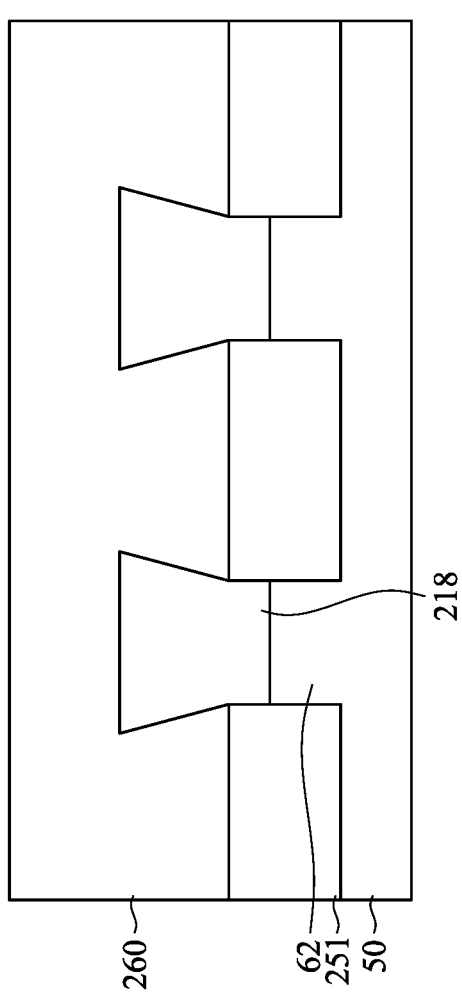

Reference is made to FIGS. 13A, 13B, and 13C. An inter-layer dielectric (ILD) layer 260 is deposited over the epitaxial source/drain regions 218, the gate spacers 233, the masks 76 (if present) or the dummy gates 74. The ILD layer 260 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) is formed between the ILD layer 260 and the epitaxial source/drain regions 218, the gate spacers 233, and the masks 76 (if present) or the dummy gates 74. The CESL may be formed of a dielectric material, such as silicon nitride, silicon oxide, silicon oxynitride, or the like, having a high etching selectivity from the etching of the ILD 260. The CESL may be formed by an any suitable method, such as CVD, ALD, or the like.

Subsequently, a removal process is performed to level the top surfaces of the ILD layer 260 with the top surfaces of the masks 76 (if present) or the dummy gates 74. In some embodiments, a planarization process such as a chemical mechanical polish (CMP), an etch-back process, combinations thereof, or the like may be utilized. The planarization process may also remove the masks 76 on the dummy gates 74, and portions of the gate spacers 233 along sidewalls of the masks 76. After the planarization process, the top surfaces of the gate spacers 233, the ILD layer 260, the CESL, and the masks 76 (if present) or the dummy gates 74 are coplanar (within process variations). Accordingly, the top surfaces of the masks 76 (if present) or the dummy gates 74 are exposed through the ILD layer 260. In some embodiments, the masks 76 remain, and the planarization process levels the top surface of the ILD layer 260 with the top surfaces of the masks 76.

Figure 14A:
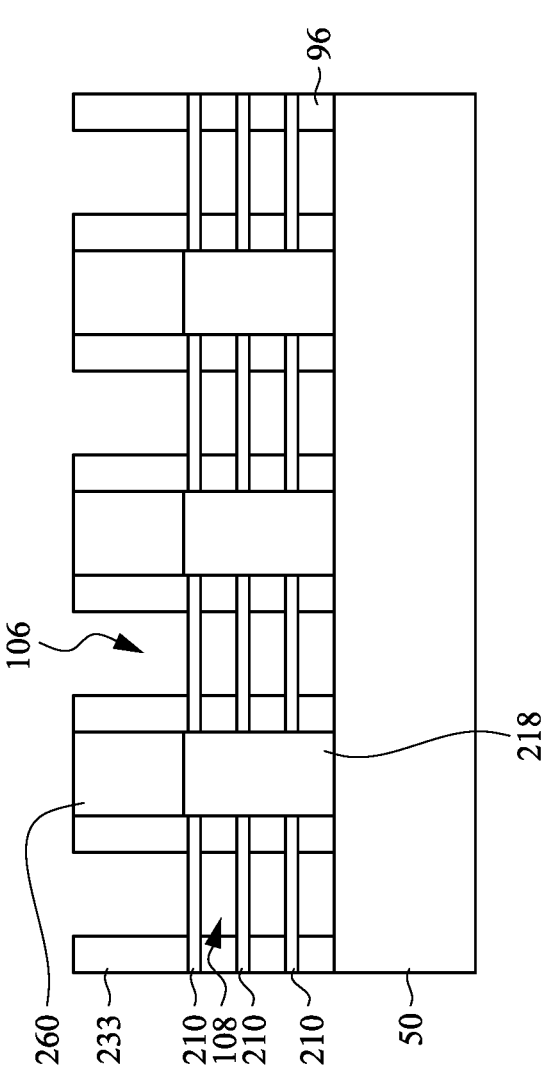
Figure 14B:
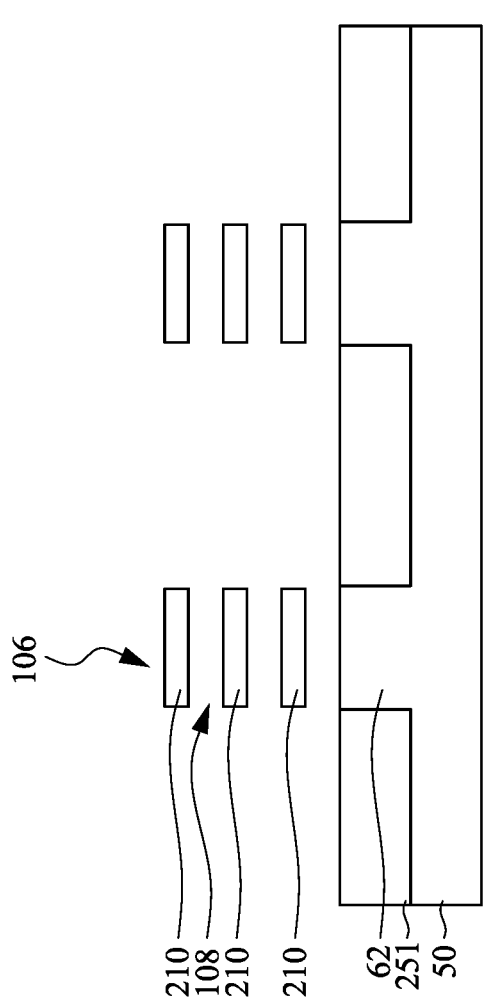
Figure 14C:
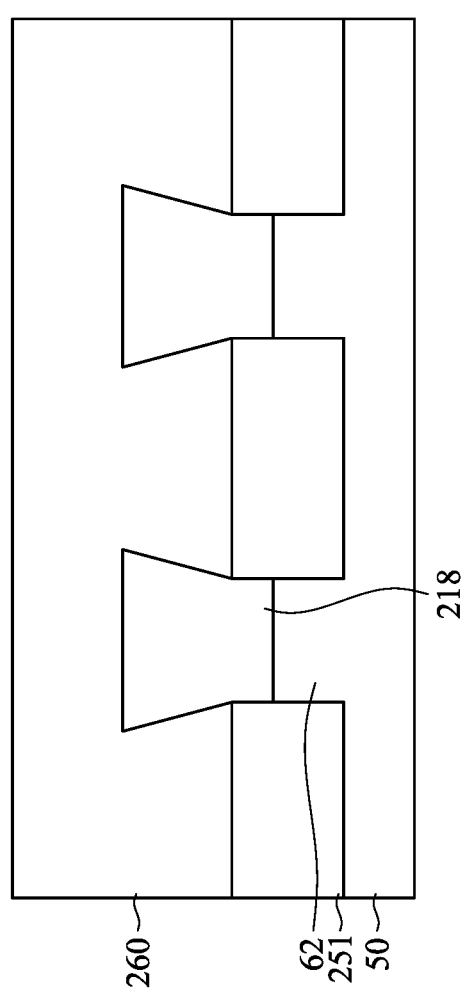

Reference is made to FIGS. 14A, 14B, and 14C. The masks 76 (if present) and the dummy gates 74 are removed in an etching process, so that recesses 106 are formed. Portions of the dummy dielectrics 72 in the recesses 106 are also removed. In some embodiments, the dummy gates 74 are removed by an anisotropic dry etch process. For example, the etching process may include a dry etch process using reaction gas(es) that selectively etch the dummy gates 74 at a faster rate than the ILD layer 260 or the gate spacers 233. During the removal, the dummy dielectrics 72 may be used as etch stop layers when the dummy gates 74 are etched. The dummy dielectrics 72 are then removed. Each recess 106 exposes and/or overlies portions of the channel regions. Portions of the second semiconductor sheets 210 which act as the channel regions are disposed between adjacent pairs of the epitaxial source/drain regions 218.

The remaining portions of the first semiconductor sheets 310 are then removed to expand the recesses 106, such that openings 108 are formed in regions between the second semiconductor sheets 210. The remaining portions of the first semiconductor sheets 310 can be removed by any acceptable etching process that selectively etches the material of the first semiconductor sheets 310 at a faster rate than the material of the second semiconductor sheets 210. The etching may be isotropic. For example, when the first semiconductor sheets 310 are formed of silicon germanium and the second semiconductor sheets 210 are formed of silicon, the etching process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the second semiconductor sheets 210. In some embodiments, the removing of the remaining portions of the first semiconductor sheets 310 can be interchangeably referred to as a channel releasing process. The second semiconductor sheets 210 can be interchangeably referred to as a vertically stacked multiple channels (sheets) and may have a vertically sheet pitch within a range of from about 10 nm to about 30 nm. In some embodiments, the second semiconductor sheets 210 may have a thickness within a range from about 4 nm to about 10 nm. In some embodiments, the vertically sheet pitch of the between adjacent two of the second semiconductor sheets 210 may be within a range from about 6 to about 20 nm.

Figure 15A:
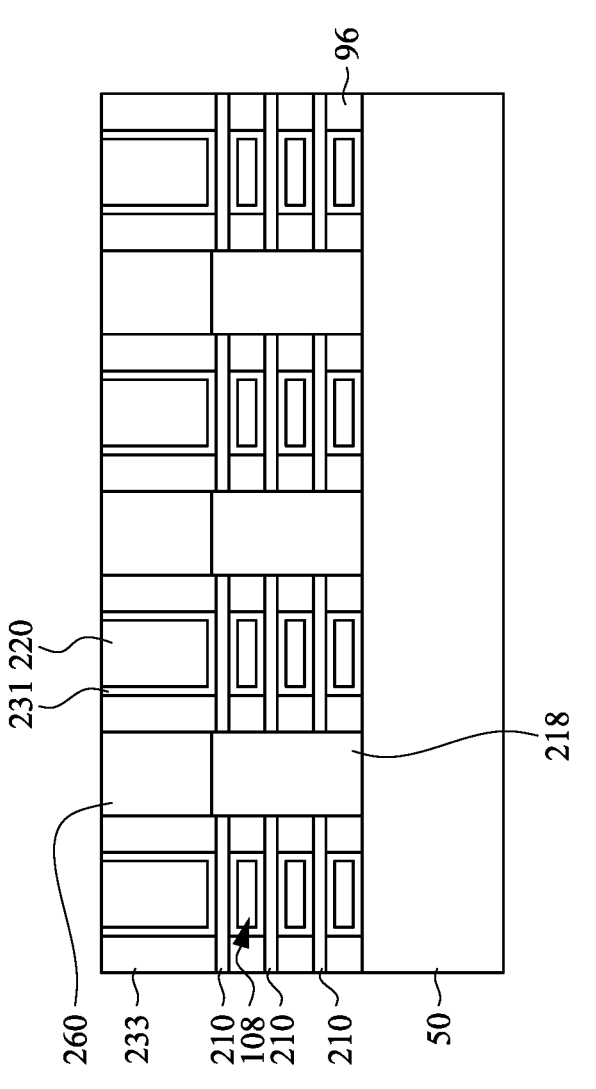
Figure 15B:
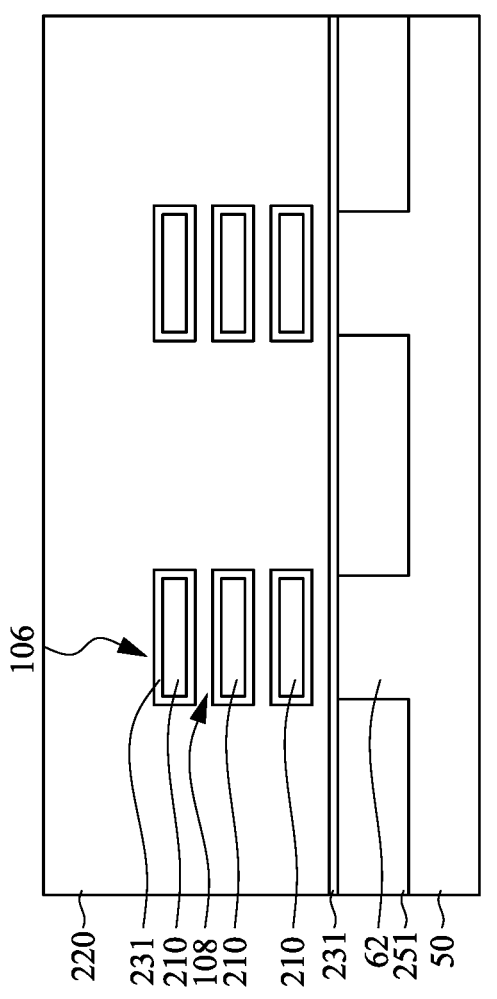
Figure 15C:
Figure 15C:
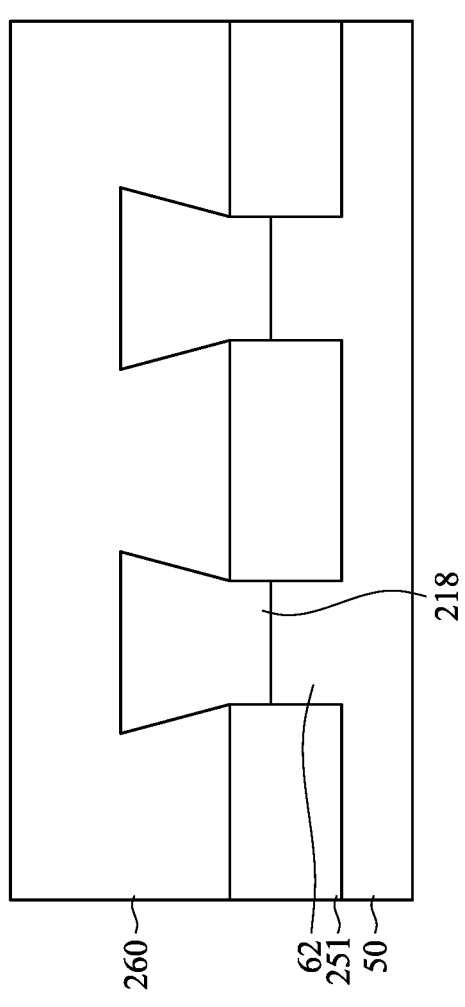

Reference is made to FIGS. 15A, 15B, and 15C. Gate structures are formed to wrap around the second semiconductor sheets 210. A gate dielectric layer 231 is formed in the recesses 106. Gate electrode layers 220 are formed on the gate dielectric layer 231. The gate dielectric layer 231 and the gate electrode layers 220 are layers for replacement gates, and each wrap around all (e.g., four) sides of the second semiconductor sheet 210. In some embodiments, the gate structure can be interchangeably referred to as a gate strip or a gate pattern.

The gate dielectric layer 231 is disposed on the sidewalls and/or the top surfaces of the fins 62; on the top surfaces, the sidewalls, and the bottom surfaces of the second semiconductor sheets 210; and on the sidewalls of the gate spacers 233. The gate dielectric layer 231 may include an oxide such as silicon oxide or a metal oxide, a silicate such as a metal silicate, combinations thereof, multi-layers thereof, or the like. The gate dielectric layer 231 may include a dielectric material having a k-value greater than about 7.0, such as a metal oxide or a silicate of hafnium, aluminum, zirconium, lanthanum, manganese, barium, titanium, lead, and combinations thereof. Although a single-layered gate dielectric layer 231 is illustrated in FIGS. 15A and 15B, as will be subsequently described in greater detail, the gate dielectric layer 231 may include any number of interfacial layers and any number of main layers.

The gate electrode layers 220 may include a metal-containing material such as titanium nitride, titanium oxide, tungsten, cobalt, ruthenium, aluminum, combinations thereof, multi-layers thereof, or the like. Although a single-layered gate electrode layer 220 is illustrated in FIGS. 15A and 15B, as will be subsequently described in greater detail, the gate electrode layer 220 may include any number of work function tuning layers, any number of barrier layers, any number of glue layers, and a fill material. In some embodiments, the gate electrode layers 220 may be made of a material selected from a group including TiN, TaN, TiAl, TiAlN, TaAl, TaAlN, TaAlC, TaCN, WNC, Co, Ni, Pt, W, or combinations thereof.

Subsequently, a removal process is performed to remove the excess portions of the materials of the gate dielectric layer 231 and the gate electrode layers 220, which excess portions are over the top surfaces of the ILD layer 260 and the gate spacers 233, thereby forming gate dielectric layer 231 and gate electrode layers 220. In some embodiments, a planarization process such as a chemical mechanical polish (CMP), an etch-back process, combinations thereof, or the like may be utilized. The gate dielectric layer 231, when planarized, has portions left in the recesses 106 (thus forming the gate dielectric layer 231). The gate electrode layers 220, when planarized, have portions left in the recesses 106 (thus forming the gate electrode layers 220). The top surfaces of the gate spacers 233; the CESL (not shown); the ILD layer 260; the gate dielectric layer 231, and the gate electrodes are coplanar (within process variations). The gate dielectric layer 231 and the gate electrode layers 220 form replacement gates of the resulting nano-FETs. Each respective pair of a gate dielectric layer 231 and a gate electrode layer 220 may be collectively referred to as a "gate structure." The gate structures each extend along top surfaces, sidewalls, and bottom surfaces of a channel region of the second semiconductor sheet 210. In some embodiments, the gate electrode layers 220 each have a gate length in a range from about 6 nm to about 20 nm.

Figure 16A:
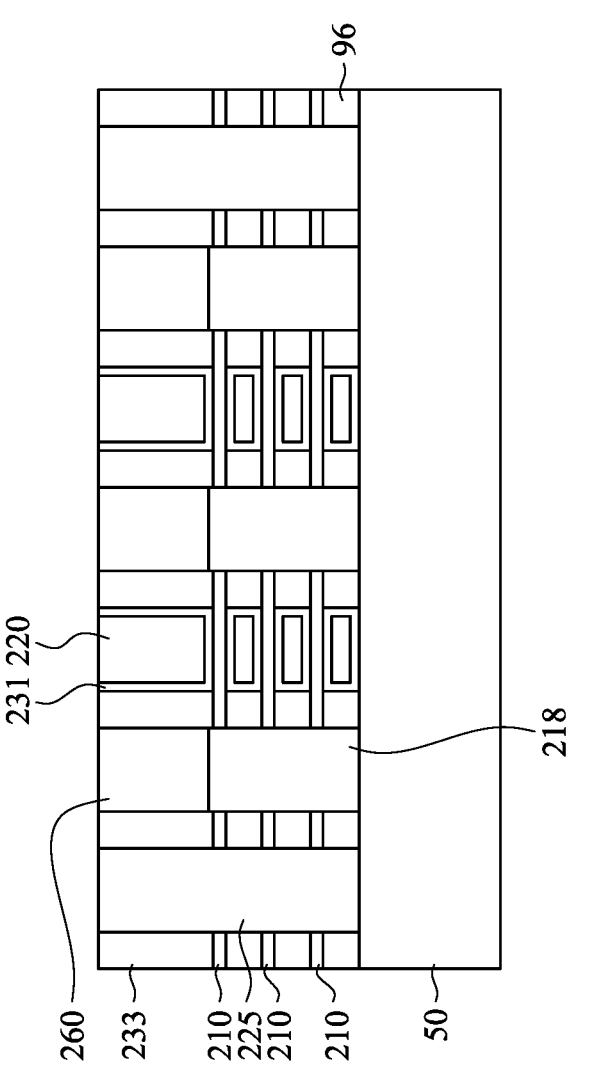
Figure 16B:
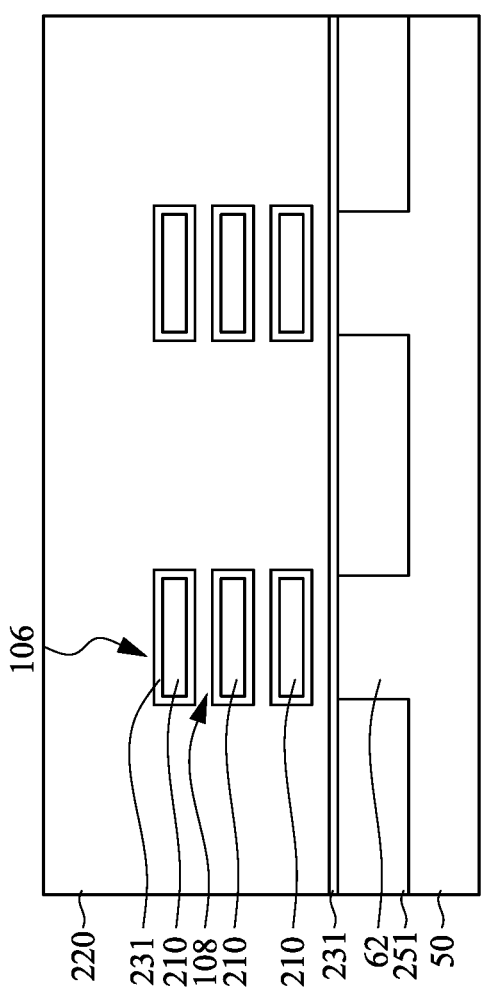
Figure 16C:
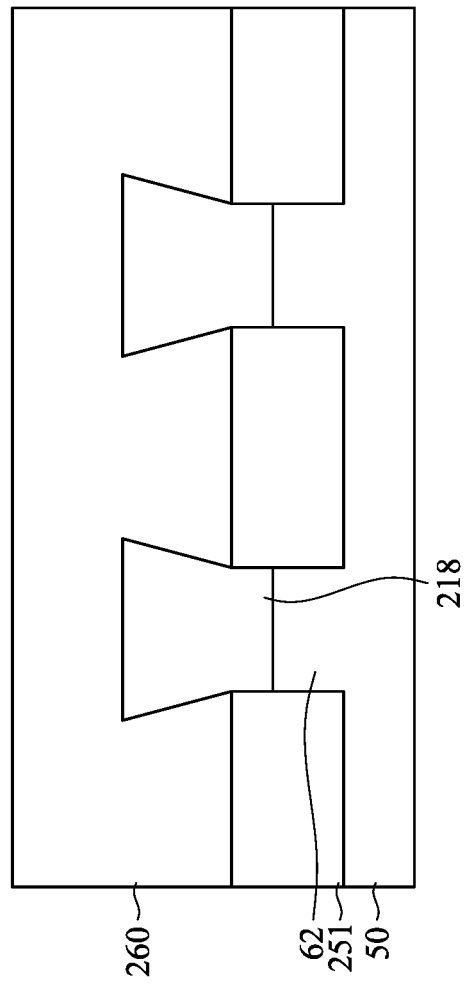

Reference is made to FIGS. 16A, 16B, and 16C. The gate electrode layers 220 and the gate dielectric layer 231 warping the gate electrode layers 220 on the boundary of the circuit 110 are removed to form an isolation region separating different semiconductor devices. The isolation region may be formed by using an etching process. In the etching process, the gate electrode layers 220 and the gate dielectric layer 231 warping the gate electrode layers 220 on the boundary of the circuit 110 are etched anisotropically, until the underlying fins 62 are exposed. The etching may be stopped on the STI structures 251. In some embodiments, the fins 62 are then etched, and the etching continues down into the underlying substrate 50.

Subsequently, a dielectric material is filled in the isolation region (i.e., spaces originally occupied by the gate electrode layers 220 and the gate dielectric layer 231 warping the gate electrode layers 220 on the boundary of the circuit 110) to form dielectric-base gates 225. As shown in FIGS. 3A and 3B, the dielectric-base gates 225 extend in the Y-direction and being dummy gates. The gate electrodes 220 are arranged between the dielectric-base dummy gates 225. The material of the dielectric-base dummy gates 225 is different from that of the gate electrodes 220. In some embodiments, the dielectric-base gates 225 are made of silicon oxide ($SiO_x$), silicon nitride ($Si_xN_y$), silicon oxynitride (SiON), dielectric material(s), other suitable material, or a combination thereof. In some embodiments, the dielectric-base gates 225 are formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 17A:
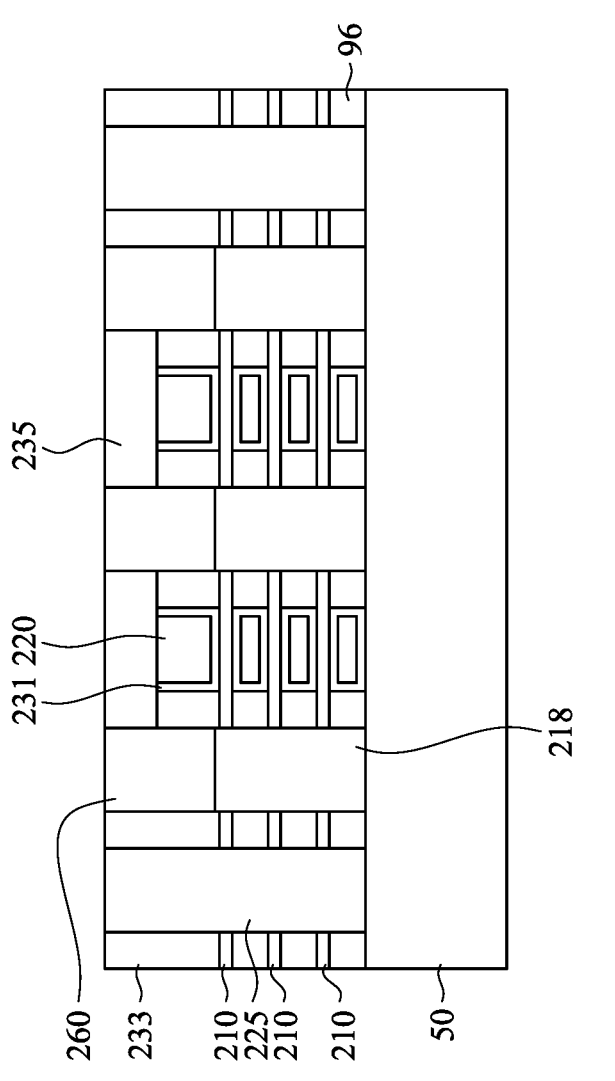
Figure 17B:
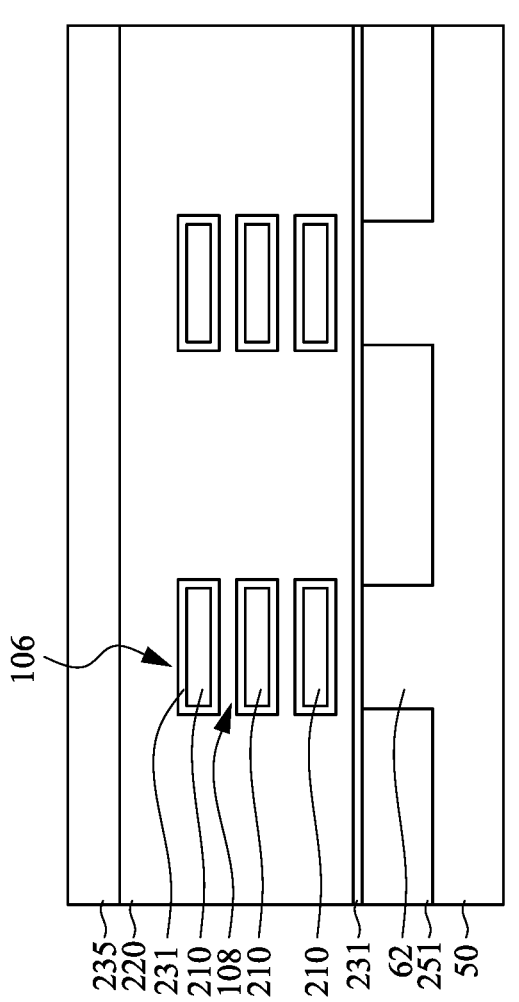
Figure 17C:
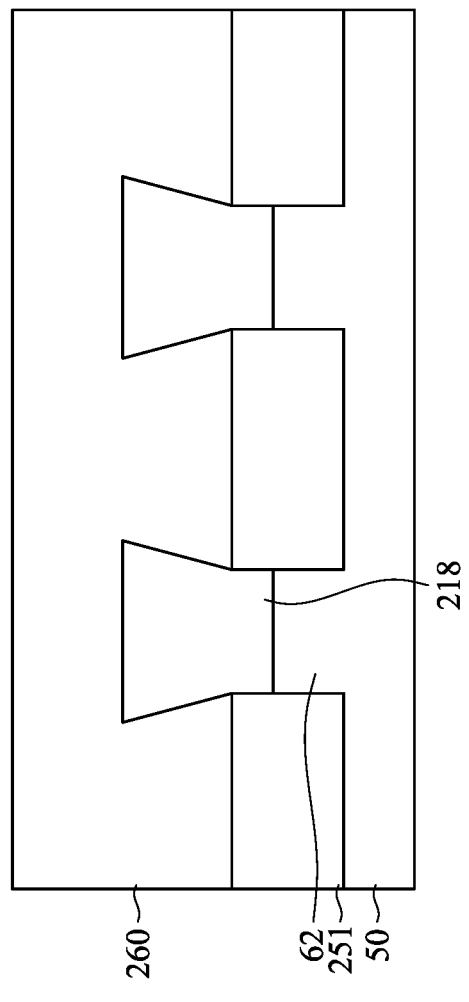

Reference is made to FIGS. 17A, 17B, and 17C. An etch back process is performed on the gate electrode layers 220 to scale down the gate electrode layers 220. The etch back process may include a bias plasma etching step. The bias plasma etching step may be performed to remove portions of the gate electrode layers 220. Portions of the gate trenches may reappear with shallower depth. Top surfaces of the gate electrode layers 220 may be no longer level with the ILD layer 260. Sidewalls of the gate spacers 233 are then exposed from the gate electrode layers 220. In some embodiments, the bias plasma etching step may use a gas mixture of $Cl_2$, $O_2$, $BCl_3$, and Ar with a bias in a range from about 25V to about 1200V. Subsequently, a hard mask layer 235 is formed over the gate electrode layers 220 using, for example, a deposition process to deposit a dielectric material over the substrate 50, followed by a CMP process to remove excess dielectric material above the spacers 233 and the ILD layer 260. In some embodiments, source/drain contacts 240a formed subsequently are formed by a self-aligned contact process using the hard mask layer 235 as a contact etch protection layer. In some embodiments, the hard mask layer 235 may have a thickness in a range from about 2 nm to about 60 nm.

In some embodiments, the hard mask layer 235 may be made of a nitride-based material, such as $Si_3N_4$, SiON, or a carbon-based material, such as SiC, SiOC, SiOCN, or combinations thereof. In some embodiments, the hard mask layer 235 may include $SiO_x$, SiBN, SiCBN, other suitable dielectric materials, or combinations thereof. In some embodiments, the hard mask layer 235 may include a metal oxide, such as be hafnium oxide ($HO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. The hard mask layer 235 has different etch selectivity than the spacers 233 and/or the ILD layer 260, so as to selective etch back the hard mask layer 235. By way of example, if the hard mask layer 235 is made of silicon nitride, the spacers 233 and/or the ILD layer 260 may be made of a dielectric material different from silicon nitride. If the hard mask layer 235 is made of silicon carbide (SiC), the spacers 233 and/or the ILD layer 260 may be made of a dielectric material different from silicon carbide. Therefore, the hard mask layer 235 can be used to define self-aligned gate contact region and thus referred to as a self-aligned contact (SAC) structure or a SAC layer.

Figure 18A:
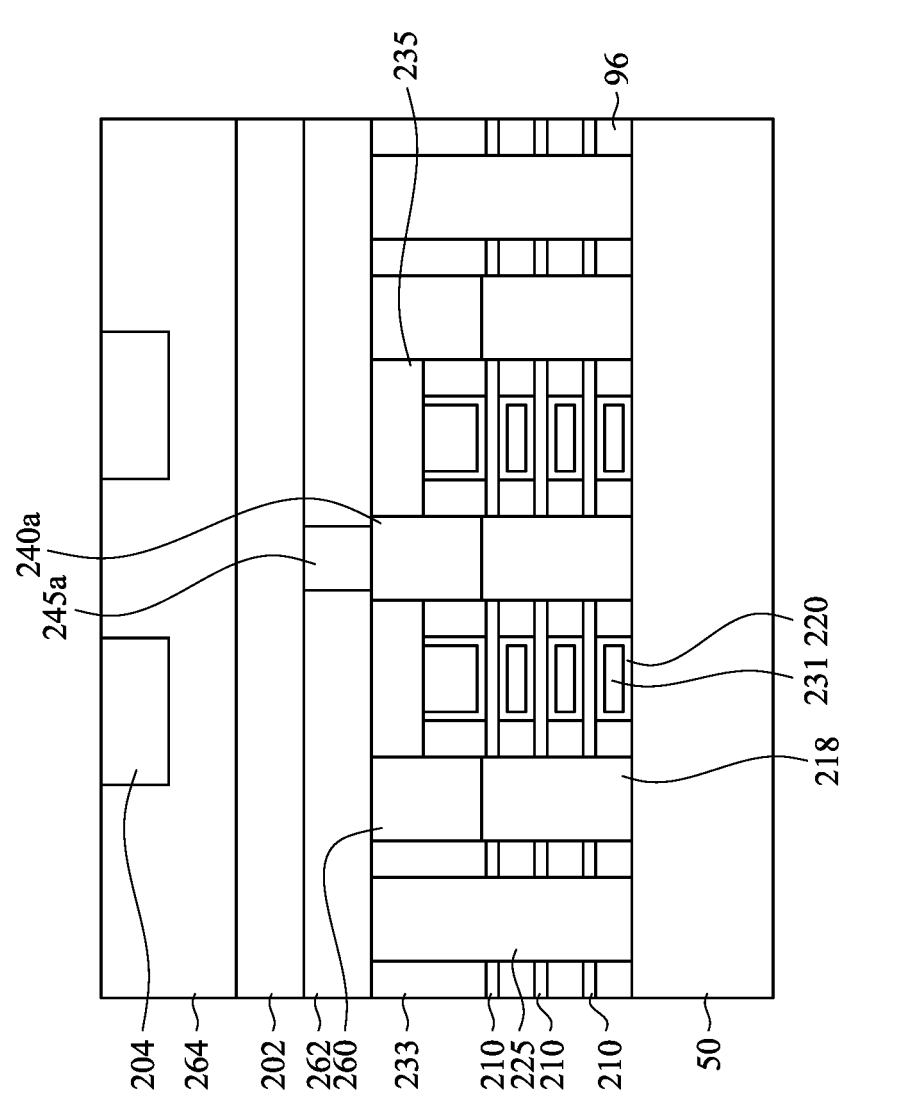
Figure 18B:
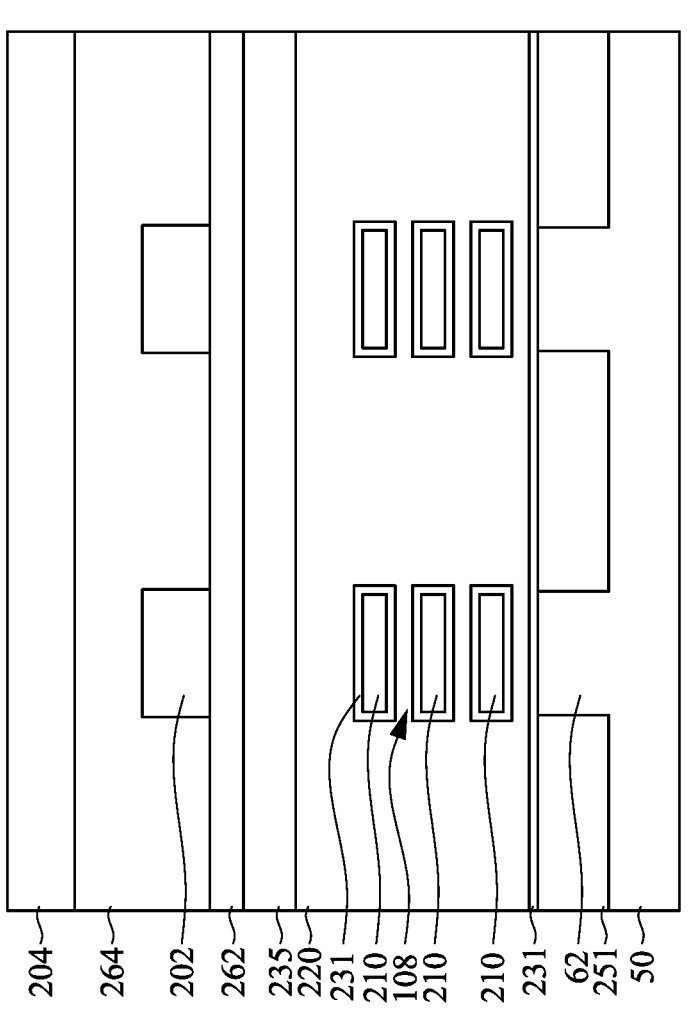
Figure 18C:
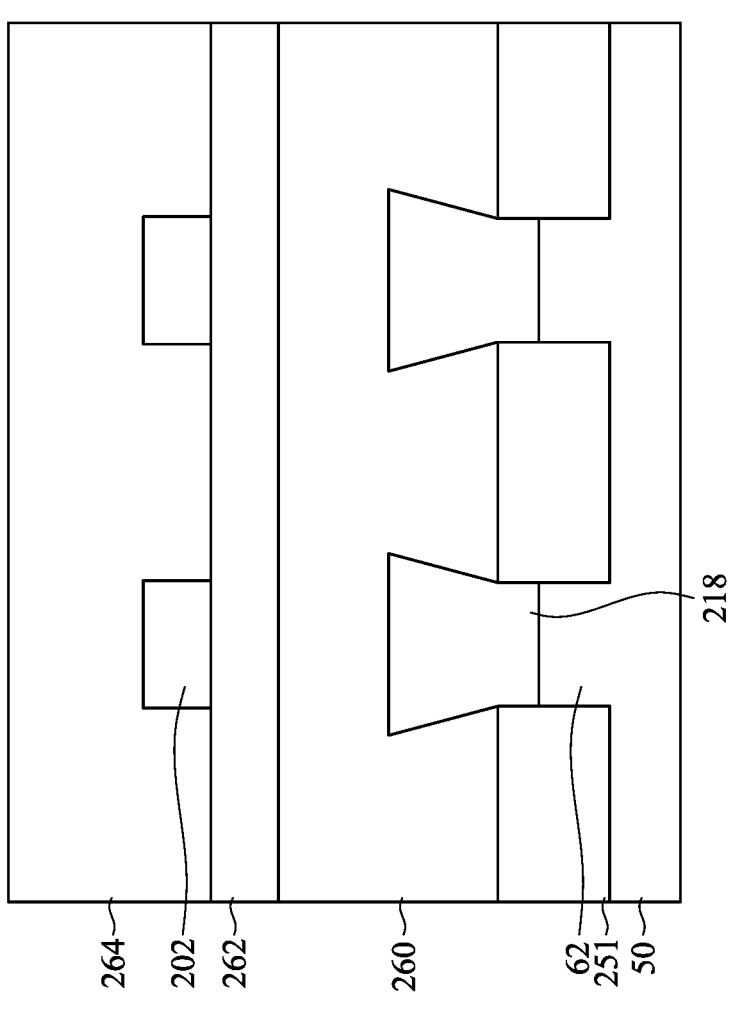

Reference is made to FIGS. 18A, 18B, and 18C. Source/drain contacts 240a are formed in the ILD layer 260 and on the source/drain regions 218, respectively. In some embodiments, the source/drain silicide regions 270 are formed between the source/drain contacts 240a and the source/drain regions 218. In some embodiments, the source/drain vias 245a are formed in an ILD layer 262 to land on the source/drain contacts 240a. The source/drain contacts 240a and the source/drain via 245a may include a metal-containing material such as titanium nitride, titanium oxide, tungsten, cobalt, ruthenium, aluminum, copper, combinations thereof, multi-layers thereof, or the like. The ILD layer 262 may be made of an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof.

Subsequently, a front-side interconnect structure is formed over the front-side source/drain vias. The interconnect structure includes a plurality of metallization layers with a plurality of metallization vias or interconnects. Other embodiments may contain more or fewer metallization layers and corresponding more or fewer number of vias. The metal line illustrated here just for an example, and the metal line may be otherwise oriented (rotated 90 degrees or at other orientations). The front-side interconnect structure may include conductive lines 202 in a first metallization layer that is in the IMD layer 264. The conductive lines 202 overlap and are electrically connected to the source/drain contacts 240a through the source/drain vias 245a. The front-side interconnect structure further includes conductive vias (not shown). In some embodiments, the conductive vias are connected between the first metallization layer and a second metallization layer over the first metallization layer. The front-side interconnect structure may further include conductive lines 204 in a second metallization that is in the IMD layer 264. The conductive lines 204 overlap and are electrically connected to the underlying conductive lines 202 through the conductive vias. In some embodiments, materials of the conductive lines 202 and 204 and conductive vias (not shown) may include Cu, Co, Ru, Pt, Al, W, Ti, TaN, TiN, or any combinations thereof.

Figure 19A:
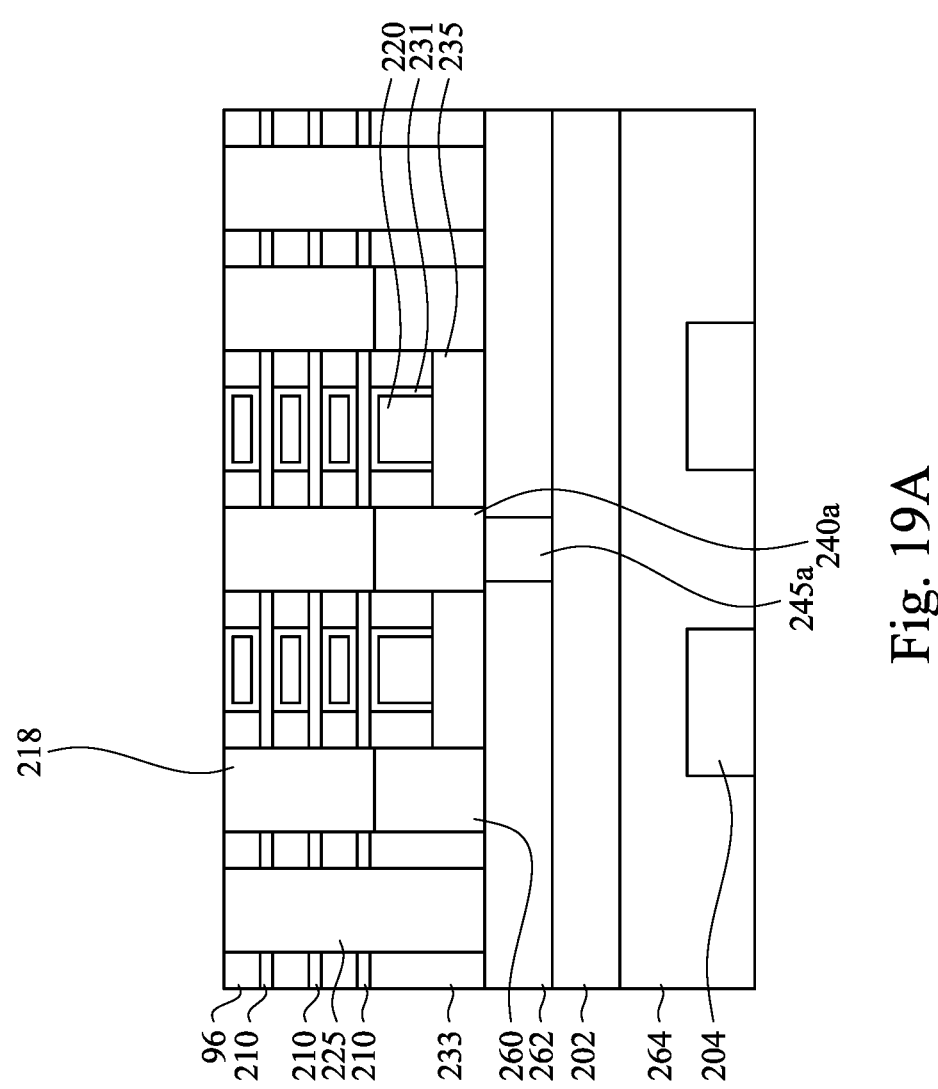
Figure 19B:
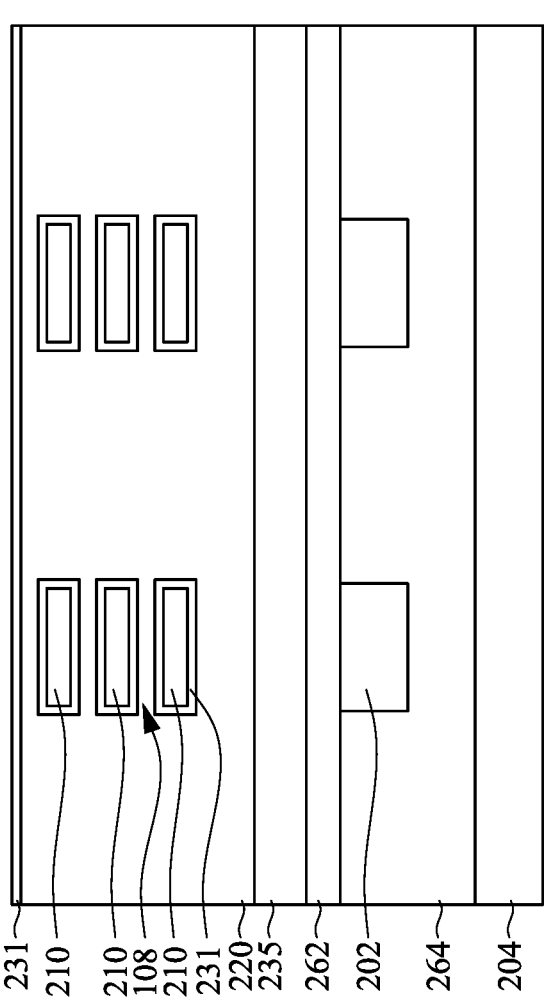
Figure 19C:
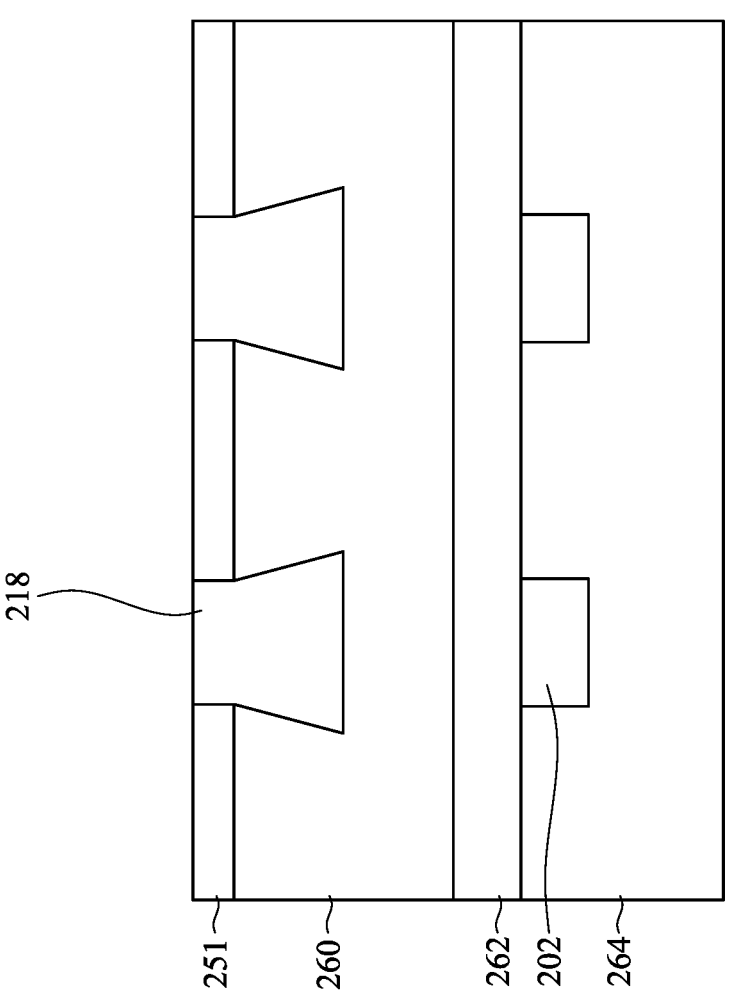

Reference is made to FIGS. 19A, 19B, and 19C. The structures of FIGS. 18A-18C are "flipped" upside down, and the substrate 50, the fins 62, and a portion of the STI structure 251 are removed. The substrate 50 and the portion of the STI structure 251 may be removed in a plurality of process operations, for example, CMP, HNA, and/or TMAH etching, which stops at the source/drain regions 218. After the removal process, the STI structures 251 (see FIG. 19C), the source/drain regions 218 (see FIGS. 19A and 19B), the inner spacers 96 (see FIG. 19A), the gate dielectric layer 231, and/or the dielectric-base gates 225 are exposed as shown in FIGS. 19A, 19B, and 19C.

Figure 20A:
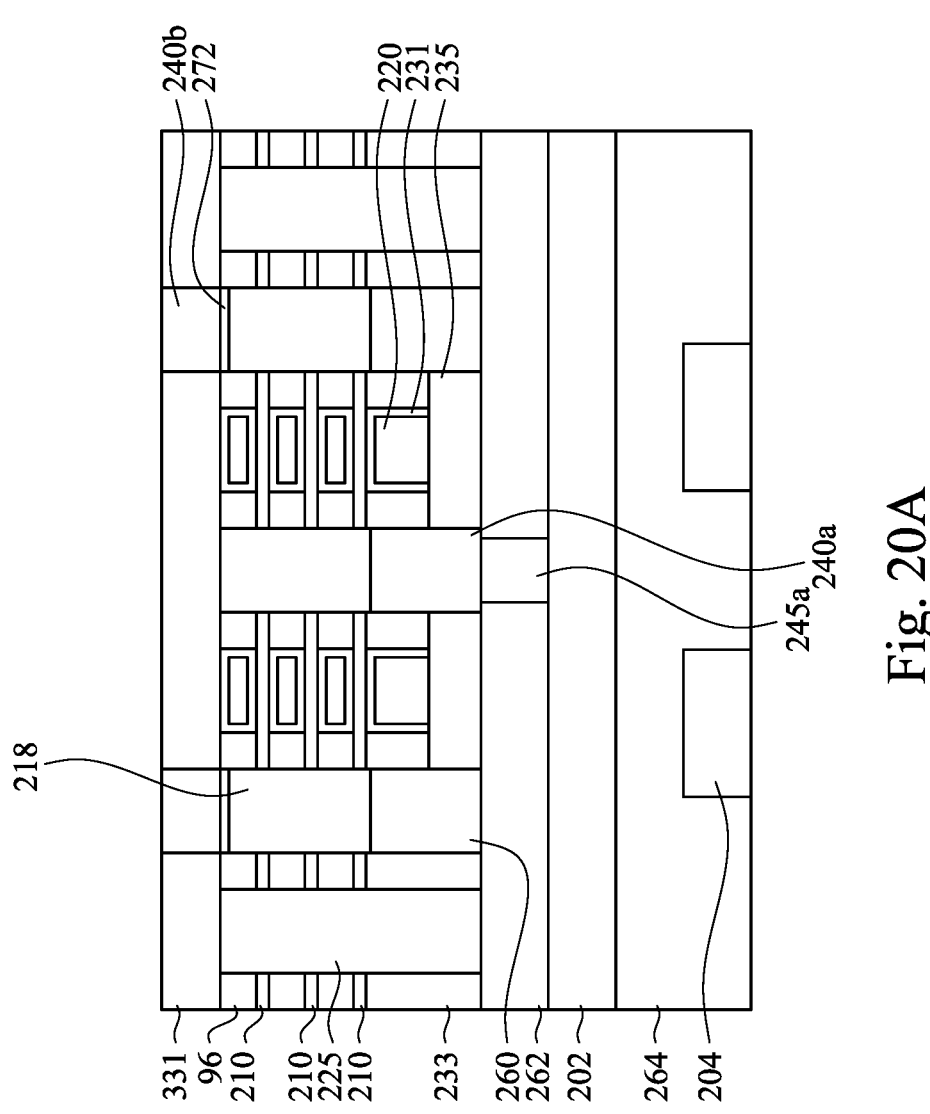
Figure 20B:
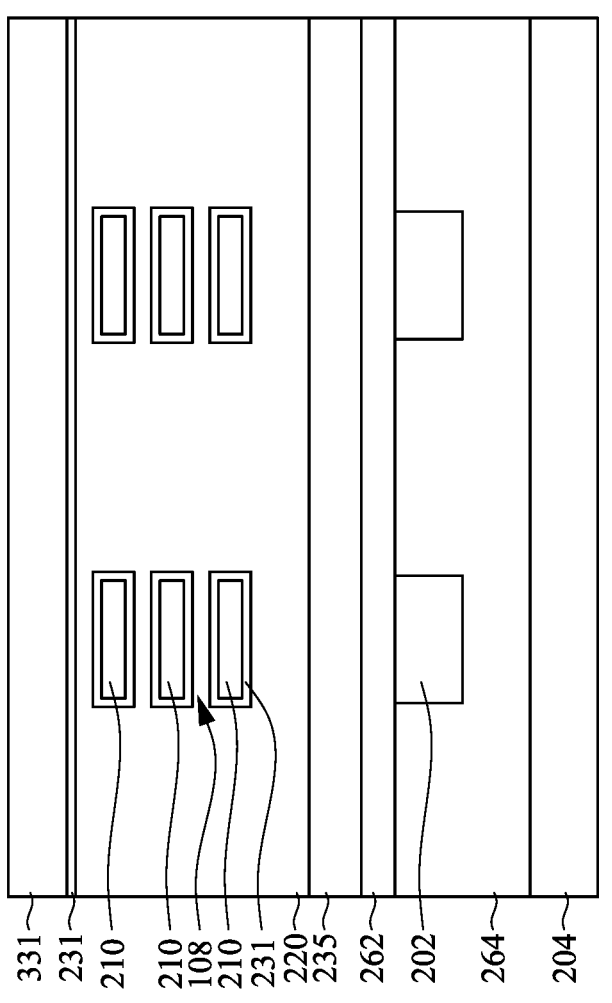
Figure 20C:
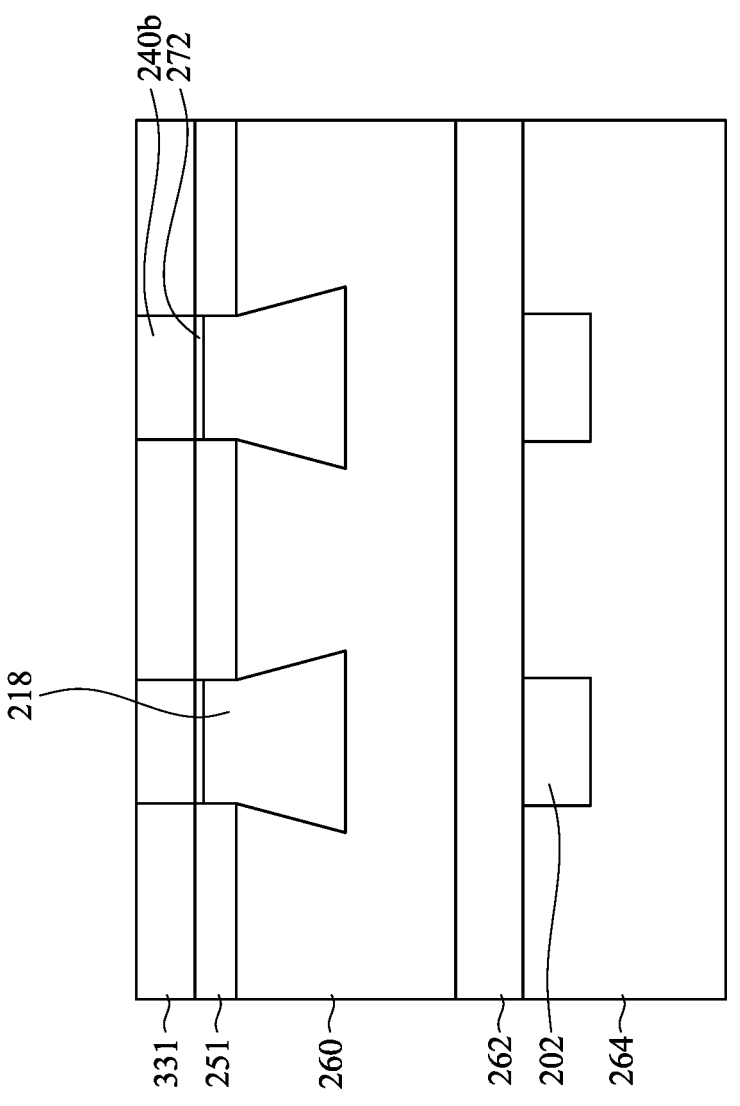

Reference is made to FIGS. 20A, 20B, and 20C. A back-side dielectric 331 is formed over the STI structures 251, the source/drain regions 218, the inner spacers 96, the gate dielectric layer 231, and/or the dielectric-base gates

225. Subsequently, back-side contacts 240b are formed in the back-side dielectric 331 and on the source/drain regions 218. In some embodiments, the source/drain silicide regions 272 are formed between the back-side contacts 240b and the source/drain regions 218. In some embodiments, the back-side contacts 240b can be interchangeably referred to as back-side source/drain contacts 240b. The back-side contacts 240b may be made of a metal-containing material such as titanium nitride, titanium oxide, tungsten, cobalt, ruthenium, aluminum, copper, combinations thereof, multi-layers thereof, or the like. The back-side dielectric 331 may be made of an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof.

Figure 21A:
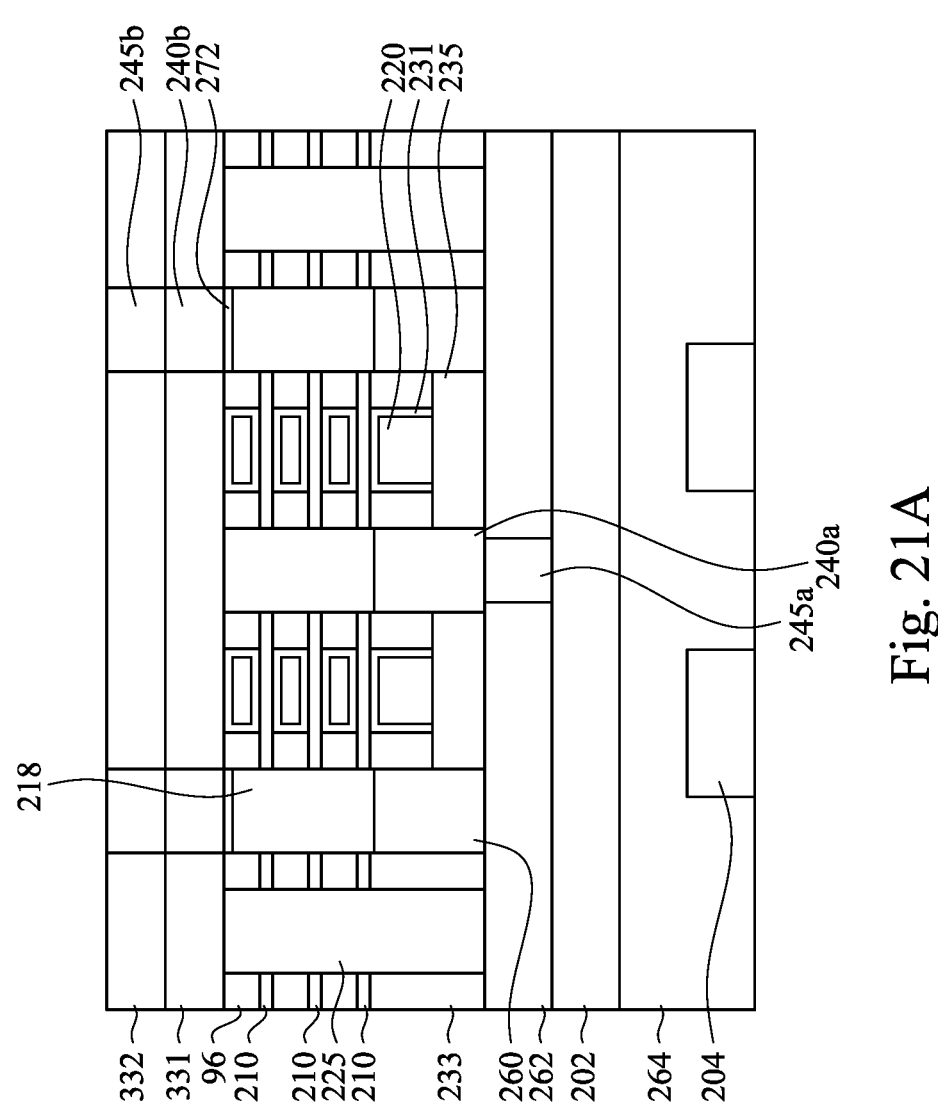
Figure 21B:
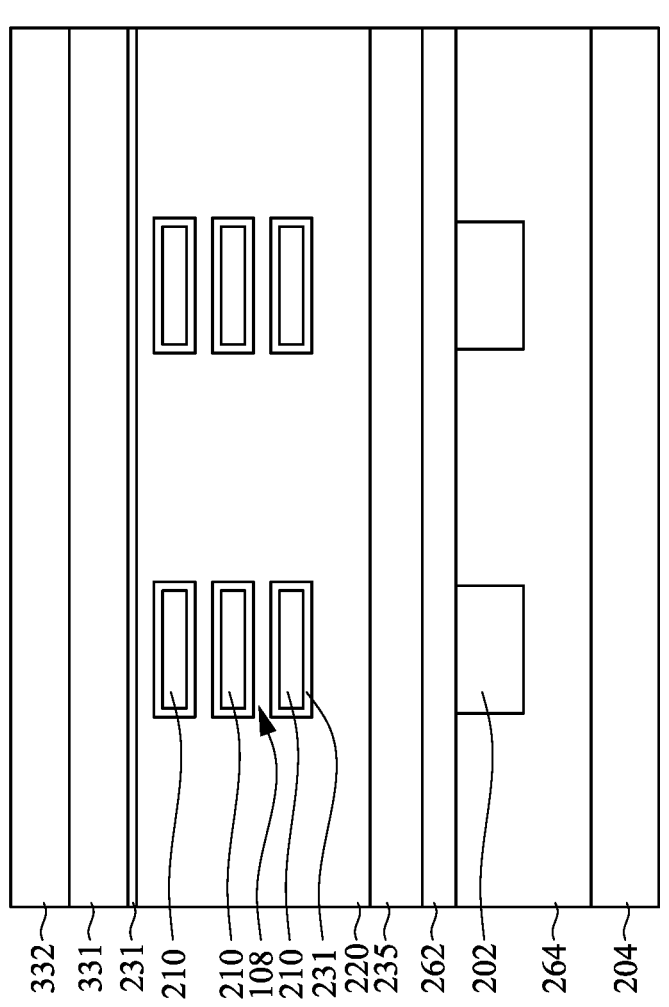
Figure 21C:
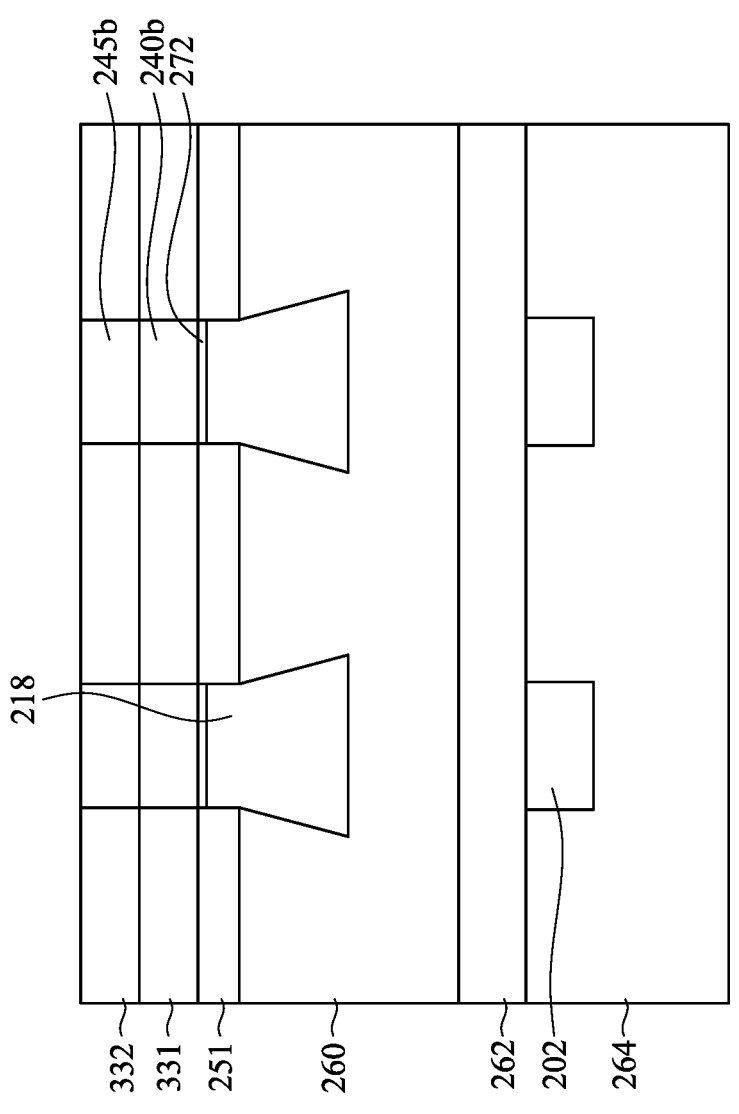

Reference is made to FIGS. 21A, 21B, and 21C. A back-side dielectric layer 332 is formed over the back-side dielectric 331. Subsequently, back-side vias 245b are formed in the back-side dielectric layer 332 and on the back-side contacts 240b. In some embodiments, the back-side via 245b can be interchangeably referred to as back-side source/drain via 245b. The back-side vias 245b may be made of a metal-containing material such as titanium nitride, titanium oxide, tungsten, cobalt, ruthenium, aluminum, copper, combinations thereof, multi-layers thereof, or the like. The back-side dielectric layer 332 may be made of an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof.

Figure 22A:
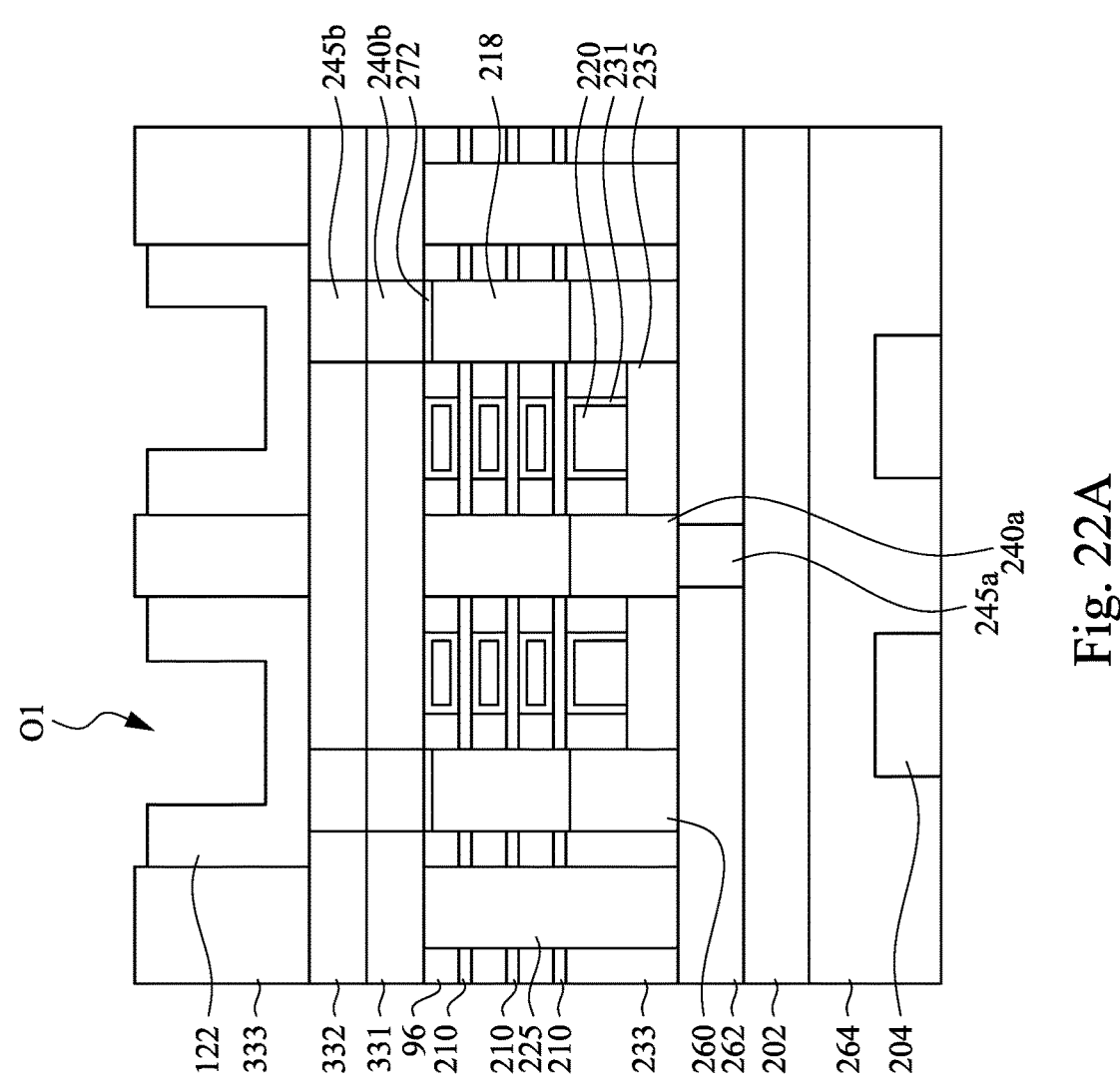
Figure 22B:
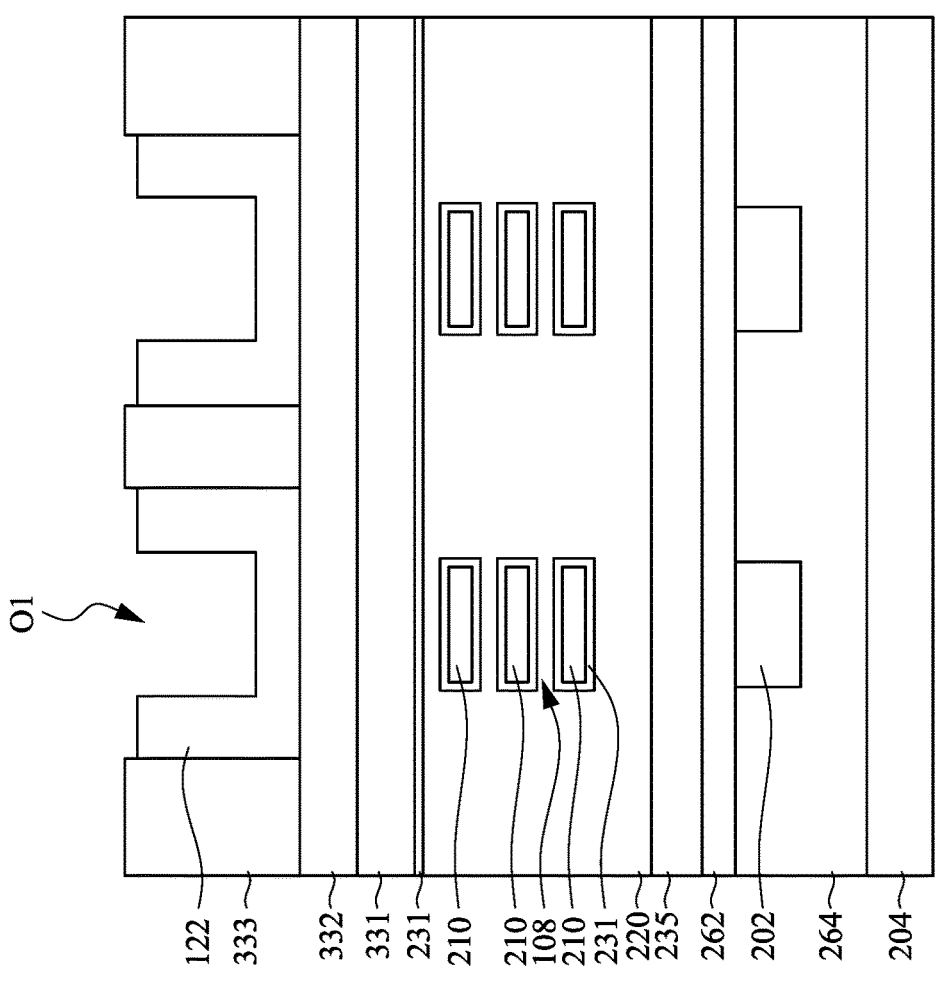
Figure 22C:
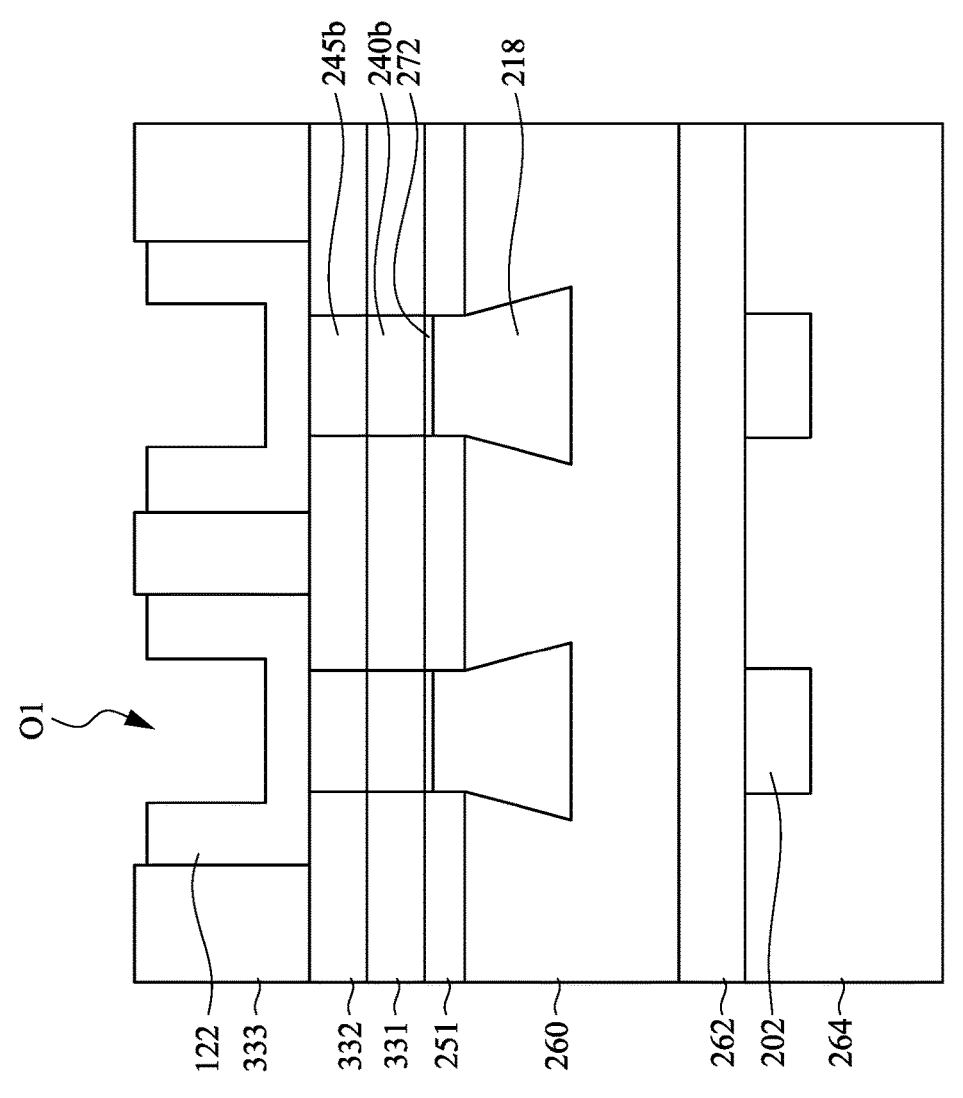

Reference is made to FIGS. 22A, 22B, and 22C. A back-side IMD layer 333 is formed over the back-side dielectric layer 332. One or more etching processes are performed on the back-side IMD layer 333 to form an opening O1 exposing the back-side vias 245b. Subsequently, a bottom electrode layer 122 is conformally formed over the back-side IMD layer 333. Specifically, the bottom electrode layer 122 lines a sidewall of the opening O1 and exposed surfaces of the back-side via 245b and the back-side dielectric layer 332. A planarization process P1 such as chemical mechanical polish (CMP) is performed to remove the excess bottom electrode layer 122 over the back-side IMD layer 333. In such embodiments, the back-side IMD layer 333 may act as the CMP stop layer in the planarization. In greater detail, the CMP process uses slurry that removes the bottom electrode material at a faster removal rate than it removes the material of IMD layer 333 (e.g., $SiO_x$). Subsequently, an etch back process may be performed on the bottom electrode layer 122 to scale down the bottom electrode layer 122, such that top end surfaces of the bottom electrode layer 122 may be no longer level with the back-side IMD layer 333, and sidewalls of the opening O1 are then exposed from the bottom electrode layer 122. In some embodiments, the etch back process may include a bias plasma etching step to remove portions of the bottom electrode layer 122.

In some embodiments, the bottom electrode layer 122 may be made of a conductive material. By way of example but not limiting the present disclosure, the bottom electrode layer 122 may include, but are not limited to, titanium tungsten (TiW), titanium aluminide (TiAl), aluminium copper (AlCu), titanium aluminium nitride (TiAlN), carbonitride tantalum (TaCN), hafnium (Hf), zirconium (Zr), titanium (Ti), tantalum (Ta), copper (Cu), aluminum (Al), metal carbides (e.g., hafnium carbide (HfC), zirconium carbide (ZrC), titanium carbide (TiC), aluminum carbide (AlC), aluminides, and/or other suitable materials. In alternative embodiments, the bottom electrode layer 122 may include, but are not limited to, titanium nitride (TiN), tantalum nitride (TaN), tungsten nitride (WN), tungsten (W), ruthenium (Ru), palladium (Pd), platinum (Pt), cobalt (Co), nickel (Ni), argentum (Ag), Aurum (Au), conductive metal oxides, and/or other suitable materials. In some embodiments, the bottom electrode layer 122 may be deposited using any suitable method, such as CVD, physical vapor deposition (PVD), ALD, PEALD, PECVD, SACVD, FCVD, spin-on, and/or the like, or a combination thereof.

Figure 23A:
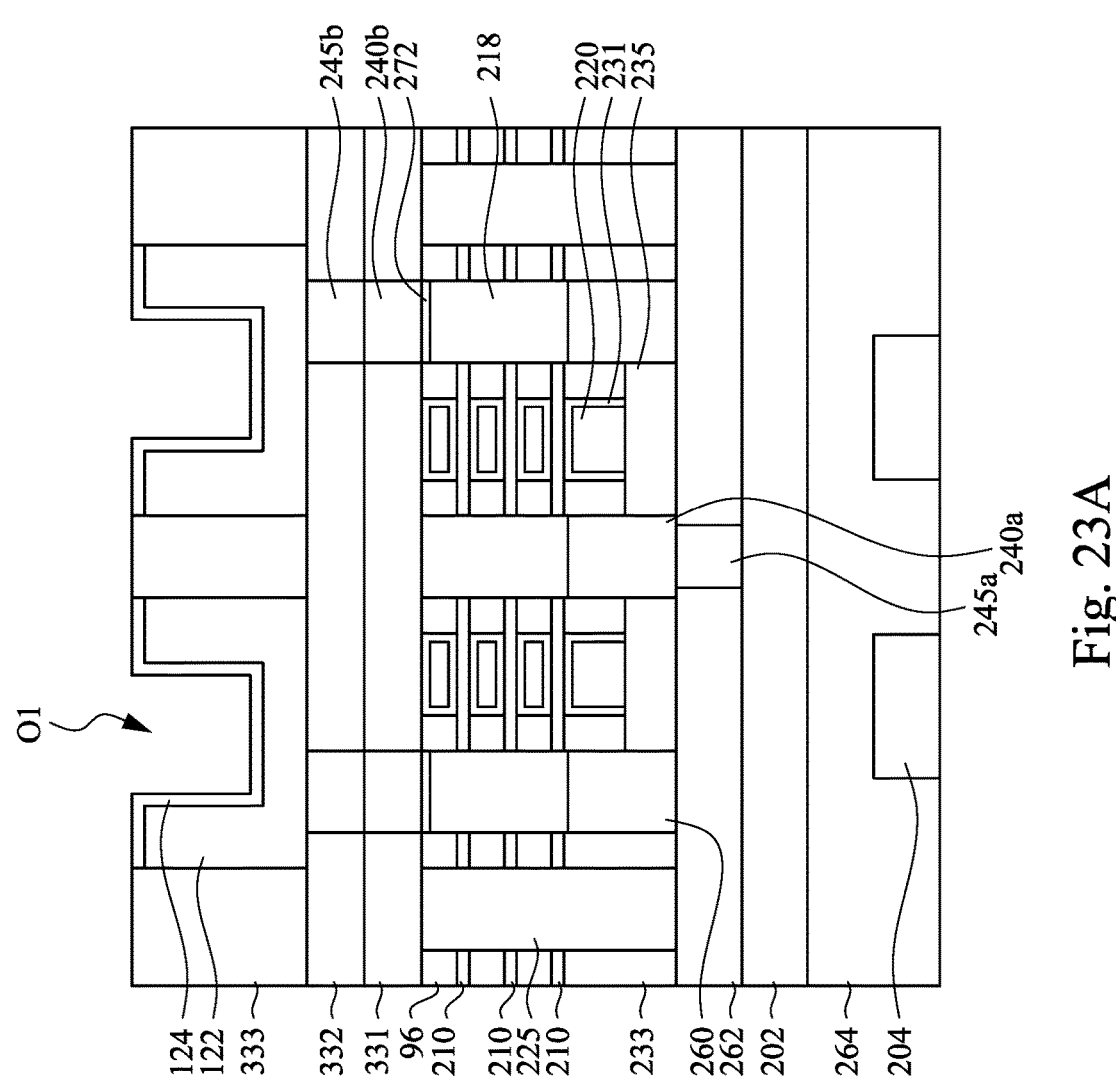
Figure 23B:
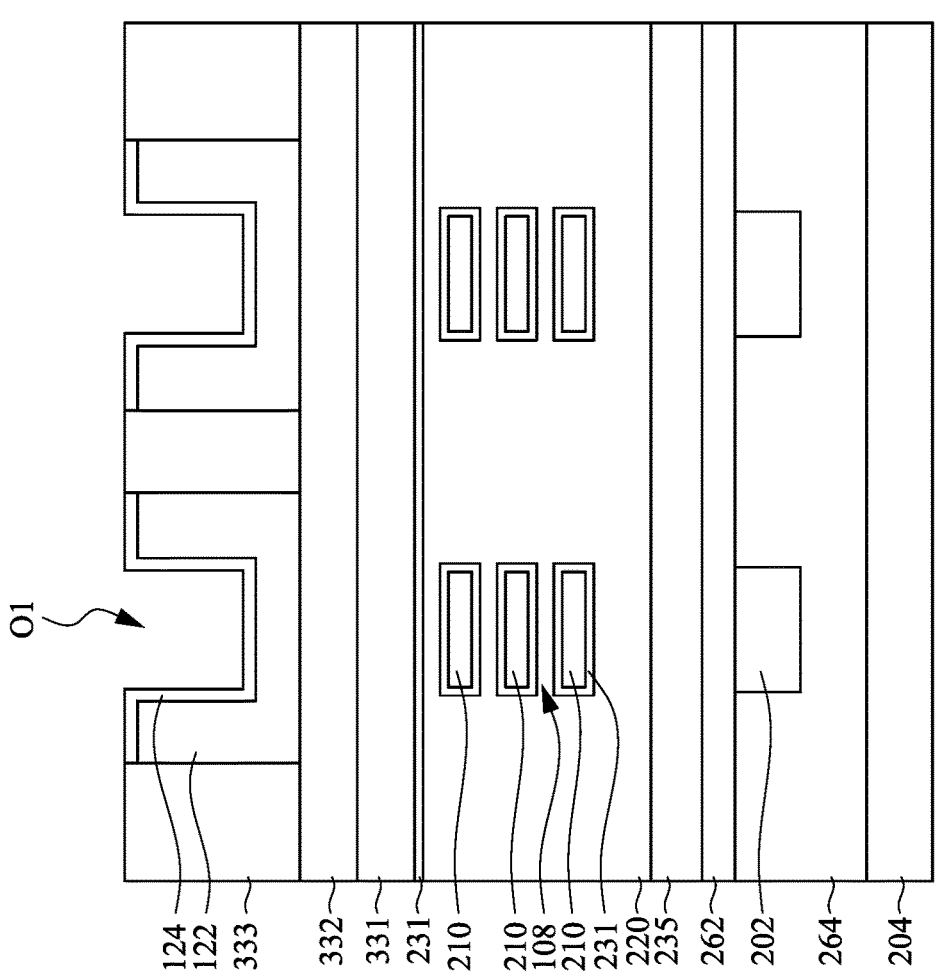
Figure 23C:
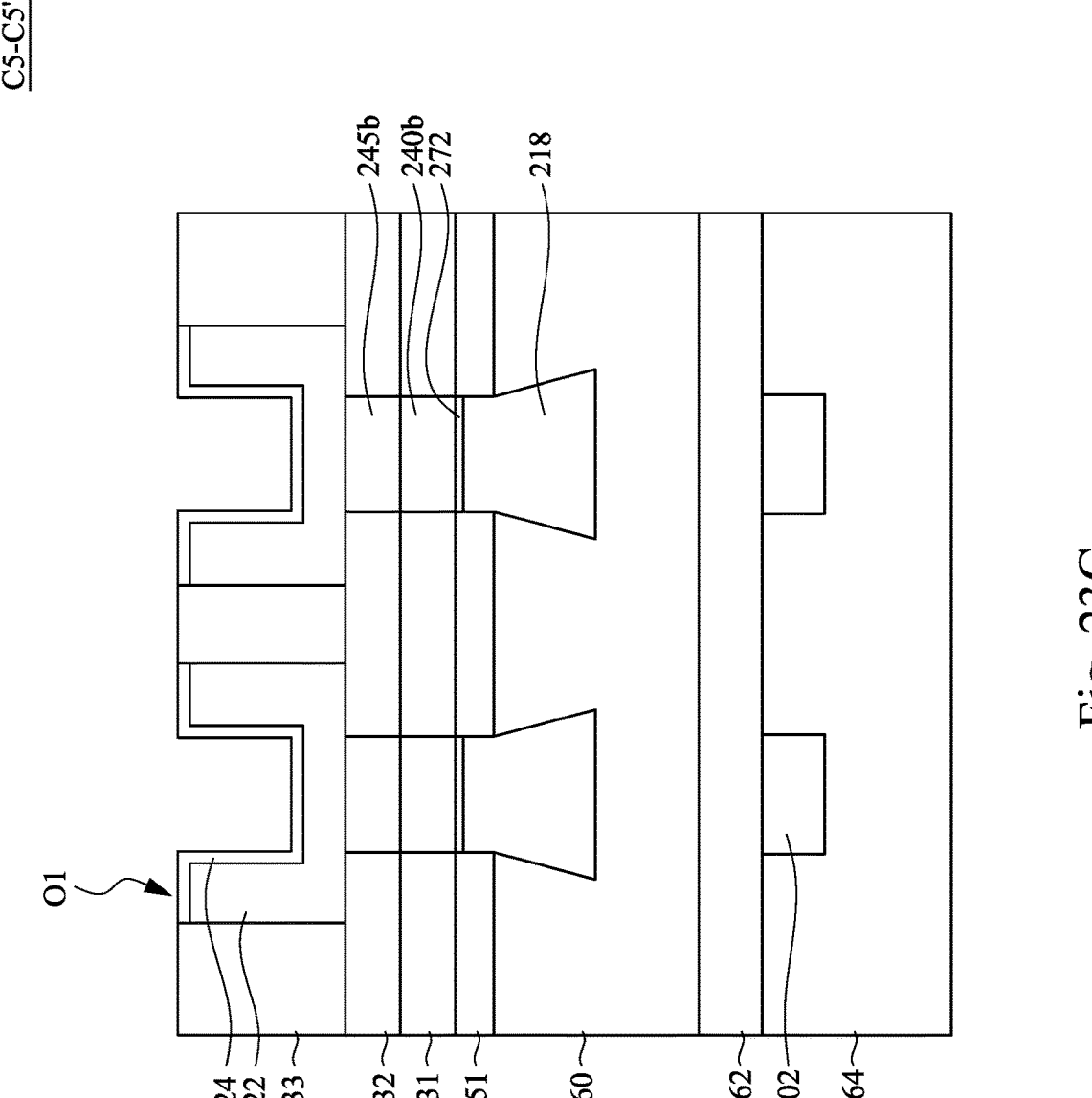

Reference is made to FIGS. 23A, 23B, and 23C. An insulator layer 124 is conformally formed over the back-side IMD layer 333 and the bottom electrode layer 122, and on the top end surfaces of the bottom electrode layer 122. Subsequently, a planarization process P2 such as chemical mechanical polish (CMP) is performed to remove the excess insulator layer 124 over the back-side IMD layer 333. In such embodiments, the back-side IMD layer 333 may act as the CMP stop layer in the planarization. In greater detail, the CMP process uses slurry that removes the bottom electrode material at a faster removal rate than it removes the material of IMD layer 333 (e.g., $SiO_x$).

In some embodiments, the insulator layer 124 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the insulator layer 124 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the insulator layer 124 may include SiCN, $SiO_2$, HZO (a mixture of $HfO_2$ and $ZrO_2$), PZT ($PbZr_{0.52}Ti_{0.48}O_3$), VDF-TrFE (ferroelectric polymer), any suitable materials, or combinations thereof. In alternative embodiments, the insulator layer 124 may have a multilayer structure including, such as a silicon oxide layer (e.g., $SiO_2$ layer), a first high-k material layer (e.g., $HfO_2$ layer), and a second high-k material layer (e.g., $ZrO_2$ layer). In some embodiments, the insulator layer 124 may be deposited using any suitable method, such as CVD, physical vapor deposition (PVD), ALD, PEALD, PECVD, SACVD, FCVD, spin-on, and/or the like, or a combination thereof.

Figure 24A:
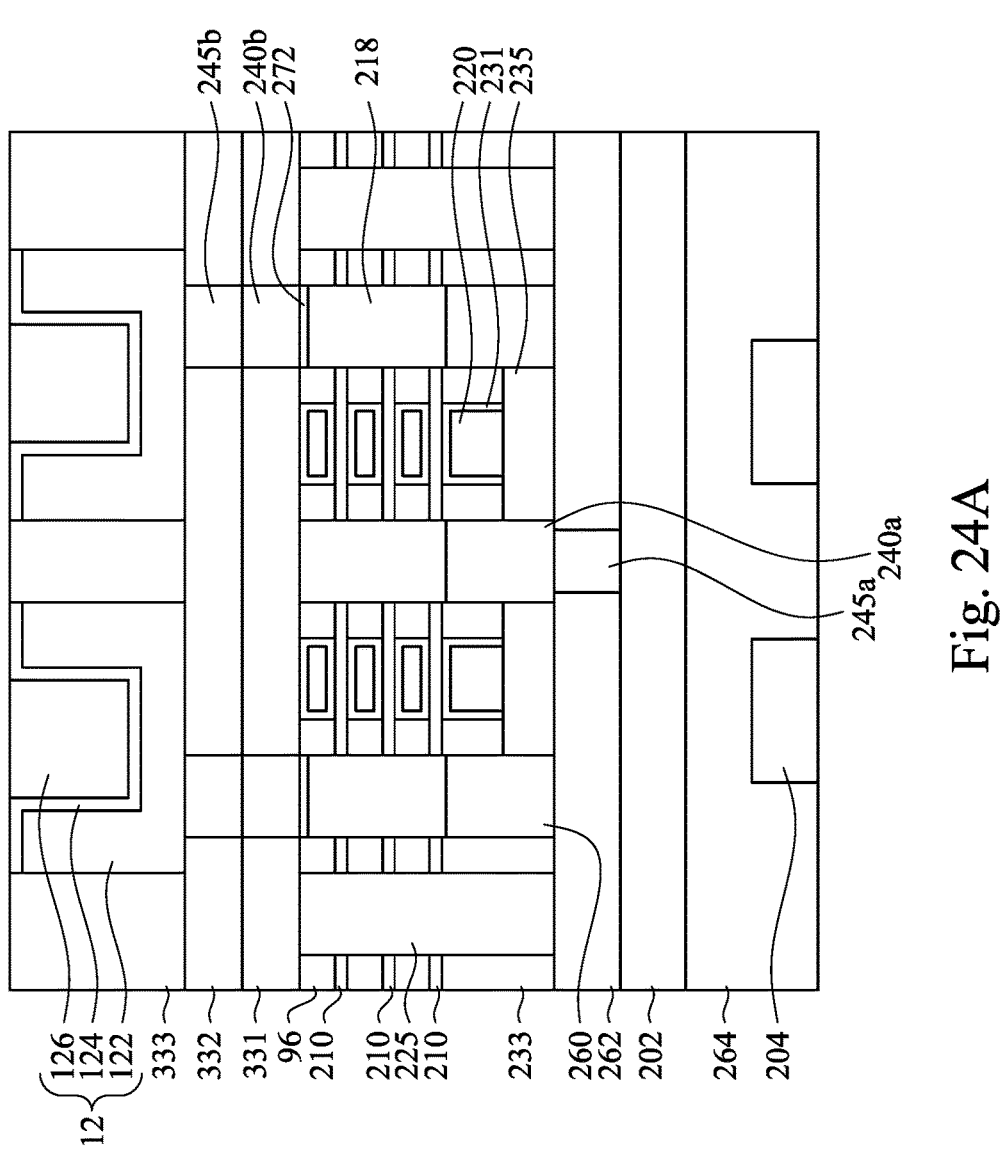
Figure 24B:
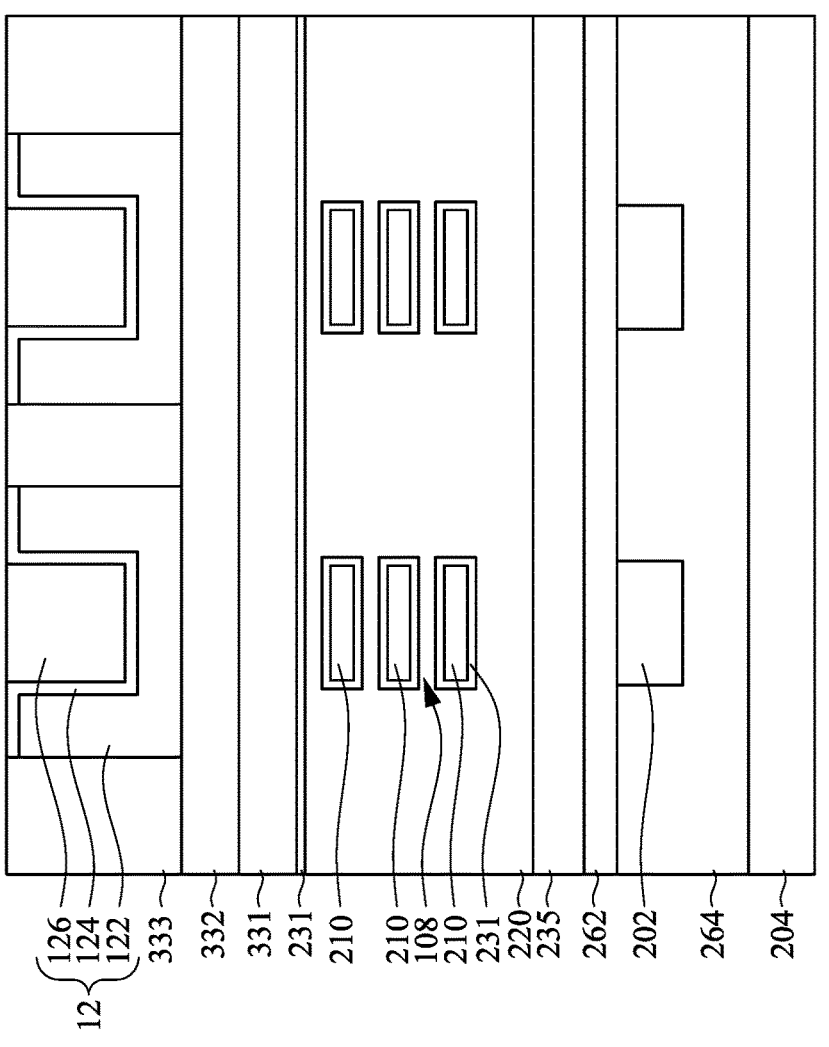
Figure 24C:
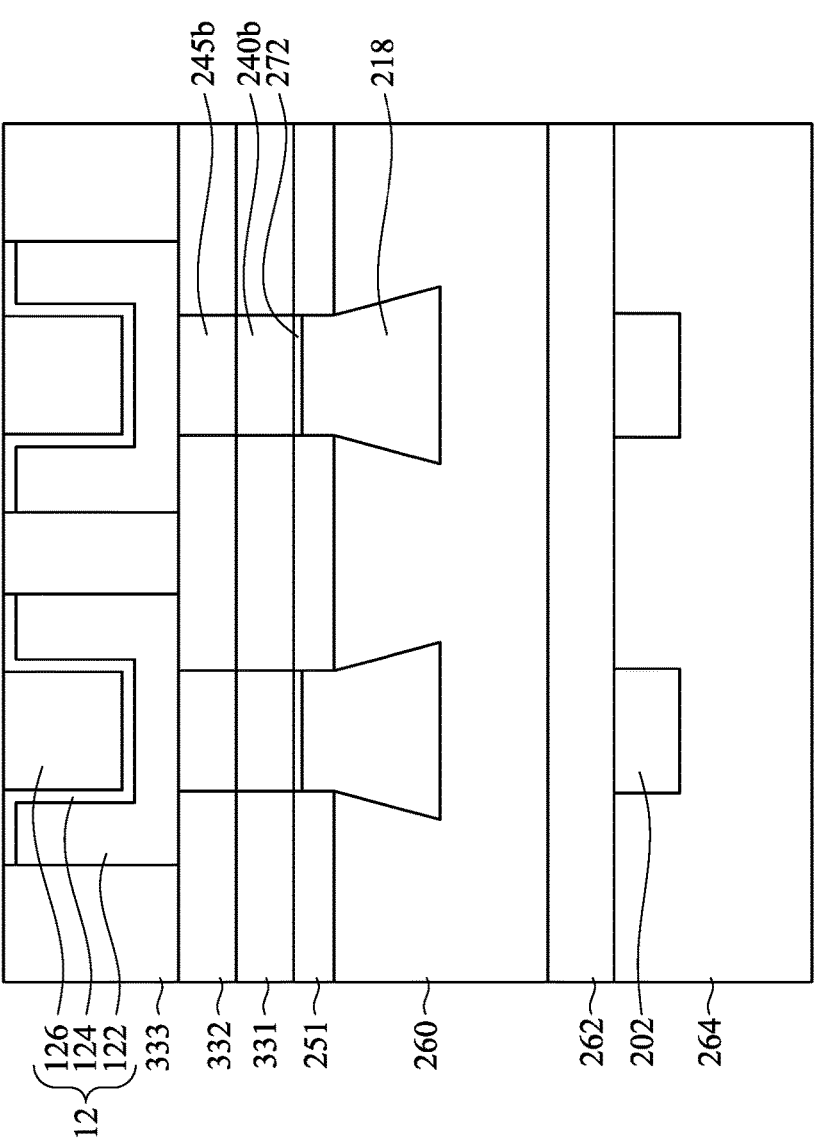

Reference is made to FIGS. 24A, 24B, and 24C. A top electrode layer 126 is deposited over the back-side IMD layer 333. Specifically, the top electrode layer 126 is filled in the opening O1 and over the back-side IMD layer 333. A planarization process P3 such as chemical mechanical polish (CMP) is performed to remove the excess top electrode layer 126 over the back-side IMD layer 333. In such embodiments, the back-side IMD layer 333 may act as the CMP stop layer in the planarization. In greater detail, the CMP process uses slurry that removes the bottom electrode material at a faster removal rate than it removes the material of IMD layer 333 (e.g., $SiO_x$), such that a capacitors 12 is formed.

In some embodiments, the top electrode layer 126 may be made of a conductive material. By way of example but not limiting the present disclosure, the top electrode layer 126 may include, but are not limited to, titanium tungsten (TiW), titanium aluminide (TiAl), aluminium copper (AlCu), titanium aluminium nitride (TiAlN), carbo-nitride tantalum (TaCN), hafnium (Hf), zirconium (Zr), titanium (Ti), tantalum (Ta), copper (Cu), aluminum (Al), metal carbides (e.g., hafnium carbide (HfC), zirconium carbide (ZrC), titanium carbide (TiC), aluminum carbide (AlC), aluminides, and/or other suitable materials. In alternative embodiments, the top electrode layer 126 may include, but are not limited to, titanium nitride (TiN), tantalum nitride (TaN), tungsten nitride (WN), tungsten (W), ruthenium (Ru), palladium (Pd), platinum (Pt), cobalt (Co), nickel (Ni), argentum (Ag), Aurum (Au), conductive metal oxides, and/or other suitable materials. In some embodiments, the top electrode layer 126 may be deposited using any suitable method, such as CVD, physical vapor deposition (PVD), ALD, PEALD, PECVD, SACVD, FCVD, spin-on, and/or the like, or a combination thereof. In some embodiments, the top electrode layer 126 may be made of a same material as the bottom electrode layer 122. In some embodiments, the top electrode layer 126 may be made of a different material than the bottom electrode layer 122.

Figure 25A:
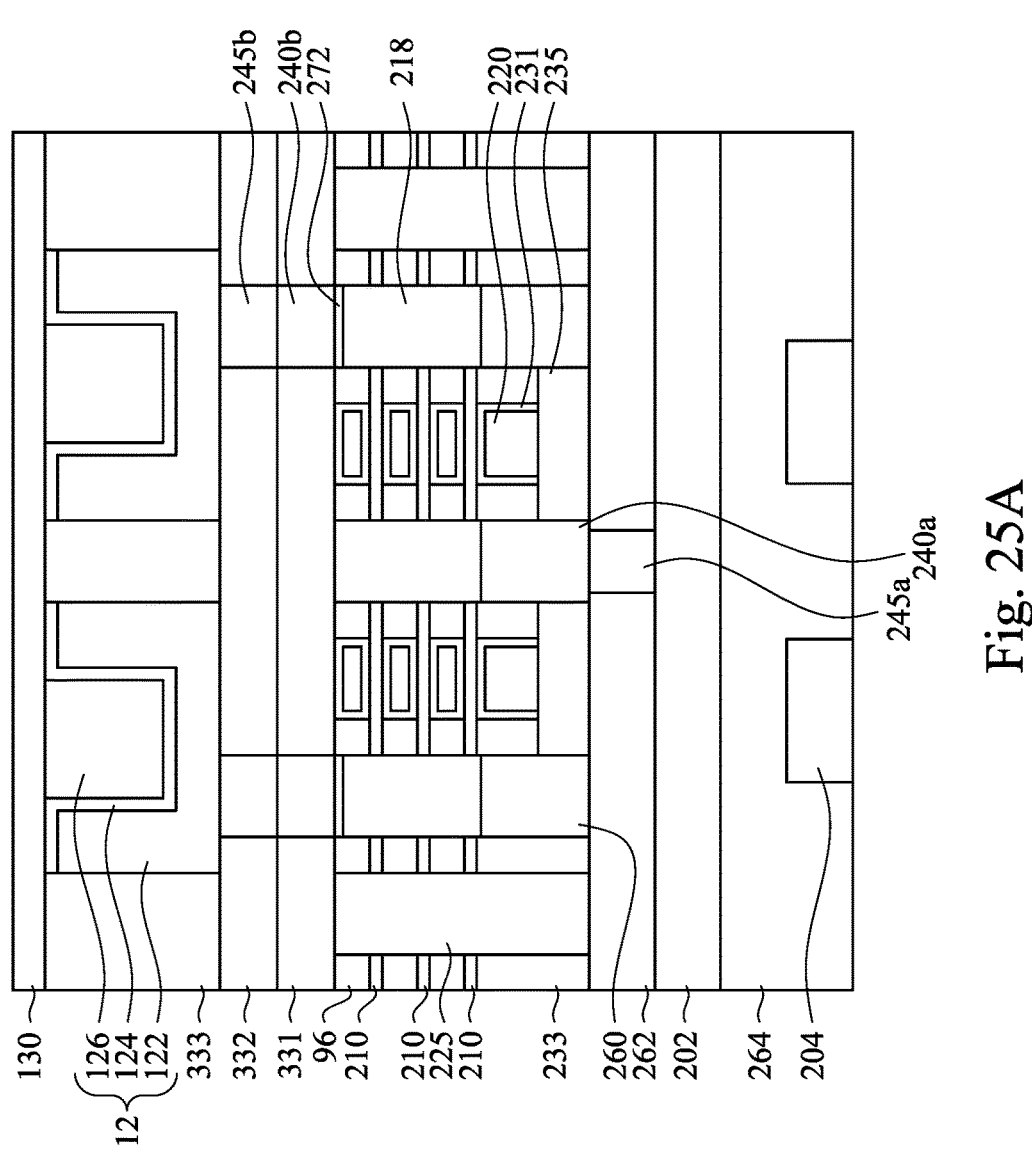
Figure 25B:
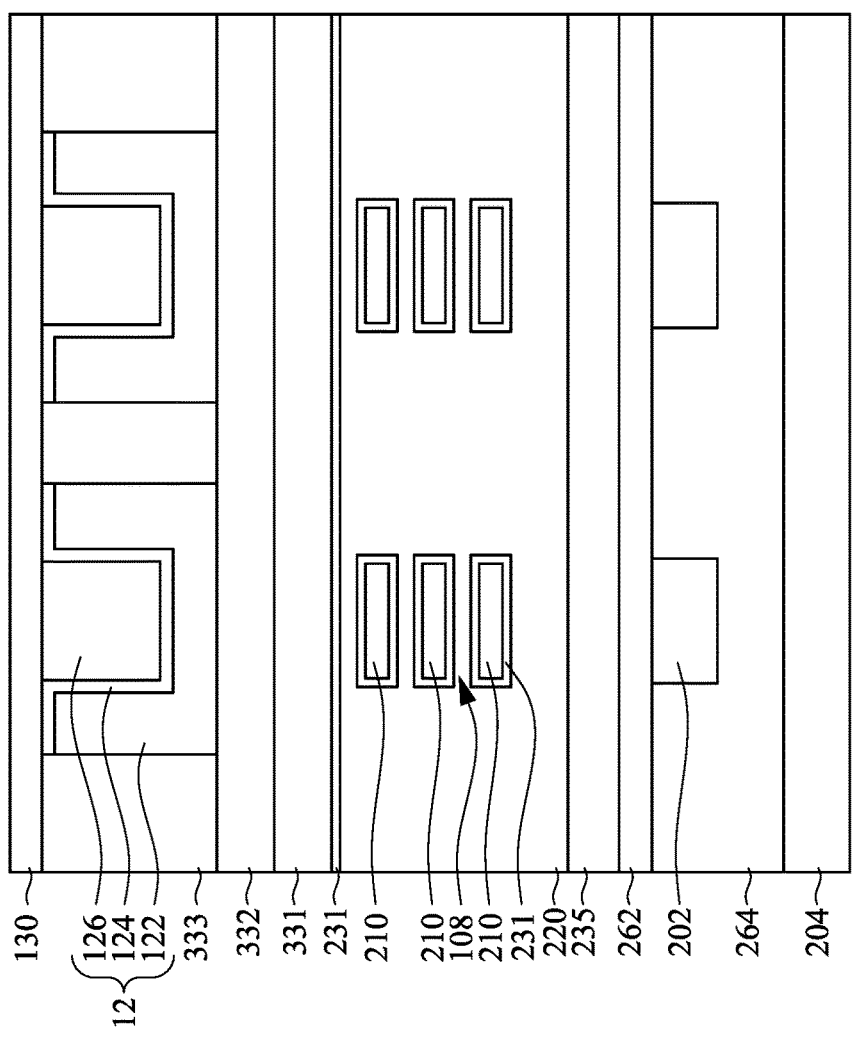
Figure 25C:
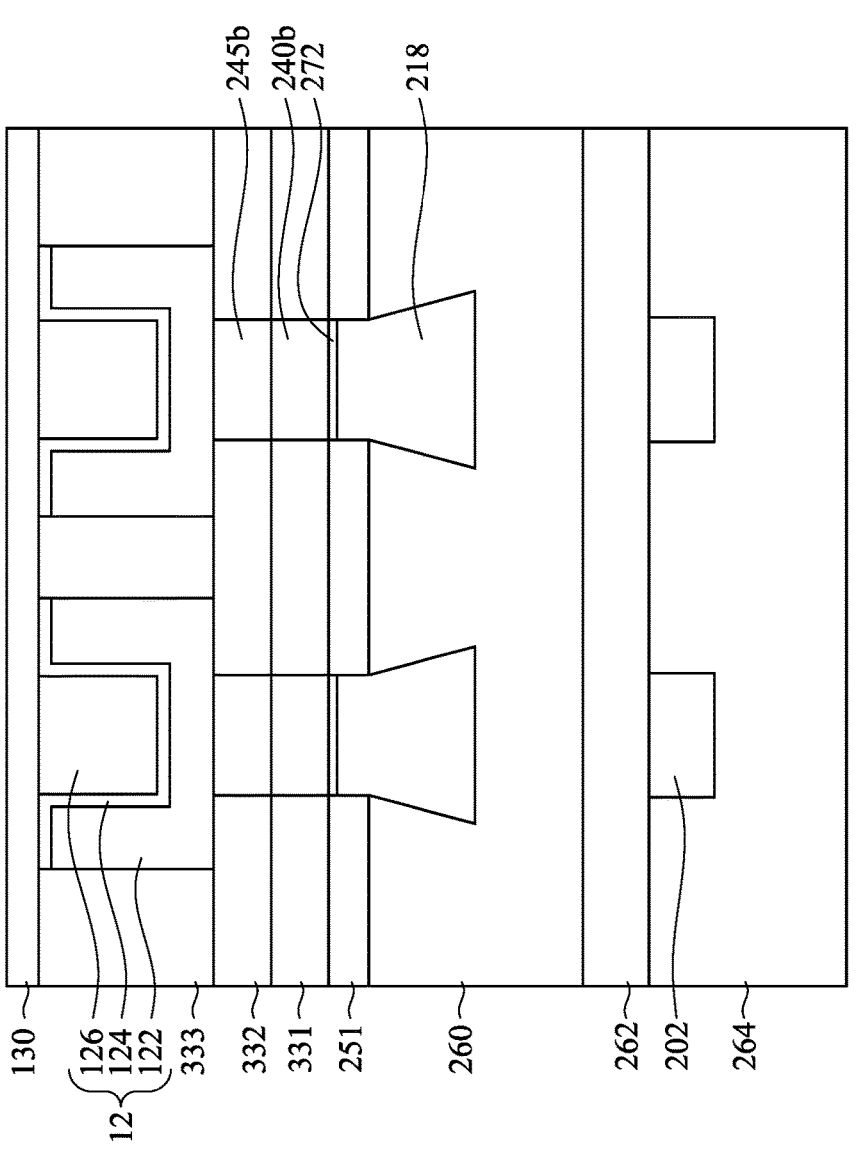

Reference is made to FIGS. 25A, 25B, and 25C. A conductive layer 130 is deposited over the capacitors 12 and the back-side IMD layer 333. In some embodiments, the conductive layer 130 can be interchangeably referred to a source conductor. In some embodiments, materials of the conductive layer 130 on the back side of the semiconductor structure may include Cu, Co, Ru, Pt, Al, W, Ti, TaN, TiN, or any combinations thereof. In some embodiments, the top electrode layer 126 may be deposited using any suitable method, such as CVD, physical vapor deposition (PVD), ALD, PEALD, PECVD, SACVD, FCVD, spin-on, and/or the like, or a combination thereof.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a metal line routing method to improve the functional density and operation performance on the IC structure. Specifically, a stacked DRAM capacitor on the memory region is transferred to the wafer back-side, and thus there is no need to have an additional interconnect structure formed over the logic region on the front-side of the substrate to compensate a height difference between the memory region and the logic region, which in turn improves the logic circuit performance. In addition, due to the transferring, the back-side stacked DRAM capacitor can allow a higher capacitance application, such as a deeper capacitor structure or a larger size with multiple MIMIM structure. In addition, due to the transferring of the stacked DRAM capacitor, the DRAM cell region can have bit-lines setting in a first level (M1) and word-lines setting in a second level (M2) on the front-side of the substrate, which in turns allows for a wider bit-line/word-line metal width for reducing the resistance thereof or a lager metal space for reducing the RC delay reduction.

In some embodiments, a method includes forming a transistor on a front-side of a substrate, the transistor comprising a channel region, a gate structure surrounding the channel region, and source/drain regions on opposite sides of the gate structure; forming a front-side contact on a first one of the source/drain regions of the transistor; forming a back-side contact on a second one of the source/drain regions of the transistor; forming a back-side capacitor on the back-side contact. In some embodiments, forming the back-side capacitor includes forming a dielectric layer over a back-side of the substrate; etching the dielectric layer to formed an opening; forming a bottom electrode layer in the opening such that the bottom electrode layer is electrically to the back-side contact and has an U-shaped from a cross-sectional view; forming an insulator layer on the bottom electrode layer; forming a top electrode layer on the insulator layer. In some embodiments, in a middle level height of the back-side capacitor from a top view, the top electrode layer has a circular pattern, the insulator layer has a first ring-shaped pattern surrounding the circular pattern, and the bottom electrode layer has a second ring-shaped pattern surrounding the first ring-shaped pattern. In some embodiments, the method further includes forming a back-side source line on the top electrode layer of the back-side capacitor. In some embodiments, the back-side source line is made of a same material as the top electrode layer of the back-side capacitor. In some embodiments, the method further includes forming a front-side via on the front-side contact; forming a bit line on the front-side via and extending along a first direction perpendicular to a lengthwise direction of the gate structure. In some embodiments, the method further includes forming a word line over the bit line and extending along a second direction perpendicular to a lengthwise direction of the bit line. In some embodiments, the transistor is a pass-gate transistor. In some embodiments, the first one of the source/drain regions is a source node of the transistor. In some embodiments, the second one of the source/drain regions is a drain node of the transistor.

In some embodiments, a method includes forming a transistor on a substrate; after forming the transistor, flipping the substrate upside down; after flipping the substrate, forming a dielectric layer over the substrate; etching the dielectric layer to formed an opening; forming a capacitor in the opening and electrically connected to the transistor. Forming the capacitor includes forming a bottom electrode layer in the opening such that the bottom electrode layer has a lateral portion lining a bottom surface of the opening and a first vertical lining a sidewall of the opening; forming an insulator layer on the bottom electrode layer; forming a top electrode layer on the insulator layer. In some embodiments, in a middle level height of the capacitor from a top view, the insulator layer has a first ring-shaped pattern, and the vertical portion of the bottom electrode layer has a second ring-shaped pattern surrounding the first ring-shaped pattern. In some embodiments, the bottom electrode layer has a second vertical layer on a center of the lateral portion thereof from a cross-sectional view. In some embodiments, the method further includes forming a source line on the capacitor and covering the capacitor. In some embodiments, the capacitor has a vertical dimension greater than about 500 nm.

In some embodiments, a semiconductor structure includes a substrate, a first transistor, a front-side bit line, a first back-side capacitor, and a back-side source line. The first transistor is on a front-side of a substrate. The transistor includes source/drain regions on the front-side of the substrate, a plurality of channel layers extending in a first direction between the source/drain regions, and a gate electrode extending along a second direction and surrounding each of the channel layers. The front-side bit line is on a first one of the source/drain regions and extends across a lengthwise direction of the gate electrode from a top view. The first back-side capacitor is on a second one of the source/drain regions. The back-side source line is on the first back-side capacitor. In some embodiments, the semiconductor structure further includes a second transistor on the front-side of the substrate and a second back-side capacitor electrically connected to the second transistor. In some embodiments, the back-side source line is connected to the first and second back-side capacitors and covers the first and second back-side capacitors. In some embodiments, the semiconductor structure further includes a front-side word line over the front-side bit line and extending along a direction perpendicular to a lengthwise direction of the front-side bit line. In some embodiments, the first and second transistors are pass-gate transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a transistor on a front-side of a substrate, the transistor comprising a channel region, a gate structure surrounding the channel region, and source/drain regions on opposite sides of the gate structure;
   forming a front-side contact on a first one of the source/drain regions of the transistor;
   forming a back-side contact on a second one of the source/drain regions of the transistor; and
   forming a back-side capacitor on the back-side contact;
   wherein forming the back-side capacitor comprises:
       forming a dielectric layer over a back-side of the substrate;
       etching the dielectric layer to form an opening;
       forming a bottom electrode layer in the opening such that the bottom electrode layer is electrically to the back-side contact and has a U-shape from a cross-sectional view;
       forming an insulator layer on the bottom electrode layer; and
       forming a top electrode layer on the insulator layer.

2. The method of claim 1, wherein forming the top electrode layer comprises:
   forming the top electrode layer overlying a cell boundary between a first dynamic random-access memory (DRAM) circuit and a second DRAM circuit, the first DRAM circuit including the transistor and the back-side capacitor.

3. The method of claim 1, wherein in a middle level height of the back-side capacitor from a top view, the top electrode layer has a circular pattern, the insulator layer has a first ring-shaped pattern surrounding the circular pattern, and the bottom electrode layer has a second ring-shaped pattern surrounding the first ring-shaped pattern.

4. The method of claim 1, further comprising:
   forming a back-side source line on the top electrode layer of the back-side capacitor.

5. The method of claim 4, wherein the back-side source line is made of a same material as the top electrode layer of the back-side capacitor.

6. The method of claim 1, further comprising:
   forming a front-side via on the front-side contact; and
   forming a bit line on the front-side via and extending along a first direction perpendicular to a lengthwise direction of the gate structure.

7. The method of claim 6, further comprising:
   forming a word line over the bit line and extending along a second direction perpendicular to a lengthwise direction of the bit line.

8. The method of claim 1, wherein the transistor is a pass-gate transistor.

9. The method of claim 1, wherein the first one of the source/drain regions is a source node of the transistor.

10. The method of claim 1, wherein the second one of the source/drain regions is a drain node of the transistor.

11. A method, comprising:
    forming a transistor on a substrate;
    after forming the transistor, flipping the substrate upside down;
    after flipping the substrate, forming a dielectric layer over the substrate;
    etching the dielectric layer to formed an opening; and
    forming a capacitor in the opening and electrically connected to the transistor, forming the capacitor comprising:
        forming a bottom electrode layer in the opening such that the bottom electrode layer has a lateral portion lining a bottom surface of the opening and a first vertical portion lining a sidewall of the opening;
        forming an insulator layer on the bottom electrode layer; and
        forming a top electrode layer on the insulator layer.

12. The method of claim 11, wherein in a middle level height of the capacitor from a top view, the insulator layer has a first ring-shaped pattern, and the first vertical portion of the bottom electrode layer has a second ring-shaped pattern surrounding the first ring-shaped pattern.

13. The method of claim 11, wherein the bottom electrode layer has a second vertical layer on a center of the lateral portion of the bottom electrode layer from a cross-sectional view.

14. The method of claim 11, further comprising:
    forming a source line on the capacitor and covering the capacitor.

15. The method of claim 11, wherein the capacitor has a vertical dimension greater than about 500 nm.

16. A method, comprising:
    forming a first source/drain region and a second source/drain region separated from the first source/drain region by a first gate;
    forming a front-side source/drain contact coupled to the second source/drain region;
    forming a first back-side source/drain contact coupled to the first source/drain region, wherein the front-side source/drain contact is coupled to a top surface of the second source/drain region and the first back-side source/drain contact is coupled to a bottom surface of the first source/drain region;
    forming a dielectric layer over the first back-side source/drain contact, wherein the dielectric layer defines a first opening; and
    forming a bottom electrode in the first opening and coupled to the first back-side source/drain contact.

17. The method of claim 16, comprising:

forming an insulator in the first opening; and forming a top electrode in the first opening, wherein the top electrode is separated from the bottom electrode by the insulator.

18. The method of claim 16, comprising:

forming a second gate, wherein the first gate is separated from the second gate by the first source/drain region;

removing the second gate to define a second opening; and forming a dielectric-base gate in the second opening.

19. The method of claim 16 comprising:

forming a third source/drain region separated from the second source/drain region by a second gate; and forming a second back-side source/drain contact coupled to the third source/drain region, wherein the second back-side source/drain contact is coupled to a bottom surface of the third source/drain region.

20. The method of claim 16 comprising:

forming a source/drain silicide region prior to forming the first back-side source/drain contact, wherein the source/drain silicide region is between the first source/drain region and the first back-side source/drain contact.

* * * * *